United States Patent
Burgener et al.

(10) Patent No.: US 8,559,907 B2
(45) Date of Patent: *Oct. 15, 2013

(54) INTEGRATED RF FRONT END WITH STACKED TRANSISTOR SWITCH

(75) Inventors: Mark L. Burgener, San Diego, CA (US); James S. Cable, Del Mar, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/412,463

(22) Filed: Mar. 5, 2012

(65) Prior Publication Data

US 2012/0252384 A1 Oct. 4, 2012

Related U.S. Application Data

(63) Continuation of application No. 11/501,125, filed on Aug. 7, 2006, now Pat. No. 8,131,251, which is a continuation of application No. 11/158,597, filed on Jun. 22, 2005, now Pat. No. 7,088,971, which is a continuation-in-part of application No. 10/875,405, filed on Jun. 23, 2004, now Pat. No. 7,248,120.

(51) Int. Cl.
*H04B 1/28* (2006.01)

(52) U.S. Cl.
USPC .................. 455/333; 455/127.3; 455/341

(58) Field of Classification Search
USPC ........ 455/333, 127.3, 341, 127.1, 127.2, 121, 455/126, 128–129, 339; 330/311, 277, 287, 330/251, 136, 310, 295, 124 R, 10; 247/341, 247/280–281, 472

See application file for complete search history.

(56) References Cited

U.S. PATENT DOCUMENTS 3,469,212 A 9/1969 Georg et al.
3,646,361 A 2/1972 Pfiffner (Continued)

FOREIGN PATENT DOCUMENTS

CN 125652 6/2000
DE 19832565 8/1999

(Continued)

OTHER PUBLICATIONS

Raab, et al., "Power Amplifiers and Transmitters for RF and Microwave", IEEE Transactions on Microwave Theory and Techniques, vol. 50, No. 3, pp. 814-826, Mar. 2002, USA.

(Continued)

*Primary Examiner* — Pablo Tran
(74) *Attorney, Agent, or Firm* — Jaquez & Associates; Martin J. Jaquez, Esq.

(57) ABSTRACT

A monolithic integrated circuit (IC), and method of manufacturing same, that includes all RF front end or transceiver elements for a portable communication device, including a power amplifier (PA), a matching, coupling and filtering network, and an antenna switch to couple the conditioned PA signal to an antenna. An output signal sensor senses at least a voltage amplitude of the signal switched by the antenna switch, and signals a PA control circuit to limit PA output power in response to excessive values of sensed output. Stacks of multiple FETs in series to operate as a switching device may be used for implementation of the RF front end, and the method and apparatus of such stacks are claimed as subcombinations. An iClass PA architecture is described that dissipatively terminates unwanted harmonics of the PA output signal.

11 Claims, 7 Drawing Sheets

(56) References Cited

U.S. PATENT DOCUMENTS

| | | | |
|---|---|---|---|
| 3,699,359 A | 10/1972 | Shelby |
| 3,731,112 A | 5/1973 | Smith |
| 3,878,450 A | 4/1975 | Greatbatch |
| 3,942,047 A | 3/1976 | Buchanan |
| 3,943,428 A | 3/1976 | Whidden |
| 3,955,353 A | 5/1976 | Astle |
| 3,975,671 A | 8/1976 | Stoll |
| 3,988,727 A | 10/1976 | Scott |
| 4,016,643 A | 4/1977 | Pucel et al. |
| 4,047,091 A | 9/1977 | Hutchines et al. |
| 4,053,916 A | 10/1977 | Cricchi et al. |
| 4,061,929 A | 12/1977 | Asano |
| 4,068,295 A | 1/1978 | Portmann |
| 4,079,336 A | 3/1978 | Gross |
| 4,106,086 A | 8/1978 | Holbrook et al. |
| 4,186,436 A | 1/1980 | Ishiwatari |
| 4,241,316 A | 12/1980 | Knapp |
| 4,244,000 A | 1/1981 | Ueda et al. |
| 4,244,016 A | 1/1981 | Mitchell |
| 4,256,977 A | 3/1981 | Hendrickson |
| 4,316,101 A | 2/1982 | Minner |
| 4,317,055 A | 2/1982 | Yoshida et al. |
| 4,321,661 A | 3/1982 | Sano |
| 4,367,421 A | 1/1983 | Baker |
| 4,390,798 A | 6/1983 | Kurafuji |
| 4,460,952 A | 7/1984 | Risinger |
| RE31,749 E | 11/1984 | Yamashiro |
| 4,485,433 A | 11/1984 | Topich |
| 4,528,517 A | 7/1985 | Schlotzhauer |
| 4,621,315 A | 11/1986 | Vaughn et al. |
| 4,633,106 A | 12/1986 | Backes et al. |
| 4,638,184 A | 1/1987 | Kimura |
| 4,679,134 A | 7/1987 | Bingham |
| 4,703,196 A | 10/1987 | Arakawa |
| 4,736,169 A | 4/1988 | Weaver et al. |
| 4,739,191 A | 4/1988 | Puar |
| 4,746,960 A | 5/1988 | Valeri et al. |
| 4,752,699 A | 6/1988 | Cranford et al. |
| 4,769,784 A | 9/1988 | Doluca et al. |
| 4,777,577 A | 10/1988 | Bingham et al. |
| 4,810,911 A | 3/1989 | Noguchi |
| 4,825,145 A | 4/1989 | Tanaka et al. |
| 4,839,787 A | 6/1989 | Kojima et al. |
| 4,847,519 A | 7/1989 | Wahl et al. |
| 4,849,651 A | 7/1989 | Estes, Jr. |
| 4,890,077 A | 12/1989 | Sun |
| 4,891,609 A | 1/1990 | Eilley |
| 4,897,774 A | 1/1990 | Bingham et al. |
| 4,929,855 A | 5/1990 | Ezzeddine |
| 4,984,040 A | 1/1991 | Yap |
| 4,985,647 A | 1/1991 | Kawada |
| 4,999,585 A | 3/1991 | Burt et al. |
| 5,012,123 A | 4/1991 | Ayasli et al. |
| 5,023,494 A | 6/1991 | Tsukii et al. |
| 5,029,282 A | 7/1991 | Ito |
| 5,032,799 A | 7/1991 | Milberger et al. |
| 5,038,325 A | 8/1991 | Douglas et al. |
| 5,041,797 A | 8/1991 | Belcher et al. |
| 5,061,907 A | 10/1991 | Rasmussen |
| 5,061,911 A | 10/1991 | Weidman et al. |
| 5,068,626 A | 11/1991 | Takagi et al. |
| 5,081,371 A | 1/1992 | Wong |
| 5,081,706 A | 1/1992 | Kim |
| 5,111,375 A | 5/1992 | Marshall |
| 5,124,762 A | 6/1992 | Childs et al. |
| 5,126,590 A | 6/1992 | Chern |
| 5,138,190 A | 8/1992 | Yamazaki et al. |
| 5,146,178 A | 9/1992 | Nojima et al. |
| 5,182,529 A | 1/1993 | Chern |
| 5,193,198 A | 3/1993 | Yokouchi |
| 5,208,557 A | 5/1993 | Kersh, III |
| 5,212,456 A | 5/1993 | Kovalcik et al. |
| 5,272,457 A | 12/1993 | Heckaman et al. |
| 5,274,343 A | 12/1993 | Russell et al. |
| 5,285,367 A | 2/1994 | Keller |
| 5,306,954 A | 4/1994 | Chan et al. |
| 5,313,083 A | 5/1994 | Schindler |
| 5,317,181 A | 5/1994 | Tyson |
| 5,331,221 A | 7/1994 | Ganesan et al. |
| 5,345,422 A | 9/1994 | Redwine |
| 5,350,957 A | 9/1994 | Cooper et al. |
| 5,375,256 A | 12/1994 | Yokoyama et al. |
| 5,375,257 A | 12/1994 | Lampen |
| 5,392,186 A | 2/1995 | Alexander et al. |
| 5,392,205 A | 2/1995 | Zavaleta |
| 5,416,043 A | 5/1995 | Burgener et al. |
| 5,422,586 A | 6/1995 | Tedrow et al. |
| 5,442,327 A | 8/1995 | Longbrake et al. |
| 5,446,418 A | 8/1995 | Hara et al. |
| 5,448,207 A | 9/1995 | Kohama |
| 5,455,794 A | 10/1995 | Javanifard et al. |
| 5,465,061 A | 11/1995 | Dufour |
| 5,477,184 A | 12/1995 | Uda et al. |
| 5,488,243 A | 1/1996 | Tsuruta et al. |
| 5,492,857 A | 2/1996 | Reedy et al. |
| 5,493,249 A | 2/1996 | Manning |
| 5,519,360 A | 5/1996 | Keeth |
| 5,535,160 A | 7/1996 | Yamaguchi |
| 5,548,239 A | 8/1996 | Kohama |
| 3,470,443 A | 9/1996 | Berry et al. |
| 5,553,021 A | 9/1996 | Kubono et al. |
| 5,553,295 A | 9/1996 | Pantelakis et al. |
| 5,554,892 A | 9/1996 | Norimatsu |
| 5,572,040 A | 11/1996 | Reedy et al. |
| 5,589,793 A | 12/1996 | Kassapian |
| 5,596,205 A | 1/1997 | Reedy et al. |
| 5,597,739 A | 1/1997 | Sumi et al. |
| 5,600,169 A | 2/1997 | Burgener et al. |
| 5,629,655 A | 5/1997 | Dent |
| 5,663,570 A | 9/1997 | Reedy et al. |
| 5,670,907 A | 9/1997 | Gorecki et al. |
| 5,672,992 A | 9/1997 | Nadd |
| 5,677,649 A | 10/1997 | Martin |
| 5,681,761 A | 10/1997 | Kim |
| 5,694,308 A | 12/1997 | Cave |
| 5,698,877 A | 12/1997 | Gonzalez |
| 5,699,018 A | 12/1997 | Yamamoto et al. |
| 5,717,356 A | 2/1998 | Kohama |
| 5,729,039 A | 3/1998 | Beyer et al. |
| 5,731,607 A | 3/1998 | Kohama |
| 5,732,334 A | 3/1998 | Miyake |
| 5,734,291 A | 3/1998 | Tasdighi et al. |
| 5,748,053 A | 5/1998 | Kameyama et al. |
| 5,757,170 A | 5/1998 | Pinney |
| 5,760,652 A | 6/1998 | Yamamoto et al. |
| 5,774,792 A | 6/1998 | Tanaka et al. |
| 5,777,530 A | 7/1998 | Nakatuka |
| 5,784,687 A | 7/1998 | Itoh et al. |
| 5,786,617 A | 7/1998 | Merrill et al. |
| 5,793,246 A | 8/1998 | Vest et al. |
| 5,801,577 A | 9/1998 | Talliet |
| 5,807,772 A | 9/1998 | Takemura |
| 5,808,505 A | 9/1998 | Tsukada |
| 5,812,939 A | 9/1998 | Kohama |
| 5,818,099 A | 10/1998 | Burghartz |
| 5,818,278 A | 10/1998 | Yamamoto et al. |
| 5,818,283 A | 10/1998 | Tonami et al. |
| 5,818,289 A | 10/1998 | Chevallier et al. |
| 5,818,766 A | 10/1998 | Song |
| 5,821,800 A | 10/1998 | Le et al. |
| 5,825,227 A | 10/1998 | Kohama et al. |
| 5,861,336 A | 1/1999 | Reedy et al. |
| 5,863,823 A | 1/1999 | Burgener |
| 5,864,328 A | 1/1999 | Kajimoto |
| 5,874,836 A | 2/1999 | Nowak et al. |
| 5,874,849 A | 2/1999 | Marotta et al. |
| 5,878,331 A | 3/1999 | Yamamoto et al. |
| 5,883,396 A | 3/1999 | Reedy et al. |
| 5,883,541 A | 3/1999 | Tahara et al. |
| 5,889,428 A | 3/1999 | Young |
| 5,892,400 A | 4/1999 | van Saders et al. |
| 5,895,957 A | 4/1999 | Reedy et al. |
| 5,903,178 A | 5/1999 | Miyatsuji et al. |
| 5,912,560 A | 6/1999 | Pasternak |

(56) References Cited

U.S. PATENT DOCUMENTS

| | | |
|---|---|---|
| 5,917,362 A | 6/1999 | Kohama |
| 5,920,233 A | 7/1999 | Denny |
| 5,926,466 A | 7/1999 | Ishida et al. |
| 5,930,638 A | 7/1999 | Reedy et al. |
| 5,945,867 A | 8/1999 | Uda et al. |
| 5,959,335 A | 9/1999 | Bryant et al. |
| 5,969,560 A | 10/1999 | Kohama et al. |
| 5,973,363 A | 10/1999 | Staab et al. |
| 5,973,382 A | 10/1999 | Burgener et al. |
| 5,973,636 A | 10/1999 | Okubo et al. |
| 5,990,580 A | 11/1999 | Weigand |
| 6,020,781 A | 2/2000 | Fujioka |
| 6,057,555 A | 5/2000 | Reedy et al. |
| 6,057,723 A | 5/2000 | Yamaji et al. |
| 6,064,275 A | 5/2000 | Yamauchi |
| 6,064,872 A | 5/2000 | Vice |
| 6,066,993 A | 5/2000 | Yamamoto et al. |
| 6,081,165 A | 6/2000 | Goldman |
| 6,081,694 A | 6/2000 | Matsuura et al. |
| 6,090,648 A | 7/2000 | Reedy et al. |
| 6,094,088 A | 7/2000 | Yano |
| 6,107,885 A | 8/2000 | Miguelez et al. |
| 6,111,462 A | 8/2000 | Mucenieks et al. |
| 6,114,923 A | 9/2000 | Mizutani |
| 6,118,343 A | 9/2000 | Winslow |
| 6,122,185 A | 9/2000 | Utsunomiya et al. |
| 6,130,572 A | 10/2000 | Ghilardelli et al. |
| 6,133,752 A | 10/2000 | Kawagoe |
| 6,137,367 A | 10/2000 | Ezzedine et al. |
| 6,169,444 B1 | 1/2001 | Thurber, Jr. |
| 6,177,826 B1 | 1/2001 | Mashiko et al. |
| 6,188,247 B1 | 2/2001 | Storino et al. |
| 6,188,590 B1 | 2/2001 | Chang et al. |
| 6,191,653 B1 | 2/2001 | Camp, Jr. et al. |
| 6,195,307 B1 | 2/2001 | Umezawa et al. |
| RE37,124 E | 4/2001 | Monk et al. |
| 6,215,360 B1 | 4/2001 | Callaway, Jr. |
| 6,218,890 B1 | 4/2001 | Yamaguchi et al. |
| 6,225,866 B1 | 5/2001 | Kubota et al. |
| 6,239,657 B1 | 5/2001 | Bauer |
| 6,242,979 B1 | 6/2001 | Li |
| 6,249,027 B1 | 6/2001 | Burr |
| 6,249,446 B1 | 6/2001 | Shearon et al. |
| 6,281,756 B1 | 8/2001 | Goto et al. |
| 6,288,458 B1 | 9/2001 | Berndt |
| 6,297,687 B1 | 10/2001 | Sugimura |
| 6,297,696 B1 | 10/2001 | Abdollahian et al. |
| 6,300,796 B1 | 10/2001 | Troutman et al. |
| 6,308,047 B1 | 10/2001 | Yamamoto et al. |
| 6,310,508 B1 | 10/2001 | Westerman |
| 6,316,983 B1 | 11/2001 | Kitamura |
| 6,337,594 B1 | 1/2002 | Hwang |
| 6,356,536 B1 | 3/2002 | Repke |
| 6,365,488 B1 | 4/2002 | Liao |
| 6,366,172 B1 | 4/2002 | Hayashi et al. |
| 6,380,793 B1 | 4/2002 | Bancal et al. |
| 6,380,796 B2 | 4/2002 | Sakai et al. |
| 6,380,802 B1 | 4/2002 | Pehike et al. |
| 6,392,440 B2 | 5/2002 | Nebel |
| 6,396,352 B1 | 5/2002 | Muza |
| 6,400,211 B1 | 6/2002 | Yokomizo et al. |
| 6,407,614 B1 | 6/2002 | Takahashi |
| 6,411,531 B1 | 6/2002 | Nork et al. |
| 6,414,863 B1 | 7/2002 | Bayer et al. |
| 6,429,632 B1 | 8/2002 | Forbes et al. |
| 6,429,723 B1 | 8/2002 | Hastings |
| 6,449,465 B1 | 9/2002 | Gailus et al. |
| 6,452,232 B1 | 9/2002 | Adan |
| 6,461,902 B1 | 10/2002 | Xu et al. |
| 6,486,511 B1 | 11/2002 | Nathanson et al. |
| 6,486,729 B2 | 11/2002 | Imamiya |
| 6,496,074 B1 | 12/2002 | Sowlati |
| 6,504,212 B1 | 1/2003 | Allen et al. |
| 6,504,213 B1 | 1/2003 | Ebina |
| 6,509,799 B1 | 1/2003 | Franca-Neto |
| 6,512,269 B1 | 1/2003 | Braynt et al. |
| 6,515,547 B2 | 2/2003 | Sowlati |
| 6,518,829 B2 | 2/2003 | Butler |
| 6,531,739 B2 | 3/2003 | Cable et al. |
| 6,537,861 B1 | 3/2003 | Kroell et al. |
| 6,559,689 B1 | 5/2003 | Clark |
| 6,563,366 B1 | 5/2003 | Kohama |
| 6,617,933 B2 | 9/2003 | Ito et al. |
| 6,630,867 B2 | 10/2003 | Canyon et al. |
| 6,631,505 B2 | 10/2003 | Arai |
| 6,632,724 B2 | 10/2003 | Henley et al. |
| 6,636,114 B2 | 10/2003 | Tsutsui et al. |
| 6,642,578 B1 | 11/2003 | Arnold et al. |
| 6,646,511 B2 | 11/2003 | Canyon et al. |
| 6,653,697 B2 | 11/2003 | Hidaka et al. |
| 6,658,265 B1 | 12/2003 | Steel et al. |
| 6,674,323 B2 | 1/2004 | Kagaya et al. |
| 6,677,641 B2 | 1/2004 | Kocon |
| 6,693,326 B2 | 2/2004 | Adan |
| 6,693,498 B1 | 2/2004 | Sasabata et al. |
| 6,698,082 B2 | 3/2004 | Crenshaw et al. |
| 6,704,550 B1 | 3/2004 | Kohama et al. |
| 6,711,397 B1 | 3/2004 | Petrov et al. |
| 6,714,065 B2 | 3/2004 | Komiya et al. |
| 6,717,458 B1 | 4/2004 | Potanin |
| 6,731,175 B1 | 5/2004 | Chen |
| 6,774,701 B1 | 8/2004 | Heston et al. |
| 6,781,805 B1 | 8/2004 | Urakawa |
| 6,788,130 B2 | 9/2004 | Pauletti et al. |
| 6,790,747 B2 | 9/2004 | Henley et al. |
| 6,801,076 B1 | 10/2004 | Merritt |
| 6,803,680 B2 | 10/2004 | Brindle et al. |
| 6,804,502 B2 | 10/2004 | Burgener et al. |
| 6,816,000 B2 | 11/2004 | Miyamitsu |
| 6,816,001 B2 | 11/2004 | Khouri et al. |
| 6,816,016 B2 | 11/2004 | Sander et al. |
| 6,819,938 B2 | 11/2004 | Sahota |
| 6,825,730 B1 | 11/2004 | Sun |
| 6,830,963 B1 | 12/2004 | Forbes |
| 6,831,847 B2 | 12/2004 | Perry |
| 6,833,745 B2 | 12/2004 | Hausman et al. |
| 6,836,172 B2 | 12/2004 | Okashita |
| 6,853,244 B2 | 2/2005 | Robinson et al. |
| 6,853,247 B2 | 2/2005 | Weldon |
| 6,864,750 B2 | 3/2005 | Shigematsu |
| 6,871,059 B1 | 3/2005 | Piro et al. |
| 6,879,502 B2 | 4/2005 | Yoshida et al. |
| 6,882,210 B2 | 4/2005 | Asano et al. |
| 6,891,234 B1 | 5/2005 | Connelly et al. |
| 6,898,778 B2 | 5/2005 | Kawanaka |
| 6,903,596 B2 | 6/2005 | Geller et al. |
| 6,908,832 B2 | 6/2005 | Farrens et al. |
| 6,917,258 B2 | 7/2005 | Kushitani et al. |
| 6,934,520 B2 | 8/2005 | Rozsypal |
| 6,943,628 B2 | 9/2005 | Weldon |
| 6,947,720 B2 | 9/2005 | Razavi et al. |
| 6,969,668 B1 | 11/2005 | Kang et al. |
| 6,975,271 B2 | 12/2005 | Adachi et al. |
| 6,978,122 B2 | 12/2005 | Kawakyu et al. |
| 6,978,437 B1 | 12/2005 | Rittman et al. |
| 7,023,260 B2 | 4/2006 | Thorp et al. |
| 7,042,245 B2 | 5/2006 | Hidaka |
| 7,045,873 B2 | 5/2006 | Chen et al. |
| 7,056,808 B2 | 6/2006 | Henley et al. |
| 7,057,472 B2 | 6/2006 | Fukamachi et al. |
| 7,058,922 B2 | 6/2006 | Kawanaka |
| 7,071,786 B2 | 7/2006 | Inoue et al. |
| 7,082,293 B1 | 7/2006 | Rofougaran et al. |
| 7,088,971 B2 | 8/2006 | Burgener et al. |
| 7,092,677 B1 | 8/2006 | Zhang et al. |
| 7,109,532 B1 | 9/2006 | Lee et al. |
| 7,123,898 B2 | 10/2006 | Burgener et al. |
| 7,132,873 B2 | 11/2006 | Hollmer |
| 7,135,929 B1 | 11/2006 | Costa et al. |
| 7,138,846 B2 | 11/2006 | Suwa et al. |
| 7,161,197 B2 | 1/2007 | Nakatsuka et al. |
| 7,161,429 B2 | 1/2007 | Boreysha et al. |
| 7,173,471 B2 | 2/2007 | Nakatsuka et al. |
| 7,173,491 B2 | 2/2007 | Bocock et al. |

(56) References Cited

U.S. PATENT DOCUMENTS

| | | | |
|---|---|---|---|
| 7,199,635 B2 | 4/2007 | Nakatsuka et al. | |
| 7,202,712 B2* | 4/2007 | Athas | 327/129 |
| 7,202,734 B1 | 4/2007 | Raab | |
| 7,212,788 B2 | 5/2007 | Weber et al. | |
| 7,215,192 B2 | 5/2007 | Kim et al. | |
| 7,248,120 B2 | 7/2007 | Burgener et al. | |
| 7,248,845 B2 | 7/2007 | Dunn | |
| 7,269,392 B2 | 9/2007 | Nakajima et al. | |
| 7,276,976 B2 | 10/2007 | Oh et al. | |
| 7,345,521 B2 | 3/2008 | Takahashi et al. | |
| 7,352,247 B2 | 4/2008 | Oh et al. | |
| 7,355,455 B2 | 4/2008 | Hidaka | |
| 7,391,269 B2 | 6/2008 | Chiba | |
| 7,391,282 B2 | 6/2008 | Nakatsuka et al. | |
| 7,404,157 B2 | 7/2008 | Tanabe | |
| 7,420,412 B2 | 9/2008 | Kim et al. | |
| 7,449,954 B2 | 11/2008 | Bocock et al. | |
| 7,457,594 B2 | 11/2008 | Theobold et al. | |
| 7,460,852 B2 | 12/2008 | Burgener et al. | |
| 7,489,196 B2 | 2/2009 | Vaiana et al. | |
| 7,515,882 B2 | 4/2009 | Kelcourse et al. | |
| 7,545,216 B2 | 6/2009 | Hamley | |
| 7,546,089 B2 | 6/2009 | Bellantoni | |
| 7,551,032 B2 | 6/2009 | Dupuis et al. | |
| 7,551,036 B2* | 6/2009 | Berroth et al. | 330/311 |
| 7,554,392 B2 | 6/2009 | Hwa et al. | |
| 7,554,394 B2 | 6/2009 | Maemura | |
| 7,561,853 B2 | 7/2009 | Miyazawa | |
| 7,586,376 B2 | 9/2009 | Litmanen | |
| 7,593,702 B1 | 9/2009 | Lie et al. | |
| 7,616,054 B2 | 11/2009 | Jeon et al. | |
| 7,616,482 B2 | 11/2009 | Prall | |
| 7,639,068 B2 | 12/2009 | Mizuno et al. | |
| 7,649,418 B2 | 1/2010 | Matsui | |
| 7,659,152 B2 | 2/2010 | Gonzalez et al. | |
| 7,679,433 B1 | 3/2010 | Li | |
| 7,714,662 B2 | 5/2010 | Jeong et al. | |
| 7,719,343 B2 | 5/2010 | Burgener et al. | |
| 7,733,156 B2 | 6/2010 | Brederlow et al. | |
| 7,733,157 B2 | 6/2010 | Brederlow et al. | |
| 7,741,869 B2 | 6/2010 | Hidaka | |
| 7,786,807 B1* | 8/2010 | Li et al. | 330/311 |
| 7,795,968 B1 | 9/2010 | Li et al. | |
| 7,796,969 B2 | 9/2010 | Kelly et al. | |
| 7,808,342 B2* | 10/2010 | Prikhodko et al. | 333/103 |
| 7,817,966 B2* | 10/2010 | Prikhodko et al. | 455/78 |
| 7,860,499 B2 | 12/2010 | Burgener et al. | |
| 7,868,683 B2 | 1/2011 | Iklov | |
| 7,868,697 B2 | 1/2011 | Arai | |
| 7,872,533 B2 | 1/2011 | Adamski et al. | |
| 7,910,993 B2 | 3/2011 | Brindle et al. | |
| 7,928,759 B2 | 4/2011 | Hidaka | |
| 7,960,772 B2 | 6/2011 | Englekirk | |
| 7,961,052 B2 | 6/2011 | Bacon et al. | |
| 7,982,265 B2 | 7/2011 | Challa et al. | |
| 8,081,928 B2 | 12/2011 | Kelly | |
| 8,093,945 B2 | 1/2012 | Wimpenny | |
| 8,106,711 B2 | 1/2012 | Adamski et al. | |
| 8,111,104 B2* | 2/2012 | Ahadian et al. | 330/290 |
| 8,129,787 B2 | 3/2012 | Brindle et al. | |
| 8,130,042 B2 | 3/2012 | Adamski et al. | |
| 8,131,225 B2* | 3/2012 | Botula et al. | 455/78 |
| 8,131,251 B2 | 3/2012 | Burgener et al. | |
| 8,232,627 B2* | 7/2012 | Bryant et al. | 257/623 |
| 8,350,624 B2 | 1/2013 | Lam | |
| 8,368,462 B2 | 2/2013 | Sharma et al. | |
| 8,373,490 B2 | 2/2013 | Burgener et al. | |
| 8,487,706 B2 | 7/2013 | Li et al. | |
| 8,502,607 B2 | 8/2013 | Adamski et al. | |
| 2001/0015461 A1 | 8/2001 | Ebina | |
| 2001/0031518 A1 | 10/2001 | Kim et al. | |
| 2001/0040479 A1 | 11/2001 | Zhang | |
| 2001/0045602 A1 | 11/2001 | Maeda et al. | |
| 2002/0115244 A1 | 8/2002 | Park et al. | |
| 2002/0126767 A1 | 9/2002 | Ding et al. | |
| 2002/0171486 A1 | 11/2002 | Krupnik | |
| 2003/0002452 A1 | 1/2003 | Sahota | |
| 2003/0032396 A1 | 2/2003 | Tsuchiya et al. | |
| 2003/0090313 A1 | 5/2003 | Burgener et al. | |
| 2003/0141543 A1 | 7/2003 | Bryant et al. | |
| 2003/0160515 A1 | 8/2003 | Yu et al. | |
| 2003/0181167 A1 | 9/2003 | Iida | |
| 2003/0201494 A1 | 10/2003 | Maeda et al. | |
| 2003/0205760 A1 | 11/2003 | Kawanaka et al. | |
| 2003/0224743 A1* | 12/2003 | Okada et al. | 455/127.2 |
| 2004/0061130 A1 | 4/2004 | Morizuka | |
| 2004/0080364 A1 | 4/2004 | Sander et al. | |
| 2004/0121745 A1* | 6/2004 | Meck | 455/129 |
| 2004/0129975 A1 | 7/2004 | Koh et al. | |
| 2004/0204013 A1 | 10/2004 | Ma et al. | |
| 2004/0242182 A1 | 12/2004 | Hidaka et al. | |
| 2005/0077564 A1 | 4/2005 | Forbes | |
| 2005/0079829 A1 | 4/2005 | Ogawa et al. | |
| 2005/0121699 A1 | 6/2005 | Chen et al. | |
| 2005/0127442 A1 | 6/2005 | Veeraraghaven et al. | |
| 2005/0167751 A1 | 8/2005 | Nakajima et al. | |
| 2005/0264341 A1 | 12/2005 | Hikita et al. | |
| 2005/0287976 A1 | 12/2005 | Burgener et al. | |
| 2006/0009164 A1 | 1/2006 | Kataoka | |
| 2006/0161520 A1 | 7/2006 | Brewer et al. | |
| 2006/0194558 A1 | 8/2006 | Kelly | |
| 2006/0270367 A1 | 11/2006 | Burgener et al. | |
| 2007/0018247 A1 | 1/2007 | Brindle et al. | |
| 2007/0018718 A1 | 1/2007 | Horng et al. | |
| 2007/0023833 A1 | 2/2007 | Okhonin et al. | |
| 2007/0045697 A1 | 3/2007 | Cheng et al. | |
| 2007/0229156 A1 | 10/2007 | Alenin et al. | |
| 2007/0243849 A1 | 10/2007 | Prikhodko et al. | |
| 2007/0279120 A1 | 12/2007 | Brederlow et al. | |
| 2007/0290744 A1 | 12/2007 | Adachi et al. | |
| 2008/0073719 A1 | 3/2008 | Fazan et al. | |
| 2008/0076371 A1 | 3/2008 | Dribinsky et al. | |
| 2008/0191788 A1 | 8/2008 | Chen et al. | |
| 2008/0246543 A1 | 10/2008 | Trifonov et al. | |
| 2008/0303080 A1 | 12/2008 | Bhattacharyya | |
| 2009/0029511 A1 | 1/2009 | Wu | |
| 2010/0237941 A1 | 9/2010 | Goldfarb et al. | |
| 2010/0308919 A1 | 12/2010 | Adamski et al. | |
| 2010/0308921 A1 | 12/2010 | Adamski et al. | |
| 2011/0092179 A1 | 4/2011 | Burgener et al. | |
| 2011/0095824 A1 | 4/2011 | Bacon et al. | |
| 2011/0109393 A1 | 5/2011 | Adamski et al. | |
| 2011/0110137 A1 | 5/2011 | Adamski et al. | |
| 2011/0163779 A1 | 7/2011 | Hidaka | |
| 2011/0169550 A1 | 7/2011 | Brindle et al. | |
| 2011/0181360 A1 | 7/2011 | Li et al. | |
| 2011/0181364 A1 | 7/2011 | Ahadian et al. | |
| 2012/0007679 A1 | 1/2012 | Burgener et al. | |
| 2012/0049956 A1 | 3/2012 | Lam | |
| 2012/0086512 A1 | 4/2012 | Sharma et al. | |
| 2012/0105127 A1 | 5/2012 | Burgener et al. | |
| 2012/0194274 A1 | 8/2012 | Fowers et al. | |

FOREIGN PATENT DOCUMENTS

| | | |
|---|---|---|
| EP | 385641 | 9/1990 |
| EP | 0385641 A2 | 9/1990 |
| EP | 0622901 | 11/1994 |
| EP | 782267 | 7/1997 |
| EP | 0788185 | 8/1997 |
| EP | 913939 | 5/1999 |
| EP | 625831 | 11/1999 |
| EP | 1006584 | 6/2000 |
| EP | 1451890 | 2/2011 |
| EP | 2348532 | 7/2011 |
| EP | 2348533 | 7/2011 |
| EP | 2348534 | 7/2011 |
| EP | 2348535 | 7/2011 |
| EP | 2348536 | 7/2011 |
| EP | 2387094 A1 | 11/2011 |
| JP | 55-75348 | 6/1980 |
| JP | 1-254014 A | 10/1989 |
| JP | 1254014 | 10/1989 |
| JP | 2-161769 | 6/1990 |

(56) References Cited

FOREIGN PATENT DOCUMENTS

| | | |
|---|---|---|
| JP | 2161769 | 6/1990 |
| JP | 04-34980 | 2/1992 |
| JP | 4-183008 A | 6/1992 |
| JP | 4183008 | 6/1992 |
| JP | 5299995 | 11/1993 |
| JP | 6112795 | 4/1994 |
| JP | 06-314985 | 11/1994 |
| JP | 06-334506 | 12/1994 |
| JP | 6334506 | 12/1994 |
| JP | 7046109 | 2/1995 |
| JP | 07106937 | 4/1995 |
| JP | 8023270 | 1/1996 |
| JP | 8070245 | 3/1996 |
| JP | 8-148949 A | 6/1996 |
| JP | 8148949 | 6/1996 |
| JP | 11163704 | 6/1996 |
| JP | 08-307305 | 11/1996 |
| JP | 8330930 | 12/1996 |
| JP | 9008627 | 1/1997 |
| JP | 9041275 | 2/1997 |
| JP | 9055682 | 2/1997 |
| JP | 9092785 | 4/1997 |
| JP | 9148587 | 6/1997 |
| JP | 9163721 | 6/1997 |
| JP | 09163721 | 6/1997 |
| JP | 09-200021 | 7/1997 |
| JP | 9181641 | 7/1997 |
| JP | 9186501 | 7/1997 |
| JP | 09200021 | 7/1997 |
| JP | 9200074 | 7/1997 |
| JP | 9238059 | 9/1997 |
| JP | 9243738 | 9/1997 |
| JP | 09-284114 | 10/1997 |
| JP | 9270659 | 10/1997 |
| JP | 9284114 | 10/1997 |
| JP | 9284170 | 10/1997 |
| JP | 9298493 | 10/1997 |
| JP | 9326642 | 12/1997 |
| JP | 10079467 | 3/1998 |
| JP | 10-93471 | 4/1998 |
| JP | 10-242477 | 9/1998 |
| JP | 10-242829 | 9/1998 |
| JP | 10242826 | 9/1998 |
| JP | 10-344247 | 12/1998 |
| JP | 10335901 | 12/1998 |
| JP | 11026776 | 1/1999 |
| JP | 11112316 | 4/1999 |
| JP | 11-136111 | 5/1999 |
| JP | 11163642 | 6/1999 |
| JP | 11205188 | 7/1999 |
| JP | 11274804 | 10/1999 |
| JP | 2000031167 | 1/2000 |
| JP | 2000183353 | 6/2000 |
| JP | 2000188501 | 7/2000 |
| JP | 2000208614 | 7/2000 |
| JP | 2000223713 | 8/2000 |
| JP | 2000243973 | 9/2000 |
| JP | 2000277703 | 10/2000 |
| JP | 2000294786 | 10/2000 |
| JP | 2000311986 | 11/2000 |
| JP | 2001089448 | 3/2001 |
| JP | 2001-119281 | 4/2001 |
| JP | 2001157487 | 5/2001 |
| JP | 2001156182 | 6/2001 |
| JP | 2001274265 | 10/2001 |
| JP | 2004-515937 A | 4/2002 |
| JP | 2004515937 | 5/2002 |
| JP | 2002164441 | 6/2002 |
| JP | 2003-060451 A | 2/2003 |
| JP | 2003060451 | 2/2003 |
| JP | 2003167615 | 6/2003 |
| JP | 2003-198248 A | 7/2003 |
| JP | 2003189248 | 7/2003 |
| JP | 2002156602 | 12/2003 |
| JP | 2004-147175 | 5/2004 |
| JP | 2004166470 | 6/2004 |
| JP | 2004199950 | 7/2004 |
| KR | 1994027615 | 12/1994 |
| WO | WO 95/23460 A1 | 8/1995 |
| WO | WO9523460 | 8/1995 |
| WO | WO9806174 | 2/1998 |
| WO | WO9935695 | 7/1999 |
| WO | WO 02/27920 A1 | 4/2002 |
| WO | WO0227920 | 4/2002 |
| WO | WO03032431 | 4/2003 |
| WO | WO2004/086606 A2 | 10/2004 |
| WO | WO2004/095688 A2 | 11/2004 |
| WO | WO2007008934 | 1/2007 |
| WO | WO2007/033045 A2 | 3/2007 |
| WO | WO2012054642 | 4/2012 |
| WO | WO2012/058122 A1 | 5/2012 |

OTHER PUBLICATIONS

Ueda, et al., "A 5GHz-Band On-Chip Matching CMOS MMIC Front-End", 11th GAAS Symposium—Munich 2003, pp. 101-104, Germany.

Nelson Pass, Pass Labs, "Cascode Amp Design", Audio Electrnoics, pp. 1-4, Mar. 1978.

Lester F. Eastman, P.I., "High Power, Broadband, Linear, Solid State Amplifier", 16th Quarterly Rep. under MURI Contract No. N00014-96-1-1223 for period Jun. 1-Aug. 31, 2000, Sep. 2000.

Jeon, et al., "A New "Active" Predistorter with High Gain Using Cascode-FET Structures", IEEE Radio Frequency Integrated Circuits Symposium, 2002, pp. 253-256.

Hsu, et al., "Comparison of Conventional and Thermally-Stable Cascode (TSC) AIGaAs/GaAs HBTs for Microwave Power Applications", Jml of Solid-State Electronics, V. 43, Sep. 1999.

Kim, et al., "High-Performance V-Band Cascode HEMT Mixer and Downconverter Module", IEEE Transactions on Microwave Theory and Techniques, vol. 51, No. 3, p. 805-810, Mar. 2003.

Mishra, et al., "High Power Broadband Amplifiers for 1-18 GHz Naval Radar" University of California, Santa Barbara, pp. 1-9, Jul. 1, 1998.

Perraud, et al., "A Direct-Conversion CMOS Transceiver for the 802.11a/b/g WLAN Standard Utilizing a Cartesian Feedback Transmitter", IEEE Journal of Solid-State Circuits, vol. 39, No. 12, Dec. 2004, pp. 2226-2238.

Rohde, et al., "Optic/Millimeter-Wave Converter for 60 Ghz Radio-Over-Fiber Systems", Fraunhofer-Institut für Angewandte Festkörperphysik Freiburg i. Br., Apr. 1997, pp. 1-5.

Darabi, et al. "A Dual-Mode 802.11b/Bluetooth Radio in 0.35-•m CMOS", IEEE Journal of Solid-State Circuits, vol. 40, No. 3, Mar. 2005, pp. 698-706.

Schlechtweg, et al., "Multifunctional Integration Using HEMT Technology", Fraunhofer Institute for Applied Solid State Physics, (date uncertain, believed Mar. 1997).

Nguyen, Patricia T., Office Action received from the USPTO dated Oct. 25, 2005 for related U.S. Appl. No. 10/875,405, 7 pgs.

Burgener, et al., Amendment filed in USPTO dated Jan. 25, 2006 for related U.S. Appl. No. 10/875,405, 11 pgs.

Nguyen, Patricia, Office Action received from USPTO dated Apr. 20, 2006 for related U.S. Appl. No. 10/875,405, 10 pgs.

Burgener, et al., Amendment filed in USPTO dated Aug. 21, 2006 for related U.S. Appl. No. 10/875,405, 10 pgs.

Ngyuen, Patricia, Notice of Allowance received from USPTO dated Sep. 27, 2006 for related U.S. Appl. No. 10/875,405, 5 pgs.

Burgener, et al., Comments on Examiner's Statement of Reasons for Allowance dated Dec. 26, 2006 for related U.S. Appl. No. 10/875,405, 3 pgs.

Le, Lana N., Notice of Allowance received from the USPTO dated Sep. 26, 2005 for related U.S. Appl. No. 11/158,597, 10 pgs.

Le, Lana, International Search Report received from USPTO dated Nov. 15, 2005 for related PCT appln. No. PCT/US2005/022407, 10 pgs.

Le, Lana N., Notice of Allowance received from the USPTO dated Feb. 27, 2006 for related U.S. Appl. No. 11/158,597, 7 pgs.

Dinh, Le T., International Search Report received from USPTO dated Mar. 28, 2003 for related application No. PCT/US02/32266, 2 pgs.

(56) References Cited

OTHER PUBLICATIONS

Tieu, Binh Kien, Notice of Allowance received from USPTO dated May 12, 2004 for related U.S. Appl. No. 10/267,531, now Pat. No. 6,804,502, 8 pgs.
Huang, "A 0.5 um CMOS T/R Switch for 900-MHz Wireless Application", IEEE Journal of Solid-State Circuits, vol. 36, No. 3, Mar. 2001, pp. 486-492.
Lauterbach, et al. "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.
Makioka, et al., "Super Self-Aligned GaAs RF Switch IC with 0.25 dB Extremely Low Insertion Loss for Mobile Communication Systems", IEEE Transactions on Electron Devices, vol. 48, No. 8, Aug. 2001, pp. 1510-1514.
Maxim Integrated Products, "Charge Pumps Shine in Portable Designs", published Mar. 15, 2001, pp. 1-13.
Texas Instruments, "TPS60204, TPS60205, Regulated 3.3-V, 100-mA Low-Ripple Charge Pump Low Power DC/DC Converters", published Feb. 2001, rev. Sep. 2001, pp. 1-18.
Nork, Sam, "New Charge Pumps Offer Low Input and Output Noise" Linear Technology Corporation, Design Notes, Design Note 243, published Nov. 2000, pp. 1-2.
Linear Technology, "LTC1550L/LTC1551L: Low Noise Charge Pump Inverters in MS8 Shrink Cell Phone Designs", published Dec. 1998, pp. 1-2.
Lascari, Lance, "Accurate Phase Noise Prediction in PLL Synthesizers" Applied Microwave & Wireless, published May 2000, pp. 90-96.
Englund, Terry Lee, Office Action received from USPTO dated Dec. 1, 2004 for related U.S. Appl. No. 10/658,154, 25 pgs.
Burgener, et al., Amendment filed in the USPTO dated Apr. 1, 2005 for related U.S. Appl. No. 10/658,154, 27 pgs.
Englund, Terry Lee, Office Action received from the USPTO dated Aug. 10, 2005 for related U.S. Appl. No. 10/658,154, 39 pgs.
Burgener, et al., Amendment After Final Rejection filed in the USPTO dated Oct. 11, 2005 for related U.S. Appl. No. 10/658,154, 32 pgs.
Englund, Terry Lee, Advisory Action received from USPTO dated Nov. 2, 2005 for related U.S. Appl. No. 10/658,154, 2 pgs.
Burgener, et al., Notice of Appeal filed in the USPTO dated Nov. 10, 2005 for related U.S. Appl. No. 10/658,154, 1 pg.
Burgener, et al., Amended Appeal Brief filed in the USPTO dated Jan. 5, 2007 for related U.S. Appl. No. 10/658,154, 165 pgs.
Englund, Terry Lee, Office Action received from USPTO dated May 17, 2007 for related U.S. Appl. No. 10/658,154, 52 pgs.
Burgener, et al., Amendment After Reopening of Prosecution filed in the USPTO dated Sep. 17, 2007 for related U.S. Appl. No. 10/658,154, 31 pgs.
Englund, Terry Lee, Office Action received from USPTO dated Dec. 12, 2007 for related U.S. Appl. No. 10/658,154, 52 pgs.
Burgener, et al., Notice of Appeal and Pre-Appea Brief Request for Review filed in USPTO dated May 12, 2008 for related U.S. Appl. No. 10/658,154, 7 pgs.
Tran, Pablo N., Office Action received from the USPTO dated Mar. 19, 2009 for related U.S. Appl. No. 11/501,125, 17 pgs.
Burgener, et al., Amendment filed in the USPTO dated Jun. 19, 2009 for related U.S. Appl. No. 11/501,125, 6 pgs.
Eber von Eschenbach, Jennifer, Communication and Supplementary European Search Report for related European appln. No. 05763216, dated Nov. 27, 2009, 10 pgs.
Englund, Terry Lee, Notice of Allowance received from the PTO for related U.S. Appl. No. 10/658,154 dated Jan. 11, 2010, 2 pgs.
Kelly, Dylan, et al., Response and Terminal Disclaimers filed in the USPTO for related U.S. Appl. No. 11/347,014, dated Mar. 16, 2010, 5 pages.
Tran, Pablo N., Office Action received from the USPTO dated Oct. 29, 2009 for related U.S. Appl. No. 11/501,125, 19 pgs.
Burgener, et al, Amendment filed in the USPTO dated Apr. 29, 2010 or related U.S. Appl. No. 11/501,125, 14 pgs.

Tran, Pablo N., Notice of Allowance received from the USPTO dated Jun. 10, 2010 for related U.S. Appl. No. 11/501,125, 11 pgs.
Kai, Tetsuo, an English translation of an Office Action received from the Japanese Patent Office for related appln. No. 2007-518298 dated Jul. 20, 2010, 5 pgs.
Burgener, et al., Response (in Japanese) as filed in the JPO for related appln. No. 2007-518298 dated Oct. 15, 2010 plus translation of Response as filed on Oct. 12, 2010, 55 pgs.
Kai, Tetsuo, Translation of an Office Action received from the JPO dated Mar. 23, 2011 for related Japanese appln. No. 2010-232563, 4 pgs.
Tran, Pablo N., Notice of Allowance received from the USPTO dated May 19, 2011 for related U.S. Appl. No. 12/501,125, 11 pgs.
Shifrin, Mitchell, et al., "Monolithic FET Structures for High-Power Control Component Applications", IEEE Transactions on Microwave Theory and Techniques, vol. 37, No. 12, Dec. 1989, pp. 2134-2141.
Wang, Dawn, et al., High Performance SOI RF Switches for Wireless Applications (Invited Paper), IEEE 2010, 4 pgs.
Nguyen, Hieu P., Office Action received from the USPTO dated Jun. 10, 2011 for related U.S. Appl. No. 12/657,727, 12 pgs.
Choe, Henry, Office Action received from the USPTO dated Jun. 15, 2011 for related U.S. Appl. No. 12/657,728, 4 pgs.
Nguyen, Hieu, Notice of Allowance received from the USPTO dated Sep. 20, 2011 for related U.S. Appl. No. 12/590,839, 13 pgs.
Nguyen, Hieu, Notice of Allowance received from the USPTO dated Sep. 29, 2011 for related U.S. Appl. No. 12/657,727, 14 pgs.
Choe, Henry, Notice of Allowance received from the USPTO dated Oct. 14, 2011 for related U.S. Appl. No. 12/799,910, 23 pgs.
Choe, Henry, Final Office Action received from the USPTO dated Sep. 13, 2011 for related U.S. Appl. No. 13/008,711, 13 pgs.
Unterberger, Michael, Extended Search Report received from the EPO dated Sep. 30, 2011 for related appln. No. 10011669.8, 9 pgs.
Nguyen, Khanh V., Office Action received from the USPTO dated Nov. 4, 2011 for related U.S. Appl. No. 12/807,365, 14 pgs.
Moore, Joanne, Notice of Opposition filed in the EPO dated Nov. 8, 2011 for related appln. No. 02800982.7-2220, 33 pgs.
Piccoli, Voye, Notice of Publication received from the EPO dated Oct. 19, 2011 for related appln. No. 10011669.8-2220, 2 pgs.
Adamski, et al., Response filed in the USPTO dated Dec. 13, 2011 for related U.S. Appl. No. 13/008,711, 5 pgs.
Tran, Pablo N., Notice of Allowance received from the USPTO dated Oct. 6, 2011 for related U.S. Appl. No. 11/501,125, 11 pgs.
Rodgers, Paul, et al. "Silicon UTSi CMOS RFIC for CDMA Wireless Communications Systems", IEEE MTT-s Digest, 1999, pp. 485-488.
Megahed, et al., "Low Cost UTSi Technology for RF Wireless Applications", IEEE MTT-S Digest, 1998.
Burgener, et al., Comments on Examiner's Statement of Reasons for Allowance filed in the USPTO dated Aug. 12, 2004 for related U.S. Appl. No. 10/267,531, 2 pgs.
Burgener, Mark, "CMOS SOS Switches Offer Useful Features, High Integration" Microwaves & RF, Aug. 2001, pp. 107-118.
Johnson, Robb, et al., "Advanced Thin-Film Silicon-on-Sapphire Technology: Microwave Circuit Applications", IEEE Transactions on Electron Devices, vol. 45, No. 5, May 1998, pp. 1047-1054.
Miyajima, Ikumi, an English translation of a Notice of Reasons for Refusal received from the Japanese Patent Office dated Oct. 15, 2006 for related appln. No. 2003-535287, 4 pgs.
Miyajima, Ikumi, an English translation of a Notice of Reasons for Refusal received from the Japanese Patent Office dated Feb. 13, 2006 for related appln. No. 2003-535287, 3 pgs.
Peregrine Semiconductor Corporation, Response filed in the EPO dated May 15, 2012 for related appln. No. 10011669.8, 19 pgs.
Van der Peet, H., Communication Pursuant to Article 94(3) EPC received from the EPO dated Jun. 19, 2008 for related appln. No. 02800982.7, 3 pgs.
Van der Peet, H., Communication Pursuant to Article 94(3) EPC received from the EPO dated Aug. 6, 2009 for related appln. No. 02800982.7, 2 pgs.
Van der Peet, H., Communication under Rule 71 (3) EPC received from the EPO dated Nov. 27, 2009 for related appln. No. 02800982.7, 68 pgs.

(56) References Cited

OTHER PUBLICATIONS

Unterberger, M, Decision to grant a European patent pursuant to Article 97(1) EPC dated Jan. 7, 2011 for related application No. 02800982.7, 1 pg.
Weman, Eva, Communication of a Notice of Opposition received from the EPO dated Nov. 8, 2011 for related application No. 02800982.7, 33 pgs.
Rohner, M., Communication of notices of opposition (R.79(1)(EPC) received from the EPO dated Dec. 7, 2011 for related application No. 02800982.7, 1 pg.
Peregrine Semiconductor Corporation, Response of the Patentee to the Notice of Opposition filed in the EPO dated Apr. 17, 2012 for related application No. 02800982.7, 42 pg.
Tiey, Binh Kien, Office Action received from the USPTO dated Feb. 19, 2013 for related U.S. Appl. No. 12/980,161, 97 pgs.
Burgener, et al., Preliminary Amendment filed in the USPTO dated Apr. 27, 2012 for related U.S. Appl. No. 12/980,161, 21 pgs.
Tieu, Binh Kien, Office Action from USPTO, Jun. 3, 2005, U.S. Appl. No. 10/922,135, 8 pgs.
Burgener, et al., Amendment filed in PTO on Dec. 5, 2005 for U.S. Appl. No. 10/922,135, 7 pgs.
Tieu, Binh Kien, Office Action from USPTO, Jan. 17, 2006, U.S. Appl. No. 10/922,135, 8 pgs.
Burgener, et al., Response filed in PTO on May 16, 2006 for U.S. Appl. No. 10/922,135, 4 pgs.
Tieu, Binh Kien, Notice of Allowance from USPTO, Jun. 2, 2006 for U.S. Appl. No. 10/922,135, 5 pgs.
Tieu, Binh Kien, Office Action from USPTO dated Nov. 15, 2007 for related U.S. Appl. No. 11/582,206, 9 pages.
Burgener, et al., Amendment filed in USPTO dated May 15, 2008 for related U.S. Appl. No. 11/582,206, 14 pages.
Tieu, Binh Kien, Notice of Allowance from USPTO dated Jul. 15, 2008 for related U.S. Appl. No. 11/582,206, 7 pages.
Orndorff, et al., "CMOS/SOS/LSI Switching Regulator Control Device", Solid-State Circuits Conf., Digest of Technical Papers, Feb. 1978 IEEE International, vol. XXI, pp. 234-235.
Caverly, Robert H., et al., "A Silicon CMOS Monolithic RF and Microwave Switching Element", 1997 European Microwave Conference, Jerusalem, Sep. 1987, 4 pgs.
Tieu, Binh Kien, Office Action received from the USPTO dated Sep. 16, 2009 for related U.S. Appl. No. 11/347,014, 26 pages.
Aquilani, Dario, Communication Pursuant to Article 94(3) EPC received from the EPO for related appln No. 05763216.8, dated Mar. 22, 2010, 7 pages.
Tieu, Binh Kien, Notice of Allowance received from the USPTO for related U.S. Appl. No. 11/347,014, dated Apr. 29, 2010, 12 pages.
Tieu, Binh Kien, Notice of Allowance received from the USPTO for related U.S. Appl. No. 12/315,395, dated Aug. 11, 2010, 26 pgs.
Tieu, Binh Kien, Supplemental Notice of Allowance received from the USPTO for related U.S. Appl. No. 12/315,395, dated Oct. 29, 2010, 10 pgs.
Kelly, et al., Comments on Examiner's Statement of Reasons for Allowance filed in the USPTO for related U.S. Appl. No. 11/347,014, dated Jul. 29, 2010, 2 pgs.
Chow, Charles Chiang, Office Action received from the USPTO dated Mar. 2, 2011 for related U.S. Appl. No. 11/347,671, 14 pgs.
Kelly, Dylan, Amendment filed in the USPTO dated May 2, 2011 for related U.S. Appl. No. 11/347,671, 6 pgs.
Aquilani, Dario, Communication and Supplementary European Search Report for related European appln. No. 05763216, dated Nov. 27, 2009, 10 pgs.
Chow, Charles Chiang, Office Action received from USPTO for related appln. No. 11/347,671 dated Aug. 19, 2008, 14 pgs.
Kelly, Dylan, Amendment filed in the USPTO for related U.S. Appl. No. 11/347,671 dated Dec. 19, 2008, 15 pgs.
Chow, Charles Chiang, Office Action received from USPTO for related U.S. Appl. No. 11/347,671 dated Apr. 16, 2009, 16 pgs.
Kelly, Dylan, Response filed in the USPTO for related U.S. Appl. No. 11/347,671 dated Jun. 16, 2009, 14 pgs.
Chow, Charles Chiang, Office Action received from the USPTO for related U.S. Appl. No. 11/347,671 dated Jul. 20, 2009, 17 pgs.
Kelly, Dylan, Amendment filed in the USPTO for related U.S. Appl. No. 11/347,671 dated Jan. 20, 2010, 18 pgs.
Chow, Charles Chiang, Office Action received from the USPTO or related U.S. Appl. No. 11/347,671 dated Apr. 28, 2010, 20 pgs.
Kelly, Dylan, Amendment filed in the USPTO for related U.S. Appl. No. 11/347,671 dated Jul. 28, 2010, 6 pgs.
Chow, Charles Chiang, Office Action received from the USPTO or related U.S. Appl. No. 11/347,671 dated Aug. 20, 2013, 18 pgs.
Kelly, Dylan, Amendment filed in the USPTO for related U.S. Appl. No. 11/347,671 dated Dec. 20, 2010, 12 pgs.
Chow, Charles Chiang, Office Action received from the USPTO for related U.S. Appl. No. 11/347,671 dated Mar. 2, 2011, 15 pgs.
Kelly, Dylan, Amendment filed in the USPTO for related U.S. Appl. No. 11/347,671 dated May 22, 2011, 6 pgs.
Chow, Charles Chiang, Advisory Action received from the USPTO for related U.S. Appl. No. 11/347,671 dated May 12, 2011, 3 pgs.
Kelly, Dylan, Notice of Appeal filed in USPTO dated Jun. 2, 2011 for related U.S. Appl. No. 11/347,671, 6 pgs.
Peregrine Semiconductor Corporation, a Response (in Japanese), dated Aug. 14, 2006, for related Japanese application No. 2003-535287, 32 pgs.
Peregrine Semiconductor Corporation, Response filed in the EPO, dated Dec. 23, 2008 for related application No. 02 800 982.7-2220, 22 pgs.
Peregrine Semiconductor Corporation, Response filed in the EPO, dated Oct. 7, 2009 for related application No. 02 800 982.7-2220, 23 pgs.
Chow, Charles Chiang, Notice of Allowance received from the USPTO dated Aug. 16, 2011 for related U.S. Appl. No. 11/347,671, 12 pgs.
Caverly, Robert H., "Linear and Nonlinear Characteristics of the Silicon CMOS Monolithic 50-$\Omega$ Microwave and RF Control Element", IEEE Journal of Solid-State Circuits, vol. 34, No. 1, Jan. 1999, pp. 124-126.
Philips Semiconductors, Product Specificate, IC17 Data Handbook, Nov. 7, 1997, pp. 1-14.
Iyama, Yoshitada, et al., "L-Band SPDT Switch Using Si-MOSFET", IEICE Trans. Electronic, vol. E-79-C, No. 5, May 1996, pp. 636-643.
Yamamoto, Kazuya, et al., "A 2.2-V Operating, 2.4-GHz Single-Chip GaAs MMIC Transceiver for Wireless Applications", IEEE Journal of Solid-State Circuits, vol. 34, No. 4, Apr. 1999, pp. 502-512.
Tran, Pablo N., Office Action received from the USPTO dated Feb. 3, 2012 for related U.S. Appl. No. 12/903,848, 46 pgs.
Hoffmann, Niels, Office Action received from the EPO dated Feb. 4, 2009 for related appln. No. 06786943.8, 104 pgs.
Peregrine Semiconductor Corporation, Response filed in the EPO dated Aug. 12, 2009 for related appln. No. 06786943.8, 31 pgs.
Hoffmann, Niels, Summons to Attend Oral Proceedings Pursuant to Rule 115(1) EPC dated Jul. 22, 2011 for related appln. No. 06786943.8, 8 pgs.
Peregrine Semiconductor Corporation, Response filed in the EPO dated Oct. 24, 2011 for related appln. No. 06786943.8, 1 pg.
Benker, Guido, Decision to Refulse a European Patent Application (Art. 97(2)EPC) dated Nov. 18, 2011 or related appln. No. 06786943.8, 4 pgs.
Peregrine Semiconductor Corporation, Response filed in the EPO dated Jan. 17, 2012 for related appln. No. 06786943.8, 1 pg.
Peregrine Semiconductor Corporation, Appeal to the Decision for Refusal filed in the EPO dated Mar. 20, 2012 for related appln. No. 06786943.8, 27 pgs.
Brindle, et al., Notice of Allowance received from the USPTO dated Nov. 17, 2011 for related U.S. Appl. No. 13/053,211, 41 pgs.
Hoffmann, Niels, International Search Report received from the EPO dated Feb. 27, 2012 for related appln. No. PCT/US2011/056942, 12 pgs.
Iljirna, et al., "Boosted Voltage Scheme with Active Body-Biasing Control on PD-SOI for Ultra Low Voltage Operation", IEICE Transactions on Electronics, Institute of Electronics, Tokyo, JP, vol. E90C, No. 4, Apr. 1, 2007, pp. 666-674.

(56) References Cited

OTHER PUBLICATIONS

Peregrine Semiconductor Corporation, Translation of a Response filed in the Chinese Patent Office dated Nov. 30, 2009 for related appln. No. 200680025128.7, 3 pgs.
Chinese Patent Office, Translation of an Office Action received from the Chinese Patent Office dated Nov. 2, 2011 for related appln. No. 200680025128.7, 12 pgs.
Shingleton, Michael, Office Action received from the USPTO dated Oct. 7, 2008 for related U.S. Appl. No. 11/811,816, 4 pgs.
Dribinsky, et al., Response filed in the USPTO dated Jan. 7, 2009 for related U.S. Appl. No. 11/881,816, 7 pgs.
Shingleton, Michael, Office Communication received from the USPTO dated Apr. 28, 2009 for related U.S. Appl. No. 11/811,816, 3 pgs.
Dribinsky, et al., Response filed in the USPTO dated Aug. 28, 2009 for related U.S. Appl. No. 11/881,816, 7 pgs.
Shingleton, Michael, Office Action received from the USPTO dated Jan. 19, 2010 for related U.S. Appl. No. 11/811,816, 16 pgs.
Dribinsky, et al., Response filed in the USPTO dated Jul. 19, 2010 for related U.S. Appl. No. 11/881,816, 22 pgs.
Shingleton, Michael, Office Action received from the USPTO dated Oct. 14, 2010 for related U.S. Appl. No. 11/811,816, 15 pgs.
Dribinsky, et al., Response filed in the USPTO dated Jan. 14, 2011 for related U.S. Appl. No. 11/881,816, 19 pgs.
Shingleton, Michael, Advisory Action received from the USPTO dated Mar. 18, 2011 for related U.S. Appl. No. 11/811,816, 3 pgs.
Shingleton, Michael, Interview Summary received from the USPTO dated Apr. 12, 2011 for related U.S. Appl. No. 11/811,816, 2 pgs.
Shingleton, Michael, Interview Summary received from the USPTO dated Apr. 18, 2011 for related U.S. Appl. No. 11/811,816, 3 pgs.
Dribinsky, et al., General Letter filed in the USPTO dated Jun. 29, 2011 for related U.S. Appl. No. 11/881,816, 1 pg.
Shingleton, Michael, Notice of Allowance received from the USPTO dated Oct. 12, 2011 for related U.S. Appl. No. 11/811,816, 5 pgs.
Dribinsky, et al., RCE and IDS filed in the USPTO dated Mar. 26, 2012 for related U.S. Appl. No. 11/881,816, 4 pgs.
Englekirk, Robert Mark, Amendment filed in the USPTO dated Mar. 5, 2012 for related U.S. Appl. No. 13/046,560, 4 pgs.
Nguyen, Tram Hoang, Office Action received from the USPTO dated Apr. 11, 2012 for related U.S. Appl. No. 13/412,529, 6 pgs.
Peregrine Semiconductor Corporation, Response filed in the EPO dated Apr. 17, 2012 for related appl. No. EP1451890, 42 pgs.
F. Hameau and O. Rozeau, "Radio-Frequency Circuits Integration Using CMOS SOI 0.25μm Technology", 2002 RF IC Design Workshop Europe, Mar. 19-22, 2002, Grenoble, France.
O. Rozeau et al., "SOI Technologies Overview for Low-Power Low-Voltage Radio-Frequency Applications," Analog Integrated Circuits and Signal Processing, 25, pp. 93-114, Boston, MA, Kluwer Academic Publishers, Nov. 2000.
C. Tinella et al., "A High-Performance CMOS-SOI Antenna Switch for the 2.55-GHz Band,"IEEE Journal of Solid-State Circuits, vol. 38, No. 7, Jul. 2003.
H. Lee et al., "Analysis of body bias effect with PD-SOI for analog and RF applications," Solid State Electron., vol. 46, pp. 1169-1176, 2002.
J.-H. Lee, et al., "Effect of Body Structure on Analog Performance of SOI NMOSFETs," Proceedings, 1998 IEEE International SOI Conference, Oct. 5-8, 1998, pp. 61-62.
C. F. Edwards, et al., The Effect of Body Contact Series Resistance on SOI CMOS Amplifier Stages, IEEE Transactions on Electron Devices, vol. 44, No. 12, Dec. 1997 pp. 2290-2294.
S. Maeda, et al., Substrate-bias Effect and Source-drain Breakdown Characteristics in Body-tied Short-channel SOI MOSFET's, IEEE Transactions on Electron Devices, vol. 46, No. 1, Jan. 1999 pp. 151-158.
F. Assaderaghi, et al., "Dynamic Threshold-voltage MOSFET (DTMOS) for Ultra-low Voltage VLSI," IEEE Transactions on Electron Devices, vol. 44, No. 3, Mar. 1997, pp. 414-422.
G. O. Workman and J. G. Fossum, "A Comparative Analysis of the Dynamic Behavior of BTG/SOI MOSFETs and Circuits with Distributed Body Resistance," IEEE Transactions on Electron Devices, vol. 45, No. 10, Oct. 1998 pp. 2138-2145.
T.-S. Chao, et al., "High-voltage and High-temperature Applications of DTMOS with Reverse Schottky Barrier on Substrate Contacts," IEEE Electron Device Letters, vol. 25, No. 2, Feb. 2004, pp. 86-88.
Wei, et al., "Measurement of Transient Effects in SOI DRAM/SRAM Access Transistors", IEEE Electron Device Letters, vol. 17, No. 5, May 1996.
Kuang, et al., "SRAM Bitline Circuits on PD SOI: Advantages and Concerns", IEEE Journal of Solid-State Circuits, vol. 32, No. 6, Jun. 1997.
Sleight, et al., "Transient Measurements of SOI Body Contact Effectiveness", IEEE Electron Device Letters, vol. 19, No. 12, Dec. 1998.
Chung, et al., "SOI MOSFET Structure with a Junction-Type Body Contact for Suppression of Pass Gate Leakage", IEEE Transactions on Electron Devices, vol. 48, No. 7, Jul. 2001.
Lee, et al., "Effects of Gate Structures on the RF Performance in PD SOI MOSFETs", IEEE Microwave and Wireless Components Letters, vol. 15, No. 4, Apr. 2005.
Hirano, et al., "Impact of Actively Body-bias Controlled (ABC) SOI SRAM by using Direct Body Contact Technology for Low-Voltage Application" IEEE, 2003, pp. 2.4.1-2.4.4.
Lee, et al., "Harmonic Distortion Due to Narrow Width Effects in Deep sub-micron SOI-CMOS Device for analog-RF applications", 2002 IEEE International SOI Conference, Oct. 2002.
Kuo, et al., "Low-Voltage SOI CMOS VLSI Devices and Circuits", 2001, Wiley Interscience, New York, XP001090589, pp. 57-60 and 349-354.
Chinese Patent Office, translation of an Office Action received from the Chinese Patent Office dated Jul. 31, 2009 for related appln. No. 200680025128.7, 3 pgs.
Brindle, Chris, et al, Translation of a Response filed in the Chinese Patent Office dated Nov. 30, 2009 for related appln. No. 200680025128.7, 3 pgs.
Sedra, Adel A., et al., "Microelectronic Circuits", Fourth Edition, University of Toronto, Oxford University Press, 1982, 1987, 1991 and 1998, pp. 374-375.
Suehle, et al., "Low Electric Field Breakdown of Thin Si02 Films Under Static and Dynamic Stress", IEEE Transactions on Electron Devices, vol. 44, No. 5, May 1997.
Bolam, et al., "Reliability Issues for Silicon-on-Insulator", IBM Microelectronics Division, IEEE 2000, pp. 6.4.1-6.4.4.
Hu, et al., "A Unified Gate Oxide Reliability Model", IEEE 37th Annual International Reliability Physics Symposium, San Diego, CA 1999, pp. 47-51.
Nguyen, Tram Hoang, Office Action received from the USPTO dated Sep. 19, 2008 for related U.S. Appl. No. 11/484,370, 7 pgs.
Brindle, Christopher, Response filed in the USPTO dated Jan. 20, 2009 for related U.S. Appl. No. 11/484,370, 7 pgs.
Nguyen, Tram Hoang, Office Action received from the USPTO dated Apr. 23, 2009 for related U.S. Appl. No. 11/484,370, 11 pgs.
Brindle, Christopher, Response filed in the USPTO dated Aug. 24, 2009 for related U.S. Appl. No. 11/484,370, 8 pgs.
Nguyen, Tram Hoang, Office Action received from the USPTO dated Jan. 6, 2010 for related U.S. Appl. No. 11/484,370, 46 pgs.
Brindle, Christopher, Amendment filed in the USPTO dated Jul. 6, 2010 for related U.S. Appl. No. 11/484,370, 32 pgs.
Nguyen, Tram Hoang, Notice of Allowance received from the USPTO dated Nov. 12, 2010 for related U.S. Appl. No. 11/484,370, 21 pgs.
Iperione, Analia, International Search Report received from the EPO dated Jul. 11, 2006 for related appln. No. PCT/US2006/026965, 19 pgs.
Peregrine Semiconductor Corporation, Response filed in the EPO dated May 16, 2011 for related appln. No. 11153313.9, 8 pgs.
Peregrine Semiconductor Corporation, Response filed in the EPO dated May 16, 2011 for related appln. No. 11153281.8, 7 pgs.
Peregrine Semiconductor Corporation, Response filed in the EPO dated May 16, 2011 for related appln. No. 11153241.2, 5 pgs.
Peregrine Semiconductor Corporation, Response filed in the EPO dated May 16, 2011 for related appln. No. 11153247.9, 6 pgs.
Peregrine Semiconductor Corporation, Response filed in the EPO dated May 16, 2011 for related appln. No. 11153227.1, 5 pgs.

(56) References Cited

OTHER PUBLICATIONS

Kurisu, Masakazu, Japanese Office Action received from the Japanese Patent Office dated Apr. 17, 2012 for related appln. No. 2010-506156, 4 pgs.
Patel, Reema, Notice of Allowance received from the USPTO dated May 24, 2012 for related appln. No. 13/046,560, 15 pgs.
Tong, Ah Fatt, et al., "RFCMOS Unit Width Optimization Technique", IEEE Transactions on Microwave Theory and Techniques, vol. 55, No. 9, Sep. 2007, pp. 1844-1853.
Schultz, John J., "The Dual-Gate MOSFET", CQ Magazine, Dec. 1968, pp. 30-32.
Choe, Henry, Notice of Allowance received from the USPTO dated Feb. 4, 2011 for related U.S. Appl. No. 12/589,800, 8 pgs.
Bacon, et al., Issue Fee Transmittal and Comments on Examiners Statement of Reasons for Allowance filed in the USPTO dated May 2, 2011 for related U.S. Appl. No. 12/589,800, 4pgs.
Jeong, Jinho, et al., "A 20 dBm Linear RF Power Amplifier Using Stacked Silicon-on-Sapphire MOSFETs", IEEE Microwave and Wireless Components Letters,. vol. 16, No. 12, Dec. 2006, pp. 684-686.
Sowlati, Tirdad, "A 2.4-GHz 0/18-um CMOS Self-Biased Cascode Power Amplifier", IEEE Journal or Solid-State Circuits, vol. 38, No. 8, Aug. 2003, pp. 1318-1324.
Ko, Sangwon, et al., "A Linearized Cascode CMOS Power Amplifier", Electrical and Computer Engineering Dept., Univ. of Florida, IEEE, 2006, 4 pgs.
Webster, D.R., et al., "Novel Circuit Synthesis Technique using Short Channel GaAs FETS Giving Reduced Intermodulation Distortion", Dept. of Electronic and Electrical Engineering, University College, London, IEEE 1995, pp. 1348-1351.
Webster, Danny, et al., "Control of Circuit Distortion by the Derivative Superposition Method", IEEE Microwave and Guided Wave Letter, vol. 6, No. 3, Mar. 1996, pp. 123-125.
Van Der Heijden, Mark, et al., "Theory and Design of an Ultra-Linear Square-Law Approximated LDMOS Power Amplifier in Class-AB Operation", IEEE Transactions on Microwave Theory and Techniques, vol. 50, No. 9, Sep. 2002, pp. 2176-2184.
Kim, Bonkee, et al., "A New Linearization Technique for MOSFET RF Amplifier using Multiple Gated Transistors", IEEE Micro. and Guided Wave Ltrs, V. 10, No. 9, Sep. 2000, 371-373.
Jeon, Moon-Suk, et al., "A New "Active" Predistortor with High Gain using Cascode-FET Structures", MO4D-4, 2002 IEEE Radio Frequency Integrated Circuits Symposium, p. 253-256.
Aoki, Ichiro, et al., "Fully Integrated CMOS Power Amplifier Design Using the Distributed Active-Transformer Architecture", IEEE Journal of Solid-State Circuits, vol. 37, No. 3, Mar. 2002, pp. 371-383.
McRory, John, et al., "Transformer Coupled Stacked FET Power Amplifiers", IEEE Journal of Solid-State Circuits, vol. 34, No. 2, Feb. 1999, pp. 157-161.
Ezzeddine, Amin, et al., "The High Voltage/High Power FET", MO1D-6, IEEE Radio Frequency Integrated Circuits Symposium, 2003, pp. 215-218.
Ding, Yongwang, et al., "A High-Efficiency CMOS +22-dBm Linear Power Amplifier", IEEE Journal of Solid-State Circuits, vol. 40, No. 9, Sep. 2005, pp. 1895-1900.
Choe, Henry, Notice of Allowance received from the USPTO dated Jan. 10, 2012 for related U.S. Appl. No. 13/008,711, 10 pgs.
Nguyen, Khanh V., Office Action received from the USPTO dated Apr. 5, 2012 for related U.S. Appl. No. 12/807,365, 10 pgs.
Ghilini, Marie, International Search Report and Written Opinion dated Apr. 16, 2012 for related appln. No. PCT/US2011/057381, 11 pgs.
Choe, Henry, Notice of Allowance received from the USPTO dated Aug. 2, 2012 for related U.S. Appl. No. 13/008,711, 15 pgs.
Burgener, et al., Response filed in the USPTO dated Aug. 3, 2012 for related U.S. Appl. No. 12/903,848, 5 pgs.
Nguyen, Khanh V., Notice of Allowance received from the USPTO dated Sep. 6, 2012 for related U.S. Appl. No. 12/807,365, 13 pgs.
Nguyen, Patricia T., Notice of Allowance received from the USPTO dated Sep. 27, 2012 for related U.S. Appl. No. 12/924,907, 40 pgs.
Tran, Pablo N, Notice of Allowance received from the USPTO dated Oct. 26, 2012 for related U.S. Appl. No. 12/903,848, 14 pgs.
Sharma, et al., Issue Fee Transmittal and Comments on Examiner's Statement of Reasons for Allowance dated Dec. 27, 2012 for related U.S. Appl. No. 12/924,907, 4 pgs.
Nguyen, Hieu, Office Action received from the USPTO dated Jun. 10, 2011 for related U.S. Appl. No. 12/657,727, 12 pgs.
Aquilani, Dario, Communication pursuant to Article 94(3) EPC received from the EPO dated Jan. 21, 2013 for related appln. No. 05763216.8, 4 pgs.
Tran, Pablo, Notice of Allowance received from the USPTO dated Feb. 15, 2013 for related U.S. Appl. No. 12/903,848, 26 pgs.
Choe, Henry, Office Action received from the USPTO dated Feb. 2, 2011 for related U.S. Appl. No. 12/657,728, 12 pgs.
Li, et al., Response filed in the USPTO dated Jun. 2, 2011 for related U.S. Appl. No. 12/657,728, 17 pgs.
Choe, Henry, Final Office Action received from the USPTO dated Jun. 15, 2011 for related U.S. Appl. No. 12/657,728, 4 pgs.
Li, et al., Response filed in the USPTO dated Sep. 4, 2011 for related U.S. Appl. No. 12/657,728, 10 pgs.
Choe, Henry, Advisory Action received from the USPTO dated Sep. 20, 2011 for related U.S. Appl. No. 12/657,728, 2 pgs.
Li, et al., Notice of Appeal and Pre-Appeal Brief Request for Review filed in the USPTO dated Nov. 14, 2011 for related U.S. Appl. No. 12/657,728, 8 pgs.
Choe, Henry, Notice of Allowance received from the USPTO dated Nov. 1, 2012 for related U.S. Appl. No. 12/657,728, 10 pgs.
Li, et al., Preliminary Amendment filed in the USPTO dated Apr. 22, 2009 for related U.S. Appl. No. 12/319,898, 8 pgs.
Choe, Henry, Notice of Allowance received from the USPTO dated May 5, 2010 for related U.S. Appl. No. 12/319,898, 7 pgs.
Li, et al., Issue Fee Transmittal and Comments on Examiner's Statement of Reasons for Allowance filed in the USPTO dated Aug. 4, 2010 for related U.S. Appl. No. 12/319,898, 3 pgs.
Adamski, et al., Proposed Amended Claims for Examiner's Consideration filed in the USPTO dated Aug. 31, 2010 for related U.S. Appl. No. 12/455,671, 9 pgs.
Choe, Henry, Notice of Allowance received from the USPTO dated Sep. 7, 2010 for related U.S. Appl. No. 12/455,671, 12 pgs.
Adamski, et al., Issue Fee Transmittal and Comments on Examiner's Statement of Reasons for Allowance filed in the USPTO dated Dec. 3, 2010 for related U.S. Appl. No. 12/455,671, 3 pgs.
Choe, Henry, Office Action received from USPTO for related U.S. Appl. No. 13/008,711, dated Apr. 4, 2011, 7 pgs.
Adamski, Jarolsaw, et al., Response filed in the USPTO dated Aug. 3, 2011 for related U.S. Appl. No. 13/008,711, 10 pgs.
Adamski, et al., Issue Fee Transmittal and Comments on Examiner's Statement of Reasons for Allowance filed in the USPTO dated Jan. 17, 2012 for related U.S. Appl. No. 12/799,910, 4 pgs.
Tran, Pablo, Notice of Allowance received from the USPTO dated May 19, 2011 for related U.S. Appl. No. 11/501,125, 11 pgs.
Choe, Henry, Notice of Allowance received from the USPTO dated Mar. 14, 2013 for related U.S. Appl. No. 12/657,728, 14 pgs.
Choe, Henry, Notice of Allowance received from the USPTO dated Apr. 5, 2013 for related U.S. Appl. No. 13/008,711, 15 pgs.
Nguyen, Hieu, Office Action received from the USPTO dated Dec. 28, 2010 for related U.S. Appl. No. 12/590,839, 5 pgs.
Adamski, et al., Response filed in the USPTO dated Feb. 28, 2011 for related U.S. Appl. No. 12/590,839, 15 pgs.
Nguyen, Hieu, Office Action received from the USPTO dated May 6, 2011 for related U.S. Appl. No. 12/590,839, 12 pgs.
Adamski, et al., Response filed in the USPTO dated Aug. 3, 2011 for related U.S. Appl. No. 12/590,839, 11 pgs.
Adamski, et al., Issue Fee Transmittal and Comments on Examiner's Statement of Reasons for Allowance filed in the USPTO dated Dec. 20, 2011 for related U.S. Appl. No. 12/590,839, 4 pgs.
Sokal, Nathan O., "Class E-A New Class of High Efficiency Tuned Single-Ended Switching Power Amplifiers", IEEE Journal of Solid-State Circuits, vol. SC-10, No. 3, Jun. 1975, pp. 168-176.
Nguyen, Hieu, Office Action received from the USPTO dated Mar. 8, 2011 for related U.S. Appl. No. 12/657,727, 5 pgs.

(56) References Cited

OTHER PUBLICATIONS

Ahadian, et al., Response to Restriction Requirement filed in the USPTO dated Apr. 5, 2011 for related U.S. Appl. No. 12/657,727, 3 pgs.
Ahadian, et al., Response filed in the USPTO dated Sep. 9, 2011 for related U.S. Appl. No. 12/657,727, 14 pgs.
Ahadian, et al., Issue Fee Transmittal and Comments on Examiner's Statement of Reasons for Allowance filed in the USPTO dated Dec. 27, 2011 for related U.S. Appl. No. 12/657,727, 5 pgs.
Lam, Fleming, Response filed in the USPTO dated Feb. 6, 2012 for related U.S. Appl. No. 12/807,365, 10 pgs.
Lam, Fleming, Response filed in the USPTO dated Jul. 3, 2012 for related U.S. Appl. No. 12/807,365, 8 pgs.
Tran, Pablo, Notice of Allowance received from the USPTO dated May 16, 2013 for related U.S. Appl. No. 12/903,848, 101 pgs.
Wang, Chi-Chang, et al., "Efficiency Improvement in Charge Pump Circuits", IEEE Journal of Solid-State Circuits, vol. 32, No. 6, Jun. 1997, pp. 852-860.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical MOSFET's with Si1-x-y GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Cherne, et al., U.S. Statutory Invention Registration No. H1435, published May 2, 1995.
Numata, et al., "A +2.4/0 V Controlled High Power GaAs SPDT Antenna Switch IC for GSM Application", IEEE Radio Frequency Integrated Circuits Symposium, 2002, pp. 141-144.
Huang, et al., "A 0.5-um CMOS T/R Switch for 900-MHz Wireless Applications", IEEE Journal of Solid-State Circuits, 2001, pp. 486-492.
Tinella, et al., "A 0.7dB Insertion Loss CMOS—SOI Antenna Switch with More than 50dB Isolation over the 2.5 to 5GHz Band", Proceeding of the 28th European Solid-State Circuits Conference, 2002, pp. 483-486.
Ohnakado, et al., "A 1.4dB Insertion Loss, 5GHz Transmit/Receive Switch Utilizing Novel Depletion-Layer Extended Transistors (DETs) in 0.18um CMOS Process", Symposium on VLSI Circuits Digest of Technical Papers, 2002, pp. 162-163.
Nakayama, et al., "A 1.9 GHz Single-Chip RF Front-End GaAs MMIC with Low-Distortion Cascade FET Mixer for Personal Handy-Phone System Terminals", IEEE, 1998, pp. 101-104.
McGrath, et al., "A 1.9-GHz GaAs Chip Set for the Personal Handyphone System", IEEE Transaction on Microwave Theory and Techniques, 1995, pp. 1733-1744.
Nakayama, et al., "A 1.9GHz Single-Chip RF Front End GaAs MMIC for Personal Communications", Microwave and Millimeter-Wave Monolithic Circuits Symposium, 1996, pp. 69-72.
Nakayama, et al., "A 1.9GHz Single-Chip RF Front End GaAs MMIC with Low-Distortion Cascode FET Mixer for Personal Handy-Phone System Terminals", Radio Frequency Integrated Circuits Symposium, 1998, pp. 205-208.
Gu, et al., "A 2.3V PHEMT Power SP3T Antenna Switch IC for GSM Handsets", IEEE GaAs Digest, 2003, pp. 48-51.
Darabi, et al., "A 2.4GHz CMOS Transceiver for Bluetooth", IEEE, 2001, pp. 89-92.
Huang, et al., "A 2.4-GHz Single-Pole Double Throw T/R Switch with 0.8-dB Insertion Loss Implemented in a CMOS Process", Silicon Microwave Integrated Circuits and Systems Research, 2001, pp. 1-4.
Huang, et al., "A 2.4-GHz Single-Pole Double Throw T/R Switch with 0.8-dB Insertion Loss Implemented in a CMOS Process (slides)", Silicon Microwave Integrated Circuits and Systems Research, 2001, pp. 1-16.
Yamamoto, et al., "A 2.4GHz Band 1.8V Operation Single Chip SI-CMOS T/R MMIC Front End with a Low Insertion Loss Switch", IEEE Journal of Solid-State Circuits, vol. 36, No. 8, Aug. 2001, pp. 1186-1197.
Kawakyu, et al., "A 2-V Operation Resonant Type T/R Switch with Low Distortion Characteristics for 1.9GHz PHS", IEICE Trans Electron, vol. E81-C, No. 6, Jun. 1998, pp. 862-867.
Huang, et al., "A 900-MHz T/R Switch with a 0.8-dB Insertion Loss Implemented in a 0.5-um CMOS Process", IEEE Custom Integrated Circuits Conference, 2000, pp. 341-344.
Workman, et al., "A Comparative Analysis of the Dynamic Behavior of BTG/SOI MOSFET's and Circuite with Distributed Body Resistance", IEEE Transactions and Electron Devices, vol. 45, No. 10, Oct. 1998, pp. 2138-2145.
Valeri, et al., "A Composite High Voltage Device Using Low Voltage SOI MOSFET's", IEEE, 1990, pp. 169-170.
Miyatsuji, et al., "A GaAs High Power RF Single Pole Double Throw Switch IC for Digital Mobile Communication System", IEEE International Solid-State Circuits Conference, 1994, pp. 34-35.
Miyatsuji, et al., "A GaAs High Power RF Single Pole Dual Throw Switch IC for Digital Mobile Communication System", IEEE Journal of Solid-State Circuits, 1995, pp. 979-983.
Puechberty, et al., "A GaAs Power Chip Set for 3V Cellular Communications", 1994.
Yamamoto, et al., "A GaAs RF Transceiver IC for 1.9GHz Digital Mobile Communication Systems", ISSCC96, 1996, pp. 340-341, 469.
Choumei, et al., "A High Efficiency, 2V Single Supply Voltage Operation RF Front End MMIC for 1.9GHz Personal Handy Phone Systems", IEEE, 1998, pp. 73-76.
Schindler, et al., "A High Power 2-18 GHz T/R Switch", IEEE Microwave and Millimeter-Wave Monolithic Circuits Symposium, 1990, pp. 119-122.
Gu, et al., "A High Power DPDT MMIC Switch for Broadband Wireless Applications", IEEE MTT-S Digest, 2003, pp. 173-176.
Tinella, et al., "A High Performance CMOS-SOI Antenna Switch for the 2.5-5-GHz Band", IEEE Journal of Solid-State Circuits, 2003, pp. 1279-1283.
Gu, et al., "A High Performance GaAs SP3T Switch for Digital Cellular Systems", IEEE MTT-S Digest, 2001, pp. 241-244.
Numata, et al., "A High Power Handling GSM Switch IC with New Adaptive Control Voltage Generator Circuit Scheme", IEEE Radio Frequency Integrated Circuits Symposium, 2003, pp. 233-236.
Madihian, et al., "A High Speed Resonance Type FET Transceiver Switch for Millimeter Wave Band Wireless Networks", 26th EuMC, 1996, pp. 941-944.
Tokumitsu, et al., "A Low Voltage High Power T/R Switch MMIC Using LC Resonators", IEEE Transactions on Microwave Theory and Techniques, 1995, pp. 997-1003.
Colinge, et al., "A Low Voltage Low Power Microwave SOI MOSFET", IEEE International SOI Conference, 1996, pp. 128-129.
Johnson, et al., "A Model for Leakage Control by MOS Transistor Stacking", ECE Technical Papers, 1997, pp. 1-28.
Matsumoto, et al., "A Novel High Frequency Quasi-SOI Power MOSFET for Multi-Gigahertz Application", IEEE, 1998, pp. 945-948.
Giugni, "A Novel Multi-Port Microwave/Millimeter-Wave Switching Circuit", Microwave Conference, 2000.
Caverly, "A Project Oriented Undergraduate CMOS Analog Microelectronic System Design Course", IEEE, 1997, pp. 87-88.
Harjani, et al., "A Prototype Framework for Knowledge Based Analog Circuit Synthesis", IEEE Design Automation Conference, 1987, pp. 42-49.
DeRossi, et al., "A Routing Switch Based on a Silicon-on-Insulator Mode Mixer", IEEE Photonics Technology Letters, 1999, pp. 194-196.
Kanda, et al., "A Si RF Switch MMIC for the Cellular Frequency Band Using SOI-CMOS Technology", The Institute of Electronics, Information and Communication Engineers, 2000, pp. 79-83.

(56) References Cited

OTHER PUBLICATIONS

Caverly, et al., "A Silicon CMOS Monolithic RF and Microwave Switching Element", 27th European Microwave Conference, 1997, pp. 1046-1051.
Valeri, et al., "A Silicon-on-Insulator Circuit for High Temperature, High-Voltage Applications", IEEE, 1991, pp. 60-61.
Yamamoto, et al., "A Single-Chip GaAs RF Transceiver for 1.9GHz Digital Mobile Communication Systems", IEEE Journal of Solid-State Circuits, 1996.
Yamamoto, et al., "A Single-Chip GaAs RF Transceiver for 1.9GHz Digital Mobile Communication Systems", IEEE, 1996, pp. 1964-1973.
Tsutsumi, et al., "A Single Chip PHS Front End MMIC with a True Single +3 Voltage Supply", IEEE Radio Frequency Integrated Circuits Symposium, 1998, pp. 105-108.
Wambacq, et al., "A Single Package Solution for Wireless Transceivers", IEEE, 1999, pp. 1-5.
Eggert, et al., A SOI-RF-CMOS Technology on High Resistivity SIMOX Substrates for Microwave Applications to 5 GHz, IEEE Transactions on Electron Devices, 1997, pp. 1981-1989.
Hu, et al., "A Unified Gate Oxide Reliability Model", IEEE 37th Annual International Reliability Physic Symposium, 1999, pp. 47-51.
Szedon, et al., "Advanced Silicon Technology for Microwave Circuits", Naval Research Laboratory, 1994, pp. 1-110.
Johnson, et al., "Advanced Thin Film Silicon-on-Sapphire Technology: Microwave Circuit Applications", IEEE Transactions on Electron Devices, 1998, pp. 1047-1054.
Burgener, et al., Amendment filed in the USPTO dated Dec. 2005 relating to U.S. Appl. No. 10/922,135.
Burgener, et al., Amendment filed in the USPTO dated May 2008 relating to U.S. Appl. No. 11/582,206.
Kai, An English translation of an Office Action received from the Japanese Patent Office dated Jul. 2010 relating to appln. No. 2007-518298.
Burgener, et al., Amendment filed in the USPTO dated Apr. 2010 relating to U.S. Appl. No. 11/501,125.
Heller, et al., "Cascode Voltage Switch Logic: A Different CMOS Logic Family", IEEE International Solid-State Circuits Conference, 1984, pp. 16-17.
Pylarinos, "Charge Pumps: An Overview", Proceedings of the IEEE International Symposium on Circuits and Systems, 2003, pp. 1-7.
Doyama, "Class E Power Amplifier for Wireless Transceivers", University of Toronto, 1999, pp. 1-9.
"CMOS Analog Switches", Harris, 1999, pp. 1-9.
Madihian, et al., "CMOS RF Ics for 900MHz-2.4GHz Band Wireless Communication Networks", IEEE Radio Frequency Integrated Circuits Symposium, 1999, pp. 13-16.
"CMOS SOI RF Switch Family", Honeywell, 2002, pp. 1-4.
"CMOS SOI Technology", Honeywell, 2001, pp. 1-7.
Burgener, "CMOS SOS Switches Offer Useful Features, High Integration", Microwaves & RF, 2001, pp. 107-118.
Analog Devices, "CMOS, Low Voltage RF/Video, SPST Switch", Analog Devices, inc., 1999, pp. 1-10.
Eggert, et al., "CMOS/SIMOX-RF-Frontend for 1.7GHz", Solid State Circuits Conference, 1996.
Orndorff, et al., CMOS/SOS/LSI Switching Regulator Control Device, IEEE International, vol. XXI, Feb. 1978, pp. 234-235.
Burgener, et al., Comments on Examiners Statements of Reasons for Allowance filed in the USPTO dated Aug. 2004 relating to U.S. Appl. No. 10/267,531.
Aquilani, Communication and supplementary European Search Report dated Nov. 2009 relating to appln. No. 05763216.
Van Der Peet, Communications pursuant to Article 94(3) EPC received from the EPO dated Jun. 2008 relating to appln. No. 02800982.7-2220.
Aquilani, Communications pursuant to Article 94(3) EPC received from the EPO dated Mar. 2010 relating to appln. No. 05763216.8.
Weman, Communication under Rule 71(3) EPC and Annex Form 2004 received from the EPO dated Nov. 2009 relating to appln. No. 020800982.7.
Van Der Peet, Communications pursuant to Article 94(3) EPC dated Aug. 2009 relating to appln. No. 02800982.7-2220.
Yamamoto, et al., "Design and Experimental Results of a 2V-Operation Single-Chip GaAs T/R MMIC Front-End for 1.9GHz Personal Communications", IEEE, 1998, pp. 7-12.
Savla, "Design and Simulation of a Low Power Bluetooth Transceiver", The University of Wisconsin, 2001, pp. 1-90.
Henshaw, "Design of an RF Transceiver", IEEE Colloquium on Analog Signal Processing, 1998.
Baker, et al., "Designing Nanosecond High Voltage Pulse Generators Using Power MOSFET's", Electronic Letters, 1994, pp. 1634-1635.
Caverly, "Development of a CMOS Cell Library for RF Wireless and Telecommunications Applications", VLSI Symposium, 1998.
Caverly, "Distortion Properties of Gallium Arsenide and Silicon RF and Microwave Switches", IEEE, 1997, pp. 153-156.
Luu, Final Office Action received from the USPTO dated Apr. 2009 relating to U.S. Appl. No. 11/351,342.
Colinge, "Fully Depleted SOI CMOS for Analog Applications", IEEE Transactions on Electron Devices, 1998, pp. 1010-1016.
Flandre, et al., "Fully Depleted SOI CMOS Technology for Low Voltage Low Power Mixed Digital/Analog/Microwave Circuits", Analog Integrated Circuits and Signal Processing, 1999, pp. 213-228.
Yamao, "GaAs Broadband Monolithic Switches", 1986, pp. 63-71.
Gopinath, et al., "GaAs FET RF Switches", IEEE Transactions on Electron Devices, 1985, pp. 1272-1278.
Lee, et al., "Harmonic Distortion Due to Narrow Width Effects in Deep Submicron SOI-CMOS Device for Analog RF Applications", 2002 IEEE International SOI Conference, Oct. 2002.
HI-5042 thru HI-5051 Datasheet, Harris Corporation, 1999.
Eisenberg, et al., "High Isolation 1-20GHz MMIC Switches with On-Chip Drivers", IEEE Microwave and Millimeter-Wave Monolithic Circuits Symposium, 1989, pp. 41-45.
Shifrin et al., "High Power Control Components Using a New Monolithic FET Structure", IEEE Microwave and Millimeter-Wave Monolithic Circuits Symposium, 1988, pp. 51-56.
Kohama, et al., "High Power DPDT Antenna Switch MMIC for Digital Cellular Systems", GaAs IC Symposium, 1995, pp. 75-78.
Kohama, et al., "High Power DPDT Antenna Switch MMIC for Digital Cellular Systems", IEEE Journal of Solid-State Circuits, 1996, pp. 1406-1411.
Yun, et al., "High Power-GaAs MMIC Switches wtih Planar Semi-Insulated Gate FETs (SIGFETs)", International Symposium on Power Semiconductor Devices & ICs, 1990, pp. 55-58.
Caverly, "High Power Gallium Nitride Devices for Microwave and RF Control Applications", 1999, pp. 1-30.
Caverly, "High Power Gallium Nitride Devices for Microwave and RF Control Applications", 2000, pp. 1-33.
Masuda, et al., "High Power Heterojunction GaAs Switch IC with P-1dB of more than 38dBm for GSM Application", IEEE, 1998, pp. 229-232.
De Boer, et al., "Highly Integrated X-Band Multi-Function MMIC with Integrated LNA and Driver Amplifier", TNO Physics and Electronics Laboratory, 2002, pp. 1-4.
Kanda, et al., "High Performance 19GHz Band GaAs FET Switches Using LOXI (Layerd Oxide Isolation)—MESFETs", IEEE, 1997, pp. 62-65.
Uda, et al., "High-Performance GaAs Switch IC's Fabricated Using MESFET's with Two Kinds of Pinch-Off Voltages and a Symmetrical Pattern Configuration", IEEE Journal of Solid-State Circuits, vol. 29, No. 10, Oct. 1994, pp. 1262-1269.
Uda, et al., "High Performance GaAs Switch IC's Fabricated Using MESFETs with Two Kinds of Pinch Off Voltages", IEEE GaAs IC Symposium, 1993, pp. 247-250.
Armijos, "High Speed DMOS FET Analog Switches and Switch Arrays", Temic Semiconductors 1994, pp. 1-10.
Katzin, et al., "High Speed 100+ W RF Switches Using GaAs MMICs", IEEE Transactions on Microwave Theory and Techniques, 1992, pp. 1989-1996.

(56) References Cited

OTHER PUBLICATIONS

Honeywell, "Honeywell SPDT Absorptive RF Switch", Honeywell, 2002, pp. 1-6.
Honeywell, "Honeywell SPDT Reflective RF Switch", Honeywell Advance Information, 2001, pp. 1-3.
Hirano, et al., "Impact of Actively Body Bias Controlled (ABC) SOI SRAM by Using Direct Body Contact Technology for Low Voltage Application", IEEE, 2003, pp. 2.4.1-2.4.4.
Larson, "Integrated Circuit Technology Options for RFIC's—Present Status and Future Directions", IEEE Journal of Solid-State Circuits, 1998, pp. 387-399.
Burghartz, "Integrated RF and Microwave Components in BiCMOS Technology", IEEE Transactions on Electron Devices, 1996, pp. 1559-1570.
Kelly, "Integrated Ultra CMIS Designs in GSM Front End", Wireless Design Magazine, 2004, pp. 18-22.
Bonkowski, et al., "Integraton of Triple Band GSM Antenna Switch Module Using SOI CMOS", IEEE Radio Frequency Integrated Circuits Symposium, 2004, pp. 511-514.
Le, International Search Report from the USPTO dated Mar. 2003 relating to U.S. Appl. No. 10/267,531.
Marenk, et al., "Layout Optimization of Cascode RF SOI Transistors", IEEE International SOI Conference, 2001, pp. 105-106.
Suematsu, et al., "L-Band Internally Matched Si-MMIC Front End", IEEE, 1996, pp. 2375-2378.
Iyama, et al., "L-Band SPDT Switch Using Si-MOSFET", IEICE Trans. Electron, vol. E79-C, No. 5, May 1996, pp. 636-643.
Caverly, "Linear and Nonlinear Characteristics of the Silicon CMOS Monolithic 50-Omega Microwave and RF Control Element", IEEE Journal of Solid-State Circuits, 1999, pp. 124-126.
Adan, et al., "Linearity and Low Noise Performance of SOIMOSFETs for RF Applications", IEEE International SOI Conference, 2000, pp. 30-31.
Gu, et al., "Low Insertion Loss and High Linearity PHEMT SPDT and SP3T Switch Ics for WLAN 802.11a/b/g Application", 2004 IEEE Radio Frequency Integrated Circuits Symposium, 2004, pp. 505-508.
Koudymov, et al., "Low Loss High Power RF Switching Using Multifinger AIGaN/GaN MOSHFETs", University of South Carolina Scholar Commons, 2002, pp. 449-451.
Abidi, "Low Power Radio Frequency IC's for Portable Communications", IEEE, 1995, pp. 544-569.
Kuo, et al., "Low Voltage SOI CMOS VLSI Devices and Circuits", Wiley, 2001, pp. 57-60, 349-354.
Wei, et al., "Measuremenets of Transient Effects in SOI DRAM/SRAM Access Transistors", IEEE Electron Device Letters, vol. 17, No. 5, May 1996.
De La Houssaye, et al., "Microwave Performance of Optically Fabricated T-Gate Thin Film Silicon on Sapphire Based MOSFETs", IEEE Electron Device Letters, 1995, pp. 289-292.
Shifrin, et al., "Monolithic FET Structure for HighPower Control Component Applications", IEEE Transactions on Microwave Theory and Techniques, 1989, pp. 2134-2142.
Smuk, et al., "Monolithic GaAs Multi-Throw Switches with Integrated Low Power Decoder/Driver Logic", 1997, IEEE Radio Frequency Integrated Circuits.
McGrath, et al., "Multi Gate FET Power Switches", Applied Microwave, 1991, pp. 77-88.
Smuk, et al., "Multi-Throw Plastic MMIC Switches up to 6GHz with Integrated Positive Control Logic", IEEE, 1999, pp. 259-262.
Razavi, "Next Generation RF Circuits and Systems", IEEE, 1997, pp. 270-282.
Gould, et al., "NMOS SPDT Switch MMIC with >48dB Isolation and 30dBm IIP3 for Applications within GSM and UMTS Bands", Bell Labs, 2001, pp. 1-4.
Caverly, "Nonlinear Properties of Gallium Arsenide and Silicon FET-Based RF and Microwave Switches", IEEE, 1998, pp. 1-4.
Tieu, Notice of Allowance and Fee(s) Due from the USPTO dated May 2004 relating to U.S. Appl. No. 10/267,531.
Tieu, Notice of Allowance and Fee(s) Due from the USPTO dated Jul. 2008 relating to U.S. Appl. No. 11/582,206.
Tieu, Notice of Allowance and Fee(s) Due from the USPTO dated Jun. 2006 relating to U.S. Appl. No. 10/922,135.
Tran, Notice of Allowance and Fee(s) Due from the USPTO dated Jun. 2010 relating to U.S. Appl. No. 11/501,125.
Tieu, Notice of Allowance and Fee(s) Due from the USPTO dated Apr. 2010 relating to U.S. Appl. No. 11/347,014.
Tieu, Notice of Allowance and Fee(s) Due from the USPTO dated Dec. 2008 relating to U.S. Appl. No. 11/127,520.
Luu, Notice of Allowance and Fee(s) Due from the USPTO dated Jul. 2009 relating to U.S. Appl. No. 11/351,342.
Miyajima, Notice of Reasons for Refusal from the Japanese Patent Office dated Feb. 2006 relating to appln. No. 2003-535287.
McGRATH, et al., "Novel High Performance SPDT Power Switches Using Multi-Gate FET's", IEEE, 1991, pp. 839-842.
Tieu, Office Action from the USPTO dated Nov. 2007 relating to U.S. Appl. No. 11/582,206.
Tieu, Office Action from the USPTO dated Jun. 2005 relating to U.S. Appl. No. 10/922,135.
Tieu, Notice of Allowance from the USPTO dated Jun. 2006 relating to U.S. Appl. No. 10/922,135.
Chow, Office Action from the USPTO dated Apr. 2010 relating to U.S. Appl. No. 11/347,671.
Tieu, Office Action from the USPTO dated Sep. 2009 relating to U.S. Appl. No. 11/347,014.
Luu, Office Action from the USPTO dated Oct. 2008 relating to U.S. Appl. No. 11/351,342.
Chow, Office Action from the USPTO dated Aug. 2010 relating to U.S. Appl. No. 11/347,671.
Suematsu, "On-Chip Matching SI-MMIC for Mobile Communication Terminal Application", IEEE, 1997, pp. 9-12.
Caverly, et al., "On-State Distortion in High Electron Mobility Transistor Microwave and RF Switch Control Circuits", IEEE Transactions on Microwave Theory and Techniques, 2000, pp. 98-103.
Kelly, Proposed Amendment After Final from the USPTO dated Jun. 2009 relating to U.S. Appl. No. 11/351,342.
"Radiation Hardened CMOS Dual DPST Analog Switch", Intersil, 1999, pp. 1-2.
Newman, "Radiation Hardened Power Electronics", Intersil Corporation, 1999, pp. 1-4.
Kelly, Response and Terminal Disclaimer filed in the USPTO dated Mar. 2010 relating to U.S. Appl. No. 11/347,014.
Burgener, et al., Response filed in the USPTO dated May 2006 relating to U.S. Appl. No. 10/922,135.
Kelly, Response to Office Action mailed to USPTO relating to U.S. Appl. No. 11/351,342 dated Jan. 30, 2009.
"RF & Microwave Device Overview 2003—Silicon and GaAs Semiconductors", NEC, 2003.
"RF Amplifier Design Using HFA3046, HFA3096, HFA3127, HFA3128 Transistor Arrays", Intersil Corporation, 1996, pp. 1-4.
"SA630 Single Pole Double Throw (SPDT) Switch", Philips Semiconductors, 1997.
Narendra, et al., "Scaling of Stack Effects and its Application for Leakage Reduction", ISLPED 2001, 2001, pp. 195-200.
Huang, "Schottky Clamped MOS Transistors for Wireless CMOS Radio Frequency Switch Application", University of Florida, 2001, pp. 1-167.
Botto, et al., "Series Connected Soft Switched IGBTs for High Power, High Voltage Drives Applications: Experimental Results", IEEE, 1997, pp. 3-7.
Baker, et al., "Series Operation of Power MOSFETs for High Speed Voltage Switching Applications", American Institute of Physics, 1993, pp. 1655-1656.
Lovelace, et al., "Silicon MOSFET Technology for RF ICs", IEEE, 1995, pp. 1238-1241.
Rodgers, et al., "Silicon UTSi CMOS RFIC for CDMA Wireless Communications System", IEEE MTT-S Digest, 1999, pp. 485-488.
"Silicon Wave SiW1502 Radio Modem IC", Silicon Wave, 2000, pp. 1-21.
Johnson, et al., "Silicon-On-Sapphire MOSFET Transmit/Receive Switch for L and S Band Transceiver Applications", Electronic Letters, 1997, pp. 1324-1326.

(56) References Cited

OTHER PUBLICATIONS

Reedy, et al., "Single Chip Wireless Systems Using SOI", IEEE International SOI Conference, 1999, pp. 8-11.
Stuber, et al., "SOI CMOS with High Performance Passive Components for Analog, RF and Mixed Signal Designs", IEEE International SOI Conference, 1998, pp. 99-100.
Chung, et al., "SOI MOSFET Structure with a Junction Type Body Contact for Suppression of Pass Gate Leakage", IEEE Transactions on Electron Devices, vol. 48, No. 7, Jul. 2001.
Rozeau, "SOI Technologies Overview for Low Power Low Voltage Radio Frequency Applications", Analog Integrated Circuits and Signal Processing, Nov. 2000, pp. 93-114.
Fukuda, et al., "SOI CMOS Device Technology", Special Edition on 21st Century Solutions, 2001, pp. 54-57.
Fukuda, et al., "SOI CMOS Device Technology", OKI Technical Review, 2001, pp. 54-57.
Kusunoki, et al., "SPDT Switch MMIC Using E/D Mode GaAs JFETs for Personal Communications", IEEE GaAs IC Symposium, 1992, pp. 135-138.
Caverly, et al., "Spice Modeling of Microwave and RF Control Diodes", IEEE, 2000, pp. 28-31.
Kuang, et al., "SRAM Bitline Circuits on PD SOI: Advantages and Concerns", IEEE Journal of Solid State Circuits, vol. 32, No. 6, Jun. 1997.
Baker, et al., "Stacking Power MOSFETs for Use in High Speed Instrumentation", American Institute of Physics, 1992, pp. 5799-5801.
Sanders, "Statistical Modeling of SOI Devices for the Low Power Electronics Program", AET, Inc., 1995, pp. 1-109.
Maeda, et al., "Substrate Bias Effect and Source Drain Breakdown Characteristics in Body Tied Short Channel SOI MOSFETs", IEEE Transactions on Electron Devices, vol. 46, No. 1, Jan. 1999, pp. 151-158.
Makioka, et al., "Super Self Aligned GaAs RF Switch IC with 0.25dB Extremely Low Insertion Loss for Mobile Communication Systems", IEEE Transactions on Electron Devices, vol. 48, No. 8, Aug. 2001, pp. 1510-1514.
Karandikar, et al., "Technology Mapping for SOI Domino Logic Incorporating Solutions for the Parasitic Bipolar Effect", ACM, 2001, pp. 1-14.
Huang, et al., "TFSOI Can It Meet the Challenge of Single Chip Portable Wireless Systems", IEEE International SOI Conference, 1997, pp. 1-3.
Devlin, "The Design of Integrated Switches and Phase Shifters", 1999.
Edwards, et al., "The Effect of Body Contact Series Resistance on SOI CMOS Amplifier Stages", IEEE Transactions on Electron Devices, vol. 44, No. 12, Dec. 1997, pp. 2290-2294.
Hess, et al., "Transformerless Capacitive Coupling of Gate Signals for Series Operation of Power MOS Devices", IEEE, 1999, pp. 673-675.
"uPG13xG Series L-Band SPDT Switch GaAs MMIC", NEC, 1996, pp. 1-30.
Reedy, et al., "UTSi CMOS: A Complete RF SOI Solution", Peregrine Semiconductor, 2001, pp. 1-6.
Hittite Microwave, "Wireless Symposium 2000 is Stage for New Product Introductions", Hittite Microwave, 2000, pp. 1-8.
Montoriol, et al., "3.6V and 4.8V GSM/DCS1800 Dual Band PA Application with DECT Capability Using Standard Motorola RFICs", 2000, pp. 1-20.
Wang, et al., "Efficiency Improvement in Charge Pump Circuits", IEEE Journal of Solid-State Circuits, vol. 32, No. 6, Jun. 1997, pp. 852-860.
Ajjkuttira, et al., "A Fully Integrated CMOS RFIC for Bluetooth Applications", IEEE International Solid-State Circuits Conference, 2001, pp. 1-3.
Apel, et al., "A GaAs MMIC Transceiver for 2.45 GHz Wireless Commercial Products", Microwave and Millimeter-Wave Monolithic Circuits Symposium, 1994, pp. 15-18.

Assaderaghi, et al., "Dynamic Threshold Voltage MOSFET (DTMOS) for Ultra Low Voltage VLSI", IEEE Transactions on Electron Devices, vol. 44, No. 3, Mar. 1997, pp. 414-422.
Bolam, et al., "Reliability Issues for Silicon-on-Insulator", IEEE, 2000, pp. 6.4.1-6.4.4.
Bolam, et al., "Reliability Issues for Silicon-on-Insulator", IBM Micro Electronics Division, IEEE 2000, pp. 6.4.1-6.4.4.
Caverly, et al., "CMOS RF Circuits for Integrated Wireless Systems", IEEE, 1998, pp. 1-4.
Chao, et al., "High-Voltage and High-Temperature Applications of DTMOS with Reverse Schottky Barrier on Substrate Contacts", vol. 25, No. 2, Feb. 2004, pp. 86-88.
Devlin, et al., "A 2.4 GHz Single Chip Transceiver", Microwave and Millimeter-Wave Monolithic Circuits Symposium, 1993, pp. 23-26.
Fiorenza, et al., "RF Power Performance of LDMOSFETs on SOI: An Experimental Comparison with Bulk Si MOSFETs", IEEE Radio Frequency Integrated Circuits Symposium, 2001, pp. 43-46.
Giffard, et al., "Dynamic Effects in SOI MOSFETs", IEEE SOS/SOI Technology Conference, Oct. 1991, pp. 160-161.
Hirano, et al., "Impact of Actively Body-Bias Controlled (ABC) SOI SRAM by Using Direct Body Contact Technology for Low-Voltage Applications", IEEE, 2003, pp. 2.4.1-2.4.4.
Imai, et al., "Novel High Isolation FET Switches", IEEE Transactions on Microwave Theory and Techniques, 1996, pp. 685-691.
Ishida, et al., "A Low Power GaAs Front End IC with Current Reuse Configuration Using 0.15um Gate GaAs MODFETs", IEEE, 1997, pp. 669-672.
Iwata, et al., "Gate Over Driving CMOS Architecture for 0.5V Single Power Supply Operated Devices", IEEE, 1997, pp. 290-291, 473.
Kumar, et al., "A Simple High Performance Complementary TFSOI BiCMOS Technology with Excellent Cross-Talk Isolation", 2000 IEEE International SOI Conference, 2000, pp. 142-143.
Kwok, "An X-Band SOS Resistive Gate Insulator Semiconductor (RIS) Switch", IEEE Transactions on Electron Device, 1980, pp. 442-448.
Lee, et al., "Effect of Body Structure on Analog Performance of SOI NMOSFETs", 1998 IEEE International SOI Conference, Oct. 1998, pp. 61-62.
Lee, "CMOS RF: (Still) No Longer an Oxymoron (Invited)", IEEE Radio Frequency Integrated Circuits Symposium, 1999, pp. 3-6.
McRory, et al., "Transformer Coupled Stacked FET Power Amplifier", IEEE Journal of Solid State Circuits, vol. 34, No. 2, Feb. 1999, pp. 157-161.
Nagayama, et al., "Low Insertion Los DP3T MMIC Switch for Dual Band Cellular Phones", IEEE Jounral of Solid State Circuits, 1999, pp. 1051-1055.
Nishijima, et al., "A High Performance Transceiver Hybrid IC for PHS Hand Set Operating with Single Positive Voltage Supply", Microwave Symposium Digest, 1997, pp. 1155-1158.
O, et al., "CMOS Components for 802.11b Wireless LAN Applications", IEEE Radio Frequency Integrated Circuits Symposium, 2002, pp. 103-106.
Peczalski, "RF/Analog/Digital SOI Technology GPS Receivers and Other Systems on a Chip", IEEE Aerospace Conference Proceedings, 2002, pp. 2013-2017.
Shifrin, et al., "A New Power Amplifier Topology with Series Biasing and Power Combining of Transistors", IEEE 1992 Microwave and Millimeter-Wave Monolithic Circuits Symposium, 1992, pp. 39-41.
Shimura, et al., "High Isolation V-Band SPDT Switch MMIC for High Power Use", IEEE MTT-S International Microwave Symposium Digest, 2001, pp. 245-248.
Uda, et al., "A High Performance and Miniturized Dual Use (antenna/local) GaAs SPDT Switch IC Operating at +3V/0V", Microwave Symposium Digest, 1996, pp. 141-144.
Uda, et al., "High Performance GaAs Switch IC's Fabricated Using MESFETs with Two Kinds of Pinch Off Voltages and a Symmetrical Pattern Configuration", IEEE Journal of Solid-State Circuits, 1994, pp. 1262-1269.
"An Ultra-Thin Silicon Technology that Provides Integration Solutions on Standard CMOS", Peregrine Semiconductor, 1998.
Caverly, "Distortion in Microwave Control Devices", 1997.
Masuda, et al., "RF Current Evaluation of ICs by MP-10L", NEC Research & Development, vol. 40-41, 1999, pp. 253-258.

(56) References Cited

OTHER PUBLICATIONS

"Miniature Dual Control SP4T Switches for Low Cost Multiplexing", Hittite Microwave, 1995.
Uda, "Miniturization and High Isolation of a GaAs SPDT Switch IC Mounted in Plastic Package", 1996.
Lauterbach, et al., "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.
Minoli, "Telecommunications Technology Handbook", Artech House, 2003.
Morreale, "The CRC Handbook of Modem Telecommunication", CRC Press, 2001.
Sayre, "Complete Wireless Design", McGraw-Hill, 2001.
Schaper, "Communications, Computations, Control, and Signal Processing", Kluwer Academic, 1997.
Shafi, "Wireless Communications in the 21st Century", Wiley, 2002.
Willert-Porada, "Advances in Microwave and Radio Frequency Processing", 8th International Conference on Microwave and High-Frequency Heating, Springer Publication, 2001.
Gibson, "The Communication Handbook", CRC Press, 1997.
Hanzo, "Adaptive Wireless Transceivers", Wiley, 2002.
Itoh, "RF Technologies for Low Power Wireless Communications", Wiley, 2001.
Lossee, "RF Systems, Components, and Circuits Handbook", Artech House, 1997.
Miller, "Modern Electronic Communications", Prentice-Hall, 1999.
Drozdovsky, et al., "Large Signal Modeling of Microwave Gallium Nitride Based HFETs", Asia Pacific Microwave Conference, 2001, pp. 248-251.
Ayasli, "Microwave Switching with GaAs FETs", Microwave Journal, 1982, pp. 719-723.
Eron, "Small and Large Signal Analysis of MESETs as Switches" Microwave Journal, 1992.
"A Voltage Regulator for GaAs FETs", Microwave Journal, 1995.
Slobodnik, et al., "Millimeter Wave GaAs Switch FET Modeling", Microwave Journal, 1989.
Madihian, et al., "A 2-V, 1-10GHz BiCMOS Transceiver Chip for Multimode Wireless Communications Networks", IEEE, 1997, pp. 521-525.
Caverly, "Distortion in GaAs MESFET Switch Circuits", 1994.
Chen, et al., "Dual-Gate GaAs FET: A Versatile Circuit Component for MMICs", Microwave Journal, Jun. 1989, pp. 125-135.
Bullock, "Transceiver and System Design for Digital Communication", Noble, 2000.
Crols, "CMOS Wireless Transceiver Design", Kluwer Academic, 1997.
Hickman, "Practical RF Handbook", Newnes, 1997.
Hagen, "Radio Frequency Electronics", Cambridge University Press, 1996.
Koh, et al., "Low-Voltage SOI CMOS VLSI Devices and Circuits", Wiley Interscience, XP001090589, New York, 2001, pp. 57-60, 349-354.
Leenaerts, "Circuits Design for RF Transceivers" Kluwer Academic, 2001.
Johnson, "Advanced High-Frequency Radio Communication", Artech House, 1997.
Larson, "RF and Microwave Circuit Design for Wireless Communications", Artech House, 1996.
Misra, "Radio Frequency and Microwave Communication Circuits", Wiley, 2001.
Barker, Communications Electronics-Systems, Circuits, and Devices, 1987, Prentice-Hall.
Carr, "Secrets of RF Circuit Design", McGraw-Hill, 1997.
Couch, "Digital and Analog Communication Systems", 2001, Prentice-Hall.
Couch, "Modern Telecommunication System", Prentice-Hall, 1995.
Freeman, "Radio System Design for Telecommunications", Wiley, 1997.
Pozar, "Microwave and RF Design of Wireless Systems", Wiley, 2001.
Maas, "The RF and Microwave Circuit Design Cookbook", Artech House, 1998.
Smith, "Modem Communication Systems", McGraw-Hill, 1998.
Van Der Pujie, "Telecommunication Circuit Design", Wiley, 2002.
Razavi, "RF Microelectronics", Prentice-Hall, 1998.
Van Der Pujie, "Telecommunication Circuit Design", Wiley, 1992.
Weisman, "The Essential Guide to RF and Wireless", Prentice-Hall, 2000.
Wetzel, "Silicon-on-Sapphire Technology for Microwave Power Application", University of California, San Diego, 2001.
Johnson, "Silicon-on-Sapphire Technology for Microwave Circuit Applications", Dissertation, UCSD, 1997, pp. 1-184.
Adamski, et al., Comments on Examiner's Statement of Reasons for Allowance filed in USPTO on Jul. 3, 2013 for related U.S. Appl. No. 13/008,711, 3 pgs.
Burgener, et al., Amendment filed in the USPTO dated Aug. 19, 2013 for related U.S. Appl. No. 12/980,161, 20 pgs.
Tran, Pablo N., Notice of Allowance received from the USPTO dated Aug. 28, 2013 for related U.S. Appl. No. 12/903,848, 18 pgs.
Peregrine Semiconductor Corporation, Response filed in the EPO dated Jul. 29, 2013 for related appln. No. 05763216.8, 17 pgs.

\* cited by examiner

INTEGRATED RF FRONT END WITH STACKED TRANSISTOR SWITCH

This application is a continuation of and commonly assigned U.S. patent application Ser. No. 11/501,125, filed Aug. 7, 2006 now U.S. Pat. No. 8,131,251 and entitled "Integrated RF Front End with Stack Transistor Switch", which is a continuation of commonly assigned U.S. patent application Ser. No. 11/158,597 filed Jun. 22, 2005, now U.S. Pat. No. 7,088,971, issued Aug. 8, 2006 and entitled "Integrated RF Front End," which is a continuation-in-part of commonly assigned U.S. patent application Ser. No. 10/875,405 filed Jun. 23, 2004, now U.S. Pat. No. 7,248,120, issued Jul. 24, 2007, and entitled "Stacked Transistor Method and Apparatus,"; and this continuation application is related to the following commonly owned U.S. patent documents: U.S. Pat. No. 5,663,570, issued Sep. 2, 1997 and entitled "High-Frequency Wireless Communication System on a Single Ultrathin Silicon On Sapphire Chip," U.S. Pat. No. 6,804,502, issued Oct. 12, 2004 and entitled "Switch Circuit and Method of Switching Radio Frequency Signals," and U.S. Pat. No. 7,719,343 issued May 18, 2010, and entitled "Low Noise Charge Pump Method and Apparatus"; and the entire contents of each of the above-cited U.S. patent documents are hereby incorporated herein in their entireties by reference.

BACKGROUND OF THE INVENTION

1. Field of the Invention

This invention relates broadly to integrated electronic circuits, and more specifically to RF transceiver circuitry.

2. Related Art

Wireless communications devices, especially handheld devices, are undergoing sustained development. Perhaps more than any other factor, the extreme popularity of cellular mobile telephones has motivated improvements in efficiency, speed, size and cost-effectiveness for RF transmission circuits in handheld devices. Enhancing the efficiency of such circuits is highly desirable so that the size of the required batteries may be reduced, while their life is extended. Cost-effectiveness is clearly always desirable for consumer products, particularly when such products require periodic replacement to stay abreast of changes in the technology. The steady advance of functionality in cellular telephones, combined with consumer preferences for light and small devices, puts a premium on reducing the volume required for RF transmission circuits. Additionally, transmitters must meet stringent emission limits, which have been established in order to facilitate high communication density at minimal power levels.

Most wireless communication units, such as cellular telephones, comprise at least one RF transceiver. A communication device, such as a cellular telephone, may comprise a multiplicity of RF (radio frequency) front end circuits, which are of primary interest herein. RF front end circuits (or subcircuits) typically include an RF transmit signal amplifier, a Power Amplifier (PA), a matching and filtering section, an antenna switch, and may include a received signal amplifier. A complete transceiver generally also includes a low-noise amplifier for the received signal. Of these circuits, the PA subcircuit is typically the most power-consuming portion of such transmitters, and, also typically, is the source of the most significant unintended or "spurious" emissions. In order to extend battery life, to meet stringent spurious emissions standards, and to minimize the cost of these high-volume consumer items, there is a need to improve the speed and efficiency, while reducing spurious emissions and manufacturing costs, for such PA subcircuits. Due to their need to handle high power, the PA and antenna switch subcircuits consume the most integrated circuit area. Manufacturing costs for integrated circuits are strongly dependent on the amount of device area required for each circuit. Consequently, substantial reductions in the area required for the various RF transceiver subsections will generally lead to commensurate reductions in manufacturing costs for transceiver circuits.

A range of PA topologies have been developed, each having different advantages. For example, PAs of class A, B, C, D, E and F are well known in the art. The primary amplifying devices in PAs of classes A-C are designed to operate in an "active" region of their operating range, thus intentionally conducting current while voltage is present across the device. PAs of classes D, E and F attempt to reduce the power loss caused by such linear operation by employing amplifier devices as switches that minimize operation in active regions, rather than as linear amplifiers. However, the pulse-type outputs from such amplifiers generally require extensive filtering in order to establish a narrow-band sinusoidal output, as is typically required. While normal operation of PAs in classes D-F does not intentionally cause drive element devices to conduct while voltage is present across the devices, even switched devices consume real power due to current flowing while voltage is present during finite switching periods. Moreover, compared to drive devices in analog PAs operating at the same transmission center frequency, drive devices in class D-F switching circuits must often operate at much higher frequencies. The higher frequency signals include significant energy at undesired frequencies, and such undesired signal energies not only consume circuit power, but also require filtering to meet emission limits.

Integration of devices is generally desirable in order to improve various features of the resulting product, such as operating frequency and reliability, and may also reduce overall manufacturing costs, as well as likely reducing the volume occupied by the circuits. Field Effect Transistors (FETs) are extremely popular for both linear amplification and switching purposes in integrated circuits. However, integrated circuit (IC) FETs have a limited capability to withstand voltage between any two nodes, including gate-source, gate-drain, and drain-source node pairs. Such voltage withstand limitations may particularly impair the usefulness of IC FETs in high power switching circuits, in which inductive voltages may greatly exceed the supply voltage. As a particular example, the transmission output power capability of an RF PA is highly dependent upon the amplitude of the output voltage. One of the difficulties with existing PA technologies is that many otherwise desirably high-speed devices are fabricated using processes that tend to yield FETs having relatively low breakdown voltages. It is very desirable to solve this problem ant thereby provide a wider voltage range while retaining other desirable integrated device features. Such a solution enables integration on monolithic integrated circuits of power and control features that previously required separate processing, such as PA features and RF switch features. Integration of interacting circuits that were previously discrete will enhance yield and predictability, due to the process matching that is inherent in monolithic integration.

Methods and circuits are described herein that facilitate the fabrication of all of the transceiver RF circuits of a dual-band transceiver onto a single integrated circuit, thereby solving the problems and gaining the benefits noted above. Many of the benefits are achieved by integrating even the front-end portions of transceivers that do not necessarily include dual-band operation. One or more alternatives are described for each of numerous subcircuits (or corresponding methods), and a fully integrated RF front end, or an integrated RF transceiver, may be fabricated by using any compatible one of such alternatives for each section of the transceiver. Moreover, several of the subcircuits (or corresponding methods) that permit an integrated RF transceiver to be realized are also useful in other contexts, often independently of other RF transceiver subcircuits. Thus, various subcombinations of features described herein constitute useful inventions in their own right. Combined, various aspects of these subcombinations together achieve an integrated dual-band RF transceiver having all of the benefits noted above. Particularly notable among the independently useful subcircuits are stacked-FET RF switches and particular PA circuit topologies. Finally, the integration of certain RF transceiver subsections permits efficiencies in manufacturing without compromising safety and reliability of the final product.

SUMMARY

A combination of methods and/or circuits is described that enables the fabrication of a self-protected monolithic integrated circuit including all of the RF front-end sections of a communications transceiver. Such self-protected RF front-end circuits particularly include those sections, from a Power Amplifier (PA) through an antenna connection, that permit efficient internal protection from overload due to an improper, missing or damaged antenna.

Several subcombinations of the self-protected monolithic integrated RF front-end circuits have independent importance. One such subcombination is an integrated stacked-FET switch. One embodiment of this subcombination is a circuit including a multiplicity of FETs in a stack having drain-source channels coupled in series to control conductivity between nodes in a circuit. A control signal is coupled to a first FET to cause changes in conductivity of the first FET, and conductivity of the remaining FETs is enslaved to the conductivity of the first FET. A voltage withstand capability across the series combination of the FET stack may be substantially equal to a sum of drain-source voltage withstand capabilities of the individual FETs of the stack. A gate of each FET other than the first FET may be capacitively coupled to a common voltage.

Another subcombination is an RF Power Amplifier (PA) that may be referred to as an integrated iClass PA. One embodiment of this subcombination includes an input controlling an RF switch whose output is coupled to a supply source via an RF choke, and which operates with a characteristic drive output impedance at an operating frequency $f_0$. The drive output is coupled to an antenna connection having an expected antenna impedance via a coupling circuit that matches the drive output impedance to the expected antenna impedance, and also includes a circuit that dissipatively terminates signals at one or more harmonics of the operating frequency $f_0$. The iClass RF PA may further include a shunt filter configured to provide local minimum impedances between the drive output and the reference at a plurality of frequencies, including an even harmonic of $f_0$ and a non-unity odd harmonic of $f_0$. These minimum impedances may be approximately equal to the characteristic drive impedance.

One embodiment of the self-protected front-end circuit is an integrated circuit that includes a PA having an output amplitude regulator circuit that is controlled by an output limiting controller. The embodiment further includes an antenna switch that selectably couples an antenna connection to either the PA, via a matching and coupling circuit, or to a receive signal amplifier. The embodiment also includes an antenna connection sensor configured to sense current through, and/or voltage at, the antenna connection, and circuitry coupling an output of the antenna connection sensor to the output limiting controller, which is configured to affect the output amplitude regulator circuit to prevent the existence of currents or voltages in excess of design limits at the antenna connection.

A related embodiment is a method of making a monolithically integrated PA with protection from excessive output values caused by high Voltage Standing Wave Ratios (VSWRs) that are due to improper antenna impedance. The embodiment includes fabricating an RF PA on an integrated circuit chip to receive a transmit signal, and providing an output power limiting circuit for the PA. It also includes fabricating coupling, matching and filtering circuits on the same integrated circuit to condition a PA output signal having a PA output impedance to a different impedance desired for a connecting element that is connected to the integrated circuit to couple the conditioned signal to an antenna. The embodiment further includes disposing an antenna switch on the integrated circuit between the PA and the connecting element whereby the connecting element may be controllably coupled to either the conditioned signal from the PA, or to a receive amplifying circuit disposed on the integrated circuit. The embodiment includes providing a sensing circuit to sense a parameter of the signal delivered to the connecting element, and a PA control circuit to reduce power of the PA output signal in response to a value of the sensed parameter that is deemed excessive.

An embodiment of a further subcombination is a method of amplifying RF signals, and includes providing a plural-FET stack to control conduction between an output drive node and a reference node to effect a characteristic impedance at an operating frequency $f_0$. The embodiment further includes disposing, between the output drive node and the reference node, a shunt filter configured to dissipatively terminate a harmonic frequency of $f_0$. The shunt filter may include local minimum impedances at an even harmonic of $f_0$ and at a non-unity odd harmonic of $f_0$, and the local minimum impedances may be approximately equal to the characteristic impedance of the FET stack.

BRIEF DESCRIPTION OF THE DRAWINGS

Embodiments of the present invention will be more readily understood by reference to the following figures, in which like reference numbers and designations indicate like elements.

DETAILED DESCRIPTION

I. Power Amplifier Overview

Figure 1:
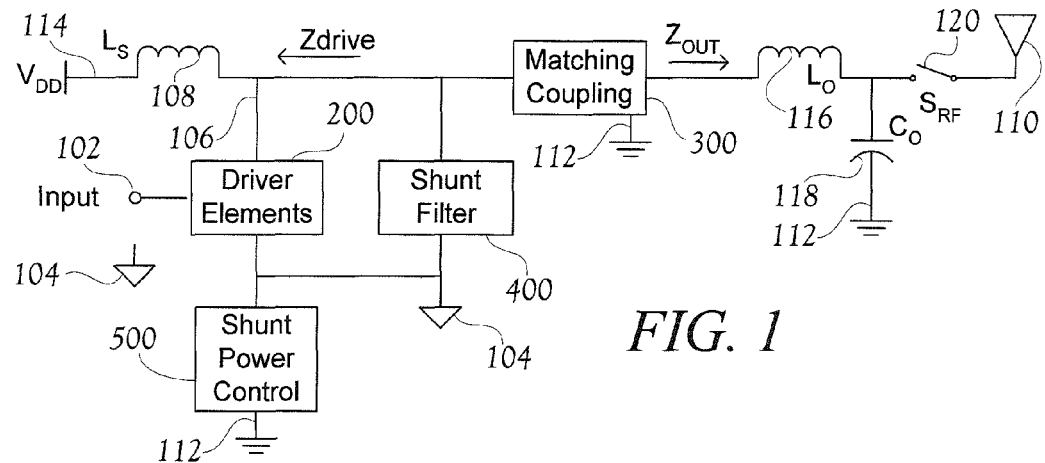
FIG. 1 is a block schematic diagram representative of some types of RF power amplifier (PA) circuitry.

FIG. 1 is a block diagram of an RF power amplifier (PA). The illustrated RF PA is quite general, in that varying the biasing of devices in a driver elements block 200, and/or varying details of the other blocks, will permit the RF PA illustrated in FIG. 1 to operate in any of amplifier classes A, B, C, E, F, or, as described further herein, as an iClass amplifier. FIGS. 2-5 each show an exemplary circuit to implement one of the blocks shown in FIG. 1.

An input 102 is provided to the PA with respect to a circuit reference, or common, 104. The input 102 generally comprises a properly biased signal at a center drive frequency, $f_0$. In response to the input 102, the driver elements block 200 controls conduction between a drive output node 106 and the circuit common 104. The driver elements block 200, in conjunction with current from $V_{DD}$ via an RF choke (RFC) $L_S$ 108, provides a signal having a particular impedance Zdrive. Zdrive may vary with frequency, but will refer to the drive impedance at the center operating frequency $f_0$, unless otherwise indicated. A shunt filter 400 may be coupled between the drive output node 106 and the circuit common 104. Numerous different filtering arrangements may be used, some examples of which are described subsequently herein.

An antenna 110 has a characteristic impedance $Z_{OUT}$, generally 50Ω (at the center frequency $f_0$ unless otherwise indicated). A block 300 is typically required to provide matching and coupling between the drive node 106 (at Zdrive) and the output at $Z_{OUT}$. Following the matching and coupling, an output filter section such as the combination of $L_O$ 116 and $C_O$ 118 may typically be disposed in the signal path before an RF switch, $S_{RF}$ 120, which appropriately couples the output to the antenna 110. Because the PA circuit is integrated on a semiconductor device, and the antenna 110 is typically external to the IC comprising the PA, the antenna 110 often operates with a different reference voltage, for example a chassis ground 112, which has a non-zero impedance to the circuit common 104. Accordingly, the matching-coupling block 300, as well as the filter section 116-118, has an output that is referenced to chassis ground 112.

Figure 12:
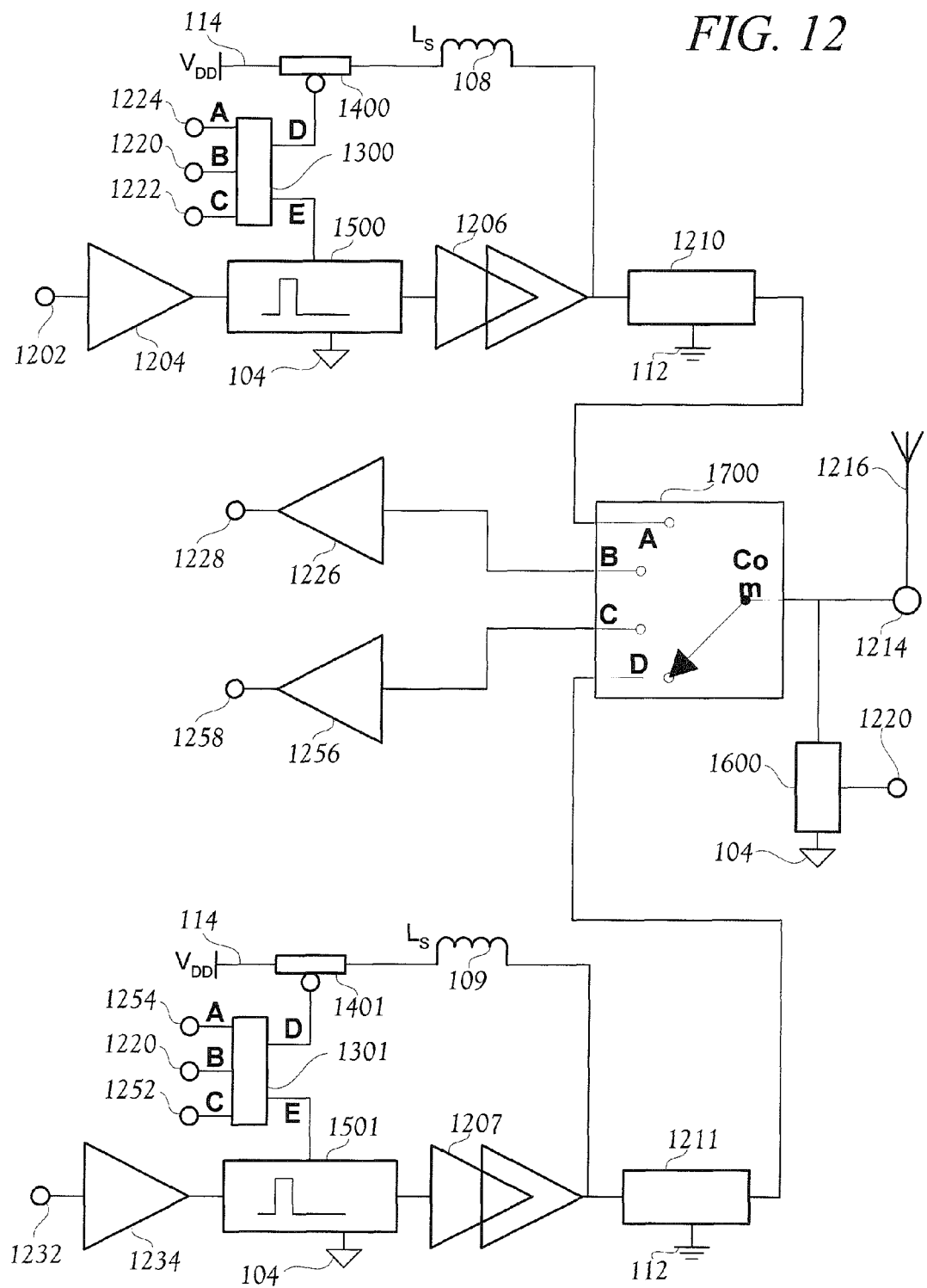
FIG. 12 is a simplified schematic diagram of an integrated dual-band RF transceiver.

Power control may optionally be provided. One example employs a shunt power control block 500, which may provide a voltage offset between chassis ground 112 and circuit common 104 to reduce the amplitude of signals received by the antenna 110. A series regulator circuit, such as items 1400-1401 in FIG. 12, is probably used more commonly.

The monolithically integrated RF PAs, RF front ends, and RF transceivers described herein may be fabricated to operate at relatively high frequencies of at least 900 MHz and/or 2.4 GHz, and at moderate power levels. These designs are useful for transceivers having transmit power maximums of at least 0.5 W, 1 W, or 1.5 W RMS of RF output power delivered to the antenna connection when it is properly coupled to a matched antenna.

II. Stacked-FET Drivers

Figure 2:
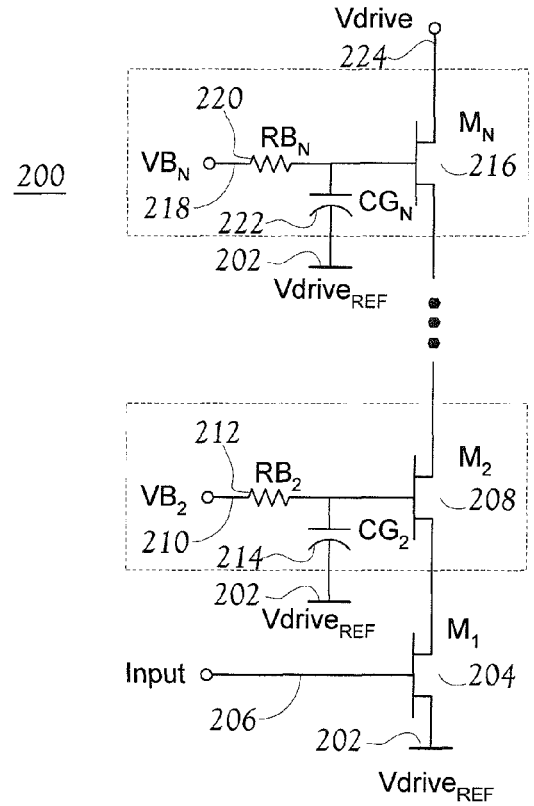
FIG. 2 is a generalized schematic diagram of a stacked-FET control circuit useable with a PA such as shown in FIG. 1.

FIG. 2 is a simplified schematic diagram of a stacked-FET circuit that may be used for the driver elements block 200 in the RF PA of FIG. 1, for controlling conduction between the drive output node 106 and the circuit common 104. The stack includes two or more FETs of the same polarity, i.e., all FETs in a stack are N-channel FETs, or all are P-channel FETs, or at least all FETs in a stack operate substantially similarly as each other.

The FET stack 200 of FIG. 2 is configured to control conduction between two nodes of an integrated circuit. A terminal Vdrive$_{REF}$ 202 is connected to one of the two nodes (e.g., circuit common 104 in FIG. 1), while a terminal Vdrive 224 is connected to the other node (e.g., Vdrive 106 in FIG. 1). For N-channel FETs (N-FETs) as illustrated in FIG. 2, Vdrive$_{REF}$ 202 will be connected to the more negative of the two nodes, for example to circuit common 104 in FIG. 1. The terminal Vdrive$_{REF}$ 202 is coupled to the source of a first FET of the stack 200, $M_1$ 204.

The FET stack 200 is controlled by means of an input signal, relative to terminal Vdrive$_{REF}$ 202, that is coupled to the gate of the signal-input FET $M_1$ 204 via an input terminal 206. The drain of $M_1$ 204 is coupled to the source of a second FET $M_2$ 208. The gate of $M_2$ 208 is provided with a bias voltage VB$_2$ 210 via a bias resistor RB$_2$ 212, and is decoupled to Vdrive$_{REF}$ 202 via CG$_2$ 214. In some embodiments, these two FETs are sufficient, when properly configured to divide applied voltages so as to avoid exceeding breakdown limits of either device, to serve as a conduction controlling circuit to handle increased voltages in a circuit such as a PA or a quad mixer.

In other embodiments, however, one or more additional FETs of the same polarity are connected in series with $M_1$ 204 and $M_2$ 208. Such additional FETs are represented in FIG. 2 by an Nth FET, $M_N$ 216. As for each additional FET of the stack, the source of $M_N$ 216 is coupled to the drain of the preceding FET of the stack, i.e., to the drain of FET $M_{N-1}$ (not shown, though if N=3 then $M_{N-1}$ is $M_2$ 208). The drain of the last FET of the stack, $M_N$ 216, is coupled to the output terminal Vdrive 224. Associated with each additional FET is a biasing voltage VB$_N$ 218, which is coupled to the gate of the FET via a bias impedance such as RB$_N$ 220, and a capacitor CG$_N$ 222 for coupling the gate to a voltage such that the FET is enslaved to conduction by the signal-input FET (here, $M_1$ 204). As shown, enslaving may be effected by coupling the gate of each additional FET to Vdrive$_{REF}$ 202.

FET stacks with at least nine FETs in series have been fabricated or simulated, and stacks of even more series FETs are certainly possible. Note that physical circuit couplings generally include finite capacitance, inductance, and resistance. For many purposes it is preferred that the FETs of the FET stack 200 be coupled with minimal impedance in series, drain to source. However, impedance may be intentionally added to such couplings. For example, it may be desirable to more closely control a drive impedance, and to dissipate heat in specific resistive series coupling elements rather than within the FETs themselves. It may also be desirable to add impedance between the FETs of the FET stack 200 so as to tune the conductance of the drive circuit.

II.A. FET Stack Biasing

In some embodiments, the FETs of a FET stack may all have substantially similar voltage withstand capabilities, such as breakdown voltages $V_{GS(br)}$, $V_{DS(br)}$, and $V_{DG(br)}$. For some integrated circuit fabrication processes, these values will be similar from FET to FET. Moreover, for some integrated circuit fabrication processes, the breakdown voltages $V_{GS(br)}$, $V_{DS(br)}$, and $V_{DG(br)}$ may be approximately equal to each other. Proper biasing will usefully ensure that none of these breakdown voltages is exceeded during normal operation of the circuit. In some embodiments, with proper biasing, voltage excursions between Vdrive$_{REF}$ 202 and Vdrive 224 may be permitted to approach a sum of $V_{DS}$ breakdown voltages for each constituent FET of the stack.

Biasing and coupling the FETs of a FET stack as described below may prevent voltages from exceeding any maximum allowable node to node voltage for any FET of the stack, even when the total voltage impressed from Vdrive 224 to Vdrive$_{REF}$ 202 is nearly equal to the sum of the maximum allowable $V_{DS}$ for the individual FETs of the stack. Unless otherwise noted, the maximum allowable voltage between any two nodes of the FETs (i.e., $V_{GS}$, $V_{DS}$, and $V_{DG}$) are generally assumed to be substantially equal, both for the various nodes of each FET, and from FET to FET, which accords with an exemplary semiconductor fabrication processes. However, the skilled person may readily extend the principles set forth below to encompass situations in which these maximum allowable voltages are not equal. Also, the calculations set forth below for N-channel FET stacks may be applied to P-channel FET stacks with appropriate inversions of polarities and references.

The impedance of the gate drive of $M_1$ may be selected according to ordinary transistor driving principles. In this exemplary embodiment, $V_{DS}$(max) is the same for all FETs of the stack. $V_{DS}$ for $M_1$ will therefore approximate (Vdrive-Vdrive$_{REF}$)/N. For each FET $M_{"M"}$, for X values from 2 to N, the effective value of each biasing resistor $RB_X$ is selected to control a time constant, $\tau_{GX}$, of the gate coupling. $\tau_{GX}$ is, approximately, the sum of effective capacitances of the gate coupling capacitor $CG_X$ plus the parasitic gate capacitances $C_{GPX}$, multiplied by the series impedance to a biasing voltage. Such series impedance is typically resistive, and will be designated $RB_{X(equiv)}$. It may be desirable for $\tau_{GX}$ to be much longer than the period $1/f_0$ of the center drive frequency, preferably 5-20 times as long. Thus, a good design center goal is:

$$RB_{X(equiv)}(C_{GX}+C_{GPX})=10/f_0 \qquad \text{(Eqn. 1)}.$$

With respect to Vdrive$_{REF}$, and for Vpeak that is the maximum expected value of Vdrive, one proper bias voltage value is simply a proportional portion of ½ of Vpeak:

$$VB_X=X(V\text{peak})/2N \qquad \text{(Eqn. 2)}$$

Thus, an example in which N=4 yields: $VB_2$=Vpeak/4, $VB_3$=3(Vpeak)/8, and $VB_4$=Vpeak/2.

II.B. FET Stack Gate Signal Coupling

Figure 7:
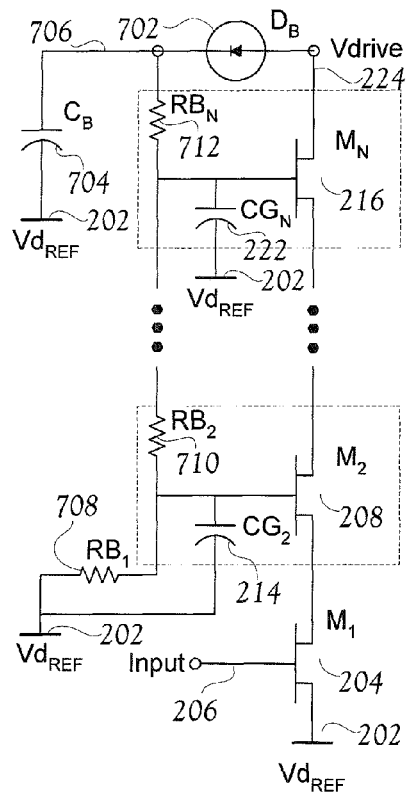
FIG. 7 is a schematic diagram illustrating alternative biasing features for a stacked-FET amplifying circuit.

In FIGS. 2 and 7, each gate node ($V_{GX}$) is coupled via the capacitor $C_{GX}$ to the reference voltage Vdrive$_{REF}$. Each gate node is also coupled to a DC bias voltage via a bias resistor. In this configuration, the effective drive voltage $V_{GSX}$ for each FET $M_X$ of the FET stack depends upon the voltage excursion of its source, $V_{SX}$, in conjunction with the impedance from the source to the gate node, and from the gate node to AC ground. These impedances are dominated by the gate-source capacitance and the coupling capacitor $CG_X$. Appropriate values for $CG_X$ may be determined as follows.

In the exemplary embodiment, the maximum voltage between each node pair of each FET is the same. The voltage excursions of the source of FET $M_2$ must therefore not exceed the maximum $V_{DS}$ for $M_1$. As such, the value of $CG_2$ is unlimited, and desirably large, for effecting AC grounding of the gate of $M_2$ and thereby providing the largest common-gate drive signal to $M_2$. $V_{GS}$ (max) will not be exceeded for M2 if the (DC) voltage on the gate is maintained within the range of the source voltage excursions. However, if (contrary to the assumptions above) the maximum $V_{DS1}$ exceeds the maximum $V_{GS2}$, then $CG_2$ values may need to be limited in a manner analogous to that described below for $CG_X$ for X from 2 to N.

The voltage excursion of the source of each FET $M_X$ with respect to Vdrive$_{REF}$, $\Delta V_{SX}$, will be equal to the drain voltage excursion for $M_{(X-1)}$, $\Delta V_{D(X-1)}$. This voltage, presuming equal division between the various FETs, is X(Vpeak−Vmin)/N. For Vmin=0, this is simply X(Vpeak)/N, and $\Delta V_{SX}$=(X−1)(Vpeak)/N.

The parasitic gate-source capacitance $C_{GS}$ of a FET increases, when $V_{GS}$=$V_{GS}$(on), to $C_{OX}$, the oxide capacitance. $C_{OX}$ for a particular FET $M_X$ is designated $C_{OXX}$. Because $CG_X$ is coupled to the reference voltage Vdrive$_{REF}$, the net $V_{GSX}$ will be capacitively divided between $CG_X$ and $C_{OXX}$. Thus, the gate-source excursion $\Delta V_{GSX}$=$(\Delta V_{SX})/(1+C_{OXX}/C_{GSX})$. Presuming equal maximums for $V_{GS}$ and $V_{DS}$, it is desired to limit $\Delta V_{GSX} \leq$Vpeak/N. Thus, substituting for $\Delta V_{GSX}$ and $\Delta V_{SX}$, Vpeak/N≥[(X−1)(Vpeak)/N]/[1+$C_{OXX}$/$C_{GSX}$]. Appropriate consolidation yields:

$$C_{GX} \leq C_{OXX}/(X-2) \qquad \text{(Eqn. 3)}$$

For X=2, $C_{GX} \leq$infinity, as expected. Also as expected, excessive values for $C_{GX}$ will tend to cause excessive gate-source voltage excursions ($\Delta V_{GSX}$). The inequality of Eqn. 3 may prevent excessive voltages between nodes of the devices. However, $C_{GX}$ may desirably be as large as is allowable so as to provide the largest allowable drive levels without exceeding breakdown voltages. Accordingly, the inequality of equation 3 may be treated as an approximate equality.

The result set forth above may not apply when it is desired to divide voltage differently between different FETs of the stack, or when maximum gate-source voltages differ from maximum drain-source voltages. However, the skilled person will have no difficulty determining desirable values for $C_{GX}$ for such various circumstances by calculations corresponding to those set forth above, with appropriately modified assumptions. Because the capacitors $C_{GX}$ must sustain voltages exceeding the bias voltage of the corresponding FET $M_X$, a metal-insulator-metal (MIM) capacitor is a good choice. Moreover, the capacitance of both (parasitic) oxide capacitors and MIM capacitors is a direct function of geometry. Certain fabrication variables, such as lithographic variables, therefore tend to have similar effects on both types of capacitances, leaving the ratio of such capacitances relatively immune to such variables.

Figure 3:
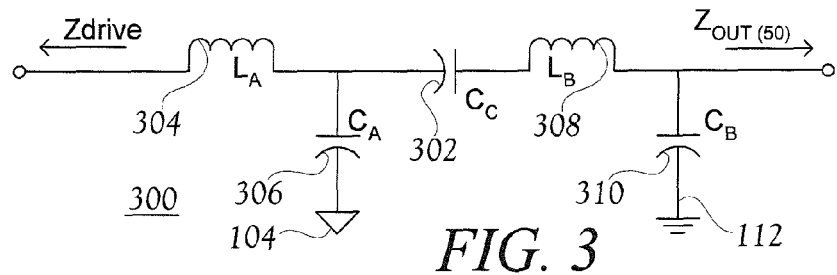
FIG. 3 is a simplified schematic diagram of an impedance matching and coupling bandpass filter useable in a PA such as shown in FIG. 1.

FIG. 3 shows an exemplary matching, coupling and filtering block 300, which, as shown in FIG. 1, may be disposed between the drive output node 106 and the antenna 110. The matching function transforms the typically 50Ω characteristic impedance of the antenna, $Z_{OUT}$, to the characteristic impedance of the drive output node 106 (both at the operating frequency $f_0$) in a manner well known to those of skill in the art. The coupling capacitor $C_C$ 302 blocks DC from the drive output node 106, and may be selected to have an impedance at $f_0$ that is less, and desirably much less, than the impedance to chassis ground 112, or to circuit common 104, from either side of the capacitor 302. The matching circuit 300 includes an "A" filter element comprising an inductor $L_A$ 304 and a capacitor $C_A$ 306, which may be fabricated as part of the integrated circuit. The matching circuit 300 also includes a "B" filter element comprising an inductor $L_B$ 308 and a capacitor $C_B$ 310 to chassis ground 112 (to which the antenna 110 of FIG. 1 is referenced). The coupling capacitor $C_C$ 302, as well as the inductor $L_B$ 308 and the capacitor $C_B$ 310 may be fabricated on an integrated circuit with the PA, but some of these devices are typically external to the integrated circuit.

III. Shunt Filtering

Figure 4:
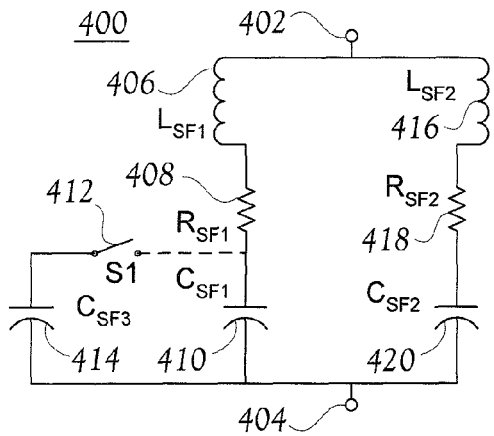
FIG. 4 is a simplified schematic diagram of a shunt filter useable in a PA such as shown in FIG. 1.

FIG. 4 illustrates a shunt filter 400 that may be employed in an iClass PA such as illustrated in FIG. 1. A node 402 of shunt filter 400 may be connected to the drive output node 106 of FIG. 1, and an opposite node 404 may be connected to circuit common 104 of FIG. 1. The shunt filter 400 may provide local minimum impedances at each of one or more particular frequencies. The minimum impedances may be matched to the drive circuit impedance (as established, for example, by the drive elements 200 and the RF choke $L_S$ 108). The shunt filter elements may be fabricated as part of the integrated circuit that includes the drive elements 200, thus reducing loop areas of currents passing through the elements of the shunt filter 400.

Figure 6:
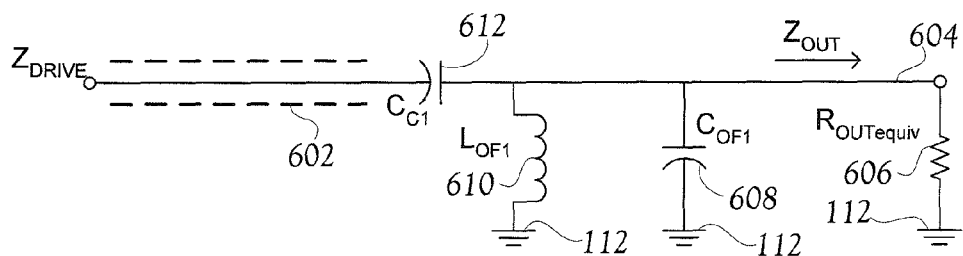
FIG. 6 is a simplified schematic diagram of an output filter for Class F operation of a PA such as shown in FIG. 1.

A shunt filter 400 for FIG. 1 may be a "transmission line filter" fabricated of reactive elements that are substantially distributed over an appropriate length, for example ¼ wavelength at $f_0$. Such a transmission line may be coupled to circuit common via a resonant circuit having a maximum impedance at $f_0$, such as a filter 600 as illustrated in FIG. 6 and described in more detail hereinbelow. Such a configuration for the shunt filter 400 provides local impedance minimums (approximately zero) at each even harmonic of $f_0$, and local maximum impedances at each odd harmonic of $f_0$. Stated more concisely, such a configuration may typically be said to reflect all odd harmonics, and to short all even harmonics, thus permitting operation as a Class F PA.

However, the shunt filter 400 illustrated in FIG. 4 for use in an iClass PA generally differs from such a transmission line filter. First, the shunt filter 400 may employ lumped, rather than distributed, elements. Consequently, local minimum impedances may occur at selected frequencies rather than at all odd, or at all even, harmonics of a resonant frequency (e.g., $f_0$). Second, the filter may employ series resistive elements to intentionally establish a non-zero value of local minimum impedance. It may be useful, for example, to control the local impedance minimum values so as to match an impedance of the drive circuit at the corresponding frequency (or, alternatively, at $f_0$). As a result of such differences between the circuit illustrated in FIG. 4 and a conventional transmission line filter, the magnitudes of currents in current loops may be reduced. Moreover, drive element power dissipation may be reduced at the frequencies corresponding to the selected minimum impedances.

In FIG. 4, a first shunt filter element includes $L_{SF1}$ 406, $R_{SF1}$ 408, and $C_{SF1}$ 410. These components establish a local minimum impedance at a particular frequency, with the impedance increasing for both higher and lower frequencies. A switch S1 412, in conjunction with an additional capacitor $C_{SF3}$ 414, represents an optional circuit for adjusting the frequency of the minimum impedance of the first filter element. As shown, the effective value of the series capacitor of the first filter element is increased when S1 is closed and $C_{SF3}$ is disposed in parallel with $C_{SF1}$ 410.

Of course, such frequency adjustability may be effected in numerous different manners. For example, S1 412 may be a FET for electronically switching the frequency. Additionally or alternatively, $C_{SF1}$ 410, as well as optional $C_{SF3}$ 414, may be varactors (with the corresponding addition of an appropriate control circuit for the DC voltages on such varactors). Moreover, the capacitor $C_{SF3}$ 414 may be disposed in series connection, rather than parallel connection, with $C_{SF1}$ 410, in which event the switch S1 may be configured to bypass the capacitor $C_{SF3}$ 414. Yet further, analogous techniques may be employed to vary inductance, rather than capacitance. For example, the switch S1 412 may selectably bypass a second inductive element, so as to vary the effective inductance of the first shunt filter element.

The second shunt filter element comprises an inductor $L_{SF2}$ 416, a resistive element $R_{SF2}$ 418, and a capacitor $C_{SF2}$ 420. The resonant frequency of the second filter element (or, indeed, of any further filter element) of the shunt filter 400 may be varied by similar techniques as outlined above with respect to the first filter element. It may be useful to have a minimum impedance that is substantially resistive, and/or that is non-zero. In one embodiment, the first and second filter elements are designed to provide local minimum impedances, at a second harmonic and a third harmonic of the operating frequency $f_0$ respectively, which are approximately equal to the drive circuit impedance. Though only two filter elements are illustrated, additional harmonics may desirably be treated with additional filter elements (not shown).

Figure 11:
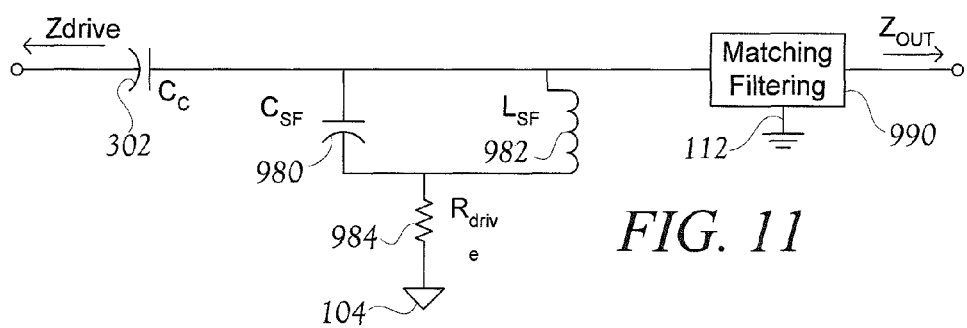
FIG. 11 is a simplified schematic diagram of a harmonic termination shunt filter useable in a PA such as shown in FIG. 1.

FIG. 11 is a schematic diagram of a circuit alternative for shunt filter 400 together with matching and coupling circuit 300. Zdrive and $Z_{OUT}$ of FIG. 11 are connected as shown in FIG. 1. $C_C$ 302 is substantially the same as in FIG. 3, providing DC isolation of the PA from the antenna output. The shunt filter includes a parallel resonant circuit primarily consisting of $C_{SF}$ 980 and $L_{SF}$ 982, which together function as a tank circuit that is resonant at $f_0$. All integer harmonic frequencies of $f_0$ are coupled through Rdrive 984, which is preferably selected to be approximately equal to the characteristic drive impedance of the PA switching circuit. Thereby, all harmonic frequencies of $f_0$ are terminated at the drive impedance. In some embodiments, alternative filtering, such as two parallel tank circuits each resonant near $f_0$, may be disposed in series above Rdrive 984. Dual tank circuits may be configured either to resonate at substantially identical frequencies, thereby increasing the impedance at $f_0$ and reducing power loss at $f_0$, or to resonate at slightly different frequencies, thereby broadening the range of frequencies at which the circuit has high impedance to ease manufacturing tolerances. Following the shunt filter, a matching and filtering network 990 may be as illustrated in FIG. 3, except for two differences: first, coupling capacitor $C_C$ 302 is omitted, and second, $C_A$ 306, being on the antenna side of coupling capacitor $C_C$ 302, is coupled to earth ground 112 rather than circuit common 104. The two common references may be made effectively identical in some integrated circuit layouts.

IV. PA Output Power Control

Figure 5:
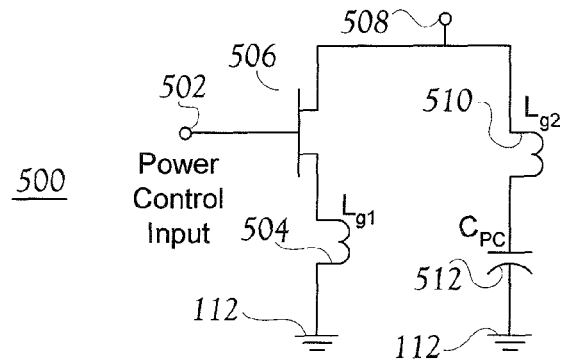
FIG. 5 is a simplified schematic diagram of a shunt power control circuit useable in a PA such as shown in FIG. 1.

FIG. 5 illustrates elements of one possible shunt power control circuit 500 for the PA of FIG. 1. A power control input 502 may establish a bias with respect to chassis ground 112. An inductive impedance Lg1 504 (which may reflect, for example, the inductance of a bond wire) is illustrated between chassis ground and the source of a power control FET $M_{PC}$ 506. A connection 508 may be coupled to circuit common 104 in FIG. 1. An inductance Lg2 510 typically exists in series with a bypass capacitor for the power control circuit, $C_{PC}$ 512. Assuming that the DC voltage $V_{DD}$ is with respect to chassis ground 112, the substantially DC voltage established across $C_{PC}$ 512 will reduce the effective supply voltage with respect to circuit common 104.

Other techniques may also be used to control the output power for a circuit as shown in FIG. 1, particularly when operated in a Class F configuration (rectangular wave input control). Such other techniques may be used either in addition to, or instead of, shunt power control as described above with respect to FIG. 5.

As a first example, referring also to FIG. 2, the bias voltages on the FETs $M_2$ 208 ... $M_N$ 216 may be adjusted. Efficiency will decrease, but power output will decrease more rapidly. As noted above, bias may generally be set such that $VB_X=X(Vpeak)/2N$. However, if VB2 is decreased well below the calculated value, the output voltage Vdrive (in iClass operation with harmonic termination) will also decline. Thus, for example, a circuit may be configured as shown in FIG. 7, except that the effective average voltage at the gate of $M_2$ 208 may be controllably reduced. This may be accomplished by making the value of $RB_1$ 708 variable (e.g., by means of a parallel FET). Alternatively, the value of $RB_1$ 708 may be reduced, and $RB_1$ 708 may be coupled to a variable voltage source rather than to reference 202. Reducing the bias voltage will cause corresponding reductions in drive output voltages. As described below in more detail, the self adjusting bias supply circuit of FIG. 7 will permit the bias on $RB_N$ to gradually follow the reductions in Vdrive(peak) that are caused by varying the bias voltage on the gate of $M_2$.

PA output power may also be controlled by varying the amplitude of the drive signal. The conduction impedance of the drive elements will be higher when driven with a lower amplitude rectangular wave, resulting in a smaller effective drive voltage. The efficiency of this technique is typically comparable to the efficiency of varying bias voltages.

As discussed below with respect to FIGS. 12 and 14, a series regulator circuit may be used to control PA output power either alone, or in conjunction with one or more other power control techniques.

V. Alternative PA Embodiments

FIG. 6 is a simplified schematic diagram of a filter circuit 600 that may be employed in a manner similar to the shunt filter 400 in FIG. 1 to form a versatile PA architecture. The drive output node 106 of FIG. 1 may be coupled to a Zdrive node as an input to 600. The Zdrive node may be coupled via a ¼ wavelength transmission line 602 and a coupling capacitor $C_{C1}$ 612 to an output filter section. The output filter section may comprise a parallel combination of $L_{OF1}$ 610 and $C_{OF1}$ 608, resonant at the operating frequency $f_0$. Unlike some embodiments of shunt filters 400, the output filter section of FIG. 6 is typically not part of the PA integrated circuit, and thus is referenced to chassis ground 112 rather than to circuit common. The impedance of this bandpass filter to ground 112 falls rapidly as the frequency deviates from $f_0$, and, therefore, the harmonics of the operating frequency are effectively shorted to ground at the output filter end of the transmission line 602. The standing waves of the properly tuned ¼ wavelength transmission line therefore provide a high impedance at each odd harmonic, and a low impedance at each even harmonic, as seen at the Zdrive node. A $Z_{OUT}$ node 604 may be coupled to a further output filter section 116-118, an RF switch 120, and antenna 110 as shown in FIG. 1. A matching network (not shown) may also be required, similar to that illustrated in FIG. 3 with the coupling capacitor $C_C$ 302 omitted. Such further filtering and matching circuits, or a transmission line coupled thereto, will ideally appear to the filter circuit 600 as a resistive impedance $R_{OUTequiv}$ 606 at the operating frequency $f_0$.

Modified as described above, the circuit of FIG. 1 may be operated as an RF PA of Class A, Class B, Class C, Class E or Class F. For Class A operation, the input signal 102 is sinusoidal and does not cause the current through $M_1$ 202 of FIG. 2 to go to zero. For Class B operation, the input signal 102 is sinusoidal but $M_1$ 202 conducts only 50% of the time (conduction angle 180 degrees). Operation may be Class C, with a conduction angle less than 180 degrees, which yields some efficiency improvement as compared to the Class B operation. In each case the FETs $M_2$ to $M_N$ are enslaved to $M_1$, and the FET stack of FIG. 2 functions substantially as a single device. The circuit of FIG. 1 may also be operated as an iClass PA in a configuration related to Class F but having dissipative termination for harmonics of the operating frequency.

The circuit of FIG. 1, configured as described immediately above, may also be operated as a Class F RF PA. For Class F operation the input signal is preferably a square wave having a duty cycle that causes the circuit 200 to conduct at precisely a 50% duty cycle. The output voltages resulting from Class F operation generally increase substantially when the conduction duty cycle deviates from 50%. Unfortunately, ordinary manufacturing component variations tend to cause the duty cycle to deviate from 50%, and consequently the circuit may not readily be able to safely and reliably utilize the full voltage withstand capability of the drive element(s).

VI. Alternative Bias and Slaving

Embodiments of a FET stack, as described herein, may include a signal-input FET that receives a drive signal coupled to its gate with respect to a reference voltage that is coupled to its source. The remaining FETs of the stack may be enslaved to the signal-input FET, such that they conduct under the control of conduction in the signal-input FET. The method by which the other FETs of a FET stack are enslaved to the signal-input FET must cooperate with the method employed to properly bias the FETs. Accordingly, enslavement and biasing are addressed together.

In RF PAs generally according to FIG. 1, the peak voltage of drive output node 106 (with respect to circuit common 104) will often exceed twice the available supply voltage $V_{DD}$ 114. As such, bias voltages as required for the driver elements of FIG. 2 may not be readily available. This lack may be remedied by recourse, for example, to a charge pump. A charge pump that is preferred from the standpoint of minimal noise generation is described in commonly owned and copending U.S. patent application Ser. No. 10/658,154, "Low-Noise Charge Pump Method and Apparatus," which is hereby incorporated in its entirety by reference. As described therein in detail, a low-current voltage source may be readily established at any desired voltage. Such voltage source may be provided, as needed, to any of the bias voltage inputs $VB_2$ 210 to $VB_N$ 218 in FIG. 2.

FIG. 7 illustrates a self-adjusting bias supply that may be employed to bias the FETs of a FET stack. As in FIG. 2, a signal input 206 is coupled to the gate of a signal-input FET $M_1$ 204. The source of the FET $M_1$ 204 is coupled to $Vd_{REF}$ 202, while its drain is coupled in series with each subsequent FET of the stack, including $M_2$ 208 ... $M_N$ 216. The drain of the last FET of the stack, $M_N$ 216, is coupled to Vdrive 224. To provide a bias voltage that reflects Vdrive 224, a diode (or equivalent) $D_B$ 702 charges a bias supply capacitor $C_B$ 704 to Vbias 706. Vbias will charge to approximately Vpeak, the peak value of Vdrive 224 with respect to $Vd_{REF}$ 202. If a time constant associated with $C_B$ 704 is sufficiently long, then Vbias will remain substantially at this value. The time constant is the product of the capacitance of $C_B$ 704 multiplied by the resistance, to $Vd_{REF}$ 202, of the resistive voltage divider having N resistors including $RB_1$ 708, $RB_2$ 710, ..., and $RB_N$ 712. The total resistance of this voltage divider may be designated $R_B$sum.

With respect to Equations 1, 2 and 3 that are set forth above, "X" represents the position of the particular FET in a stack, and N represents the total number of FETs in such stack. Assuming that all FETs are approximately identical, it may be seen that:

$$RB_1 = RB_2 = \ldots = RB_{(N-1)} \quad \text{(Eqn. 4), and, accordingly,}$$

$$RB_N = (N-1)RB_1 \quad \text{(Eqn. 5).}$$

In view of equations 1-5, it may be seen that, for the last FET of the stack (X=N), $$(C_{GX} + C_{OXX}) = C_{OX}(N-1)/(N-2) \quad \text{(Eqn. 6),}$$

$$RB_{X(equiv)} = RB_1(N-1)/2 \quad \text{(Eqn. 7), and}$$

$$RB_1 \geq 20(N-2)/[C_{OX}(N-1)^2 f_0] \quad \text{(Eqn. 8)}$$

Thus, for N=3, $RB_1 \geq 5/C_{OX}/f_0$, and $RB_1$ declines monotonically as N increases (for given values of $C_{OX}$ & $f_0$).

The total resistance $R_B$sum of the resistive divider described above, in which the lower (N−1) resistors are $RB_1$ and the top (or Nth) resistor is the sum of the lower resistors, is simply $2(N-1)RB_1$. The ripple on Vbias 706 may be acceptably low if the time constant $C_B(R_B\text{sum}) \geq 10/f_0$. Coupling that criteria with Eqn. 8 yields $$C_B \geq C_{OX}(N-1)/(N-2)/4 \quad \text{(Eqn. 9).}$$

Thus, for N=3, $C_B \geq C_{OX}/2$. As N increases, smaller values of $C_B$ (with respect to $C_{OX}$) will be required to achieve the same ripple voltage.

A significant ripple voltage is not necessarily a problem, and $C_B$ may desirably assume even smaller values if rapid self-adjustment response is required. Indeed, in view of the filtering effected by each gate bypass capacitor $CG_X$ in conjunction with $RB_{X(equiv)}$, an average value is the main consideration for Vbias. However, if the average value of Vbias is permitted to decline significantly below Vpeak for any reason, including the presence of substantial ripple on $C_B$, the skilled person will understand that the resistive divider values should be adjusted accordingly.

Figure 8:
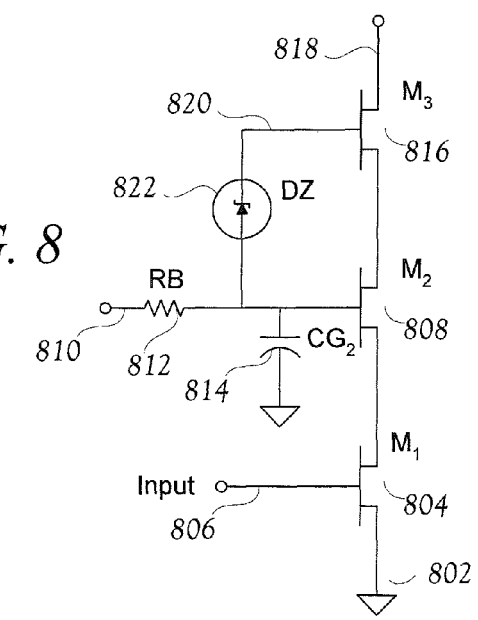
FIG. 8 is a simplified schematic diagram illustrating an alternative method of biasing FETs of a FET stack.

FIG. 8 illustrates an alternative for providing both bias and gate coupling for FETs $M_3$ and above (X≥3). A reference 802 is coupled to the source of a signal-input FET $M_1$ 804, the gate of which is coupled to an input signal 806. The drain of $M_1$ 804 is coupled to the source of a second FET $M_2$ 808. A bias voltage is applied to a bias input 810, which is coupled via a bias resistance RB 812 to the gate of $M_2$ 808, and to a relatively large capacitance $CG_2$ 814. The drain of $M_2$ 808 is coupled to the source of a third FET of the stack, $M_3$ 816. The drain of $M_3$ 816 may be coupled to a further FET stage, if present. However, the drain of the FET of the last stage, $M_3$ 816 as shown in FIG. 8, is coupled to an output node Vdrive 818.

The gate 820 of FET $M_3$ 816 may be coupled to the base of the preceding stage FET $M_2$ 808 via a zener diode DZ 822. DZ 822 may have a conduction threshold knee at approximately the maximum desired value for $V_{DS}$ of $M_3$ 816. (A circuit operating similarly to a zener diode may be used instead of DZ 822.) Additional FET stages designated by subscripts "Y" may be added. For such additional stages, corresponding additional zener diodes may be employed in like manner as DZ 822, i.e., anode to the gate of additional FET $M_Y$, and cathode to the gate of $M_{(Y-1)}$.

VI.A. Alternative Stacked FET Switch Configurations and Extensions

The FET stacks described above with respect to FIGS. 1-8 employ N-channel FETs (N-FETs). P-channel FET (P-FET) stacks may be fabricated analogously, by reversing the polarity of each voltage and polarized component associated with the stack. The P-FET stack reference voltage will generally be coupled to the source of a first, signal-input FET $M_{P1}$. Such inverted circuits will operate according to substantially the same principles as the N-FET stack circuits described above. For example, Vdrive 818 may be negative with respect to reference 802 in FIG. 8 if all FETs are P-channel, and the zener DZ 822 connection is reversed (anode and cathode exchanged).

Figure 9:
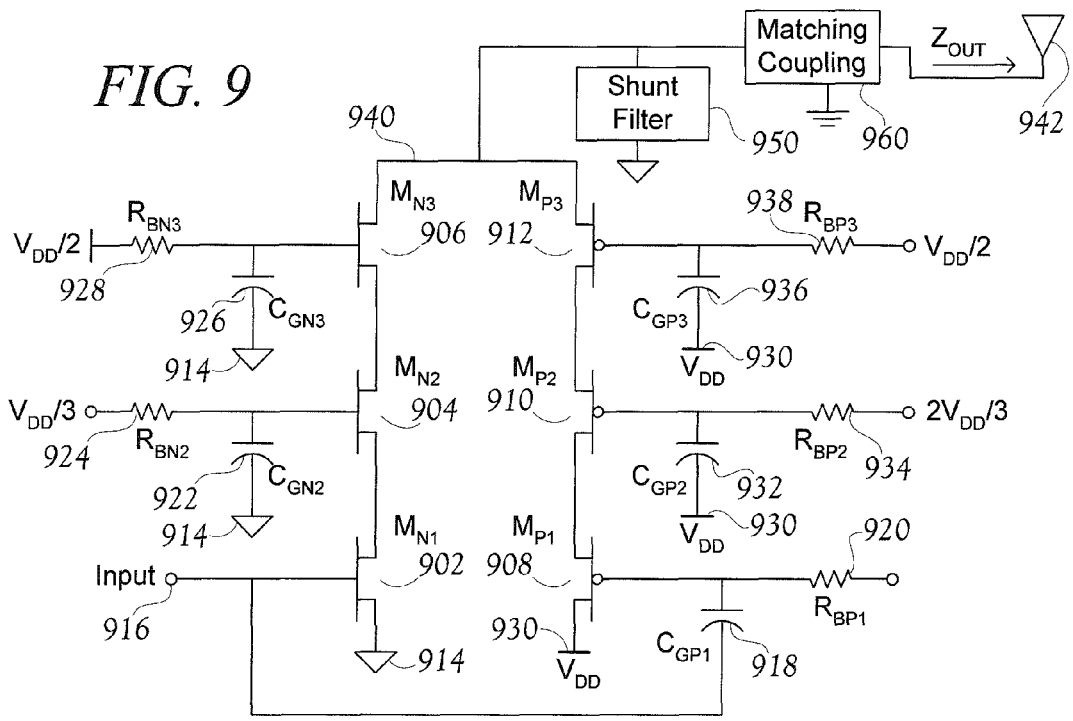
FIG. 9 is a simplified schematic diagram of a Class D PA employing complementary stacked-FET drive elements.

FIG. 9 is an exemplary circuit that employs both an N-channel FET stack comprising N-channel FETs $M_{N1}$ 902, $M_{N2}$ 904 and $M_{N3}$ 906, plus a P-channel FET stack comprising P-channel FETs $M_{P1}$ 908, $M_{P2}$ 910 and $M_{P3}$ 912. For Class D operation, an input square wave may be provided with respect to common 914 at the input 916 to the N-FET stack, and coupled to an input for the P-FET stack on the gate of $M_{P3}$ 912 via a capacitor $C_{GP1}$ 918. A bias voltage, set for example to one half of $V_{GS}$(on) below the P-FET stack reference $V_{DD}$ 930, may be provided for $M_{P1}$ 908 via a bias resistor $R_{BP1}$ 920. Alternatively, the capacitor $C_{GP1}$ 918 and the bias resistor $R_{BP1}$ 920 may be deleted, and the input 916 and the gate of $M_{P1}$ 908 may each be driven, instead, by means of an appropriate non-overlap clock generator (not shown).

Control of the N-FETs $M_{N2}$ 904 and $M_{N3}$ 906 is substantially as described with respect to FIG. 2 (for N=3). The gate of $M_{N2}$ 904 is coupled to common (i.e., decoupled) via a capacitor $C_{GN2}$ 922 having a relatively large value, and may be biased to about ($V_{DD}/3$) volts via a bias resistor $R_{BN2}$ 924. The gate of $M_{N3}$ 906 is decoupled to common via a capacitor $C_{GN3}$ 926 having a value calculated as described with respect to FIG. 2, and may be biased to ($V_{DD}/2$) volts via a bias resistor $R_{BN3}$ 928.

The P-FET stack is controlled analogously as the N-FET stack. The polarities of the bias voltages are inverted, and referenced to the "reference voltage" of the P-FET stack, which in this case is $V_{DD}$ 930. For purposes of capacitively decoupling the P-FET gates, the fact that the P-FET reference voltage is $V_{DD}$ 930 is likely to make little difference, because $V_{DD}$ is typically closely coupled to the circuit common 914 that is the reference for the N-FETs. Therefore, decoupling capacitors 932 and 936 may alternatively be connected to circuit common 914. As shown, however, the gate of $M_{P2}$ 910 is decoupled to $V_{DD}$ via a relatively large capacitor $C_{GP2}$ 932, and biased to about ⅔ $V_{DD}$ via a bias resistor $R_{BP2}$ 934. The gate of $M_{P3}$ 912 is decoupled to $V_{DD}$ via a capacitor $C_{GP3}$ 936. The value of $C_{GP3}$ 936 may be calculated as described with respect to FIG. 2 for X=3 and N=3. The gate of $M_{P3}$ 912 is biased to about $V_{DD}/2$ via a bias resistor $R_{BP3}$ 938.

An output voltage Vdrive 940 will be driven between common and $V_{DD}$, according to whether the N-FET stack is conducting or the P-FET stack is conducting. The output Vdrive 940 may be shunt filtered by a shunt filter 950, and may be processed by a matching and coupling circuit 960, as described below in more detail with respect to FIG. 10. From the matching and coupling circuit 960 the signal may proceed to an antenna 942, typically via a transmission line, one or more further filter sections, and an RF switch (not shown).

Figure 10:
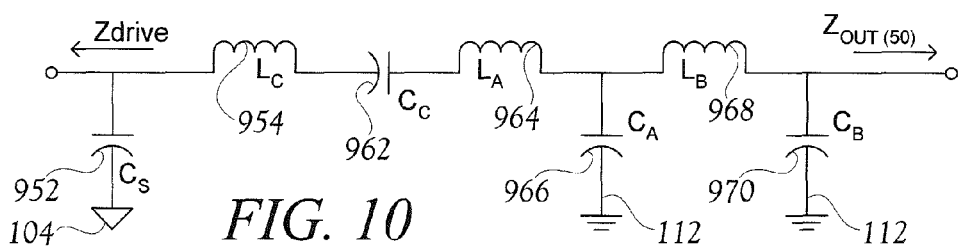
FIG. 10 is a schematic diagram of exemplary output filtering for a Class D PA such as represented in FIG. 9.

The shunt filter 950 of FIG. 9 may be similar to that shown in FIG. 4, or that shown in FIG. 6. The matching and coupling circuit 960 of FIG. 9 may, for example, be similar to that shown in FIG. 3. However, FIG. 10 illustrates filtering that may be employed for both blocks 950 and 960 in the circuit of FIG. 9. The capacitor $C_S$ 952 may serve as the shunt filter 950. The remainder of FIG. 10 may function as the matching and coupling circuit 960 of FIG. 9. An inductor $L_C$ 954 may comprise a physical coupling connection. A coupling capacitor $C_C$ 962 serves to block DC. $L_A$ 964, $C_A$ 966, $L_B$ 968 and $C_B$ 970 may be configured for matching to the output impedance $Z_{OUT}$, which is typically 50 ohms.

VII. Monolithically Integrated, Medium Power Dual-Band RF Transceiver

An RF transceiver, such as the dual-band RF transceiver represented in FIG. 12, typically includes a received-signal amplifier such as items 1226 or 1256 of FIG. 12. Such a received-signal amplifier is typically a low noise amplifier (LNA), and is employed to condition signals received from the antenna. An RF front end may be considered to be an RF transceiver circuit that does not necessarily include an LNA.

In most RF transceivers, discrete integrated circuits must be combined in a module to fabricate a complete RF front-end section. Typically, at least the antenna switch will be fabricated on a different, separate integrated circuit (IC) from the PA, and often many more discrete integrated circuits must be connected via off-chip wiring to fabricate an RF front end module. Each such discrete integrated circuit must be defined by particular performance requirements which ensure that the module functions properly even when the discrete integrated circuits which it comprises are from different lots, or have been designed and manufactured differently from other integrated circuits that perform the same tasks. Such performance requirements, which are thus developed to achieve mix-and-match flexibility and reliability, may well exact a cost for the discrete ICs that are combined in these devices.

PAs in multiple-IC transceiver modules typically produce a signal of substantial power on demand. An antenna switch unit couples an antenna (more precisely, an antenna connection) to either a transmit signal matched to the expected antenna impedance (e.g., 50 ohms), or to a receive signal input. However, damage to the antenna connection or the antenna may cause the impedance reflected to the antenna connection point from the antenna connecting line to vary drastically from its expected value. In such event, a large voltage standing wave (VSW) may be caused by the resulting mismatch between that reflected impedance, and the expected value to which the transmit signal has been matched. Voltage excursions much larger than those expected during normal operation may be generated as a consequence of such mismatch-induced VSWs. Voltage withstand requirements for antenna switches are typically set much higher than normal peak operating voltages to avoid damage under such mismatch conditions.

The IC area occupied by switching devices (such as FETs) in a power-switching circuit, such as an antenna switch, may increase as the square of the voltage they are capable of withstanding. Thus, halving the required withstand voltage may reduce the switch device area to one fourth. Moreover, because these devices dominate the IC area used by an antenna switching circuit, a very substantial saving in IC area (and thus in manufacturing cost) may be realized by reducing their required withstand voltage. Such reduction may not be practical when discrete ICs must be coupled to fabricate an entire transceiver. However, a single IC that includes all devices from a PA, through an antenna switch, and to an antenna connection, may take advantage of reliable internal coupling and close device matching to protect against high mismatch-induced VSWs. Due to these advantages of integration, substantial savings in device area can be realized as compared to combining discrete ICs to fabricate a comparably-performing transceiver.

FIG. 12 is a simplified block schematic diagram of the primary RF sections of a dual-band transceiver that is configured to benefit from such internal protection. A low-level signal at a first operating frequency $f_{O1}$ is coupled to an input node 1202 from a source which may (but need not) be on the same IC chip. The signal is amplified through any suitable amplifier, as indicated by amplifier 1204. The signal produced by the amplifier 1204 may deviate considerably from a preferred rectangular shape if a pulse adjustment circuit 1500 is provided to improve rectangularity, and preferably to also adjust the duty cycle, of the waveform that is ultimately coupled into a power amplifier (PA) 1206.

The output of the pulse adjustment circuit 1500 is the input to the PA 1206, which draws power from a supply $V_{DD}$ 114 via supply conditioning elements, including a series regulator 1400 and an RF choke (RFC) $L_S$ 108, to generate a PA output signal. The PA output signal has a characteristic impedance resulting from the input signal, the PA circuit elements, and the supply conditioning elements, and generally differs from the impedance expected at the antenna node 1214. A coupling, matching and filtering network may be needed, for example as represented by a block 1210. Such a network may couple the PA output signal to the antenna switch while blocking DC current, and may transform the PA output impedance to the desired antenna node impedance (e.g., 50 ohms). It may also filter undesirable signal components, such as harmonics of $f_{O1}$, from the PA output signal before coupling it to an "A" input of an antenna switch 1700. If separate grounds are maintained as a matter of design preference, then the output of the coupling, matching and filtering block 1210 may be referenced to a ground reference 112, which may be distinguishable from a circuit common reference 104 used elsewhere in the circuit. The antenna switch 1700 selectably couples the signal to the antenna node 1214, from whence it may be coupled, for example by transmission line, to an antenna that may be separated from the IC chip.

Availability of the antenna connection of the antenna switch on the same IC chip as the PA (and all intervening circuitry) provides an opportunity to reliably limit the maximum electrical stress that must be endured by the antenna switch circuitry, by the PA, or by coupling, matching or filtering elements. An output sensor 1600 may be coupled to the antenna node 1214, sensing the electrical stress and providing a signal that will cause the PA to reduce its output if the electrical stresses are excessive. To this end, the output 1220 of output sensor 1600 is coupled to an input "B" of a PA control block 1300. An "A" input 1224 to the PA control block 1300 may receive an amplitude control signal to adjust the envelope amplitude of the PA output signal. This input may also be used to restrict, or even to terminate, output from the PA. Both the "A" and "B" inputs may affect an output "D" that is coupled from the PA control block 1300 to the series regulator block 1400. A "C" input 1222 to the PA control block 1300 may be provided with information, or a signal, that controls an "E" output from the block 1300. The "E" output may be coupled to the pulse adjustment circuit 1500 to control the duty cycle of the rectangular wave that is input to the PA 1206. Duty cycle control may, for example, provide another means to reduce the power level of the PA output signal. The signal path from 1202 may be tuned for a first band of operating frequencies, which include $f_{O1}$.

The antenna switch 1700 may selectably decouple the antenna node 1214 from the first-band transmit signal on input "A," and couple the antenna node instead to output "B" so as to deliver a signal received from the antenna to a receive preamplifier 1226 for a first receive band. The receive preamplifier 1226 (as well as 1256) is preferably a low noise amplifier (LNA). LNAs are not necessarily included in integrated front ends as described herein, though they typically are included in complete transceiver circuits. The output from receive preamplifier 1226, if present, may be delivered to further first receive band circuitry either on or off the same IC chip. The antenna switch 1700 may similarly selectably couple the antenna node 1214 to a second receive band preamplifier 1256 to amplify a signal from the antenna to a second receive band output node 1258. That output may be delivered to further second receive band circuitry either on or off the IC chip.

Similarly as described above with respect to the first transmit band circuitry, a transmit signal at a second operating frequency $f_{O2}$ in a second operating frequency band may be provided to an input 1232, and amplified by an amplifier 1234. The duty cycle and waveform of the signal output from the amplifier 1234 may be conditioned by a pulse adjustment 1501 under control of a PA control block 1301, and then delivered as an input to a second band PA 1207. The second band PA 1207 will generate a second-band PA output signal using power that is provided from $V_{DD}$ 114, as limited by a series regulator 1401 under control of the PA control block 1301, via an RF choke 109. The second-band PA output will have a characteristic impedance, and will be coupled to the "D" input of the antenna switch 1700 via a block 1211 that couples the signal, matches the PA output and antenna node impedances, and filters the output signal. The antenna switch 1700 may be controlled to couple the "D" input to the antenna node 1214, from whence the signal will be delivered to the antenna 1216. The output 1220 of the output sensor 1600 may be coupled also to a "B" input to the second-band PA control block 1301, whereby excess output voltage will cause the second-band PA output signal to be reduced to safe levels. The second-band PA control block 1301 may also accept an envelope-control signal at an "A" input 1254, as well as a duty-cycle control signal at a "C" input 1252.

Figure 13:
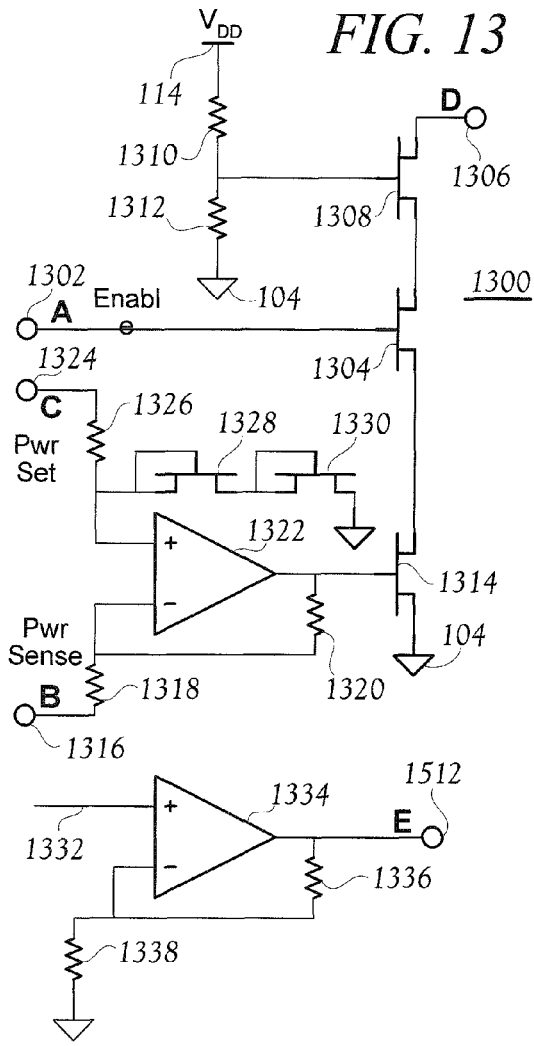
FIG. 13 is a schematic diagram of an exemplary PA output power supervisor for directing output power levels in the transceiver of FIG. 12.

Though not shown, control circuitry is preferably enabled only when the associated PA is active. Exemplary circuitry for a PA control block, such as 1300 or 1301, is shown in FIG. 13. Exemplary circuitry for a series regulator, such as 1400 or 1401, is shown in FIG. 14. Exemplary circuitry for a pulse adjustment circuit, such as 1500 or 1501, is shown in FIG. 15. The PAs 1206 or 1207 may be fabricated as described for Driver Elements 200 of FIG. 1, together with a shunt filter, such as block 400 of FIG. 1 or the appropriate elements of FIG. 11. Coupling, matching and filtering circuits 1210 and 1211 may be fabricated as described above for FIG. 3, or FIG. 10, or in any other manner to obtain similar coupling, matching and filtering effects. Note that if a circuit as shown in FIG. 11 is to be employed, the coupling capacitor 302 will be disposed before the shunt filter, and the matching and filtering will be provided subsequently, as in block 990.

FIG. 13 illustrates exemplary circuitry for a PA control block 1300. An enable input "A" 1302 may be coupled directly to a FET 1304, such that if input 1302 is approximately ground potential, an output "D" 1306 can draw no current. Conduction into the output "D" 1306 may control the PA output power via a series regulator, such as shown in FIG. 14, such that when output 1306 conducts no current, no current will be provided to the PA, reducing output power to zero as discussed below with respect to FIG. 14. FET 1308 is biased by resistors 1310 and 1312, which may have equal values, a nominal value such as 30-50 kΩ being selected for engineering convenience. This configuration protects low-voltage FETs, ensuring that $V_{GD}$, $V_{GS}$, and $V_{DS}$ for all of FETs 1304, 1308 and 1314 do not significantly exceed $V_{DD}/2$.

A power sense input "B" 1316 may be coupled to resistor 1318. Resistor 1318 may be about 30-50 kΩ, and reasonably equal to a resistor 1320 to establish unity gain for op amp 1322. A power set input "C" 1324 may be set, in one embodiment, from 0V to 2*Vth (FET threshold voltage), where Vth may be 0.4 to 0.7V, nominally about 0.5V, and is consistent within the circuit. The noninverting input of op amp 1322 is prevented from exceeding this voltage range by means of a resistor 1326 (e.g., 30-50 kΩ) together with diode-connected FETs 1328 and 1330, thus limiting the maximum power that may be selected. The skilled person may adjust circuit values, and circuit design, so as to achieve a selectable output power up to a fixed circuit design maximum. In particular, one or both diode-connected FETs 1328 and 1330 may be replaced by a network that includes a bandgap reference, for example to increase accuracy of power settings and output voltage limits. Many other techniques may be employed to achieve similar effects. When power sense input "B" 1316 exceeds a value established by the power set input voltage, FET 1314 will cease conducting, precluding conduction into output "D" 1306.

The PA control block 1300 also provides an output "E" 1512 to control the duty cycle adjustment effected by the pulse adjustment circuit 1500 of FIG. 12. A reference voltage, which may be adjustable according to factors such as fabrication process parameters, is provided at an input 1332. This voltage is doubled by an op amp 1334 under control of equal-valued resistors 1316 and 1318. Of course, in other embodiments the gain of circuitry such as shown in FIG. 13 will likely be different, and resistors setting such gains, for example 1316 and 1318, will accordingly differ in value. By reducing the duty cycle somewhat, the PA output power may be correspondingly reduced, and by reducing it to zero the PA output may be suppressed entirely. A reference voltage provided to an input 1322 of an amplifier 1320, the gain of which may be controlled in the usual manner by resistors 1324 and 1326, may serve to establish the voltage at output "E" 1512 to control duty cycle of the output of block 1500.

Figure 14:
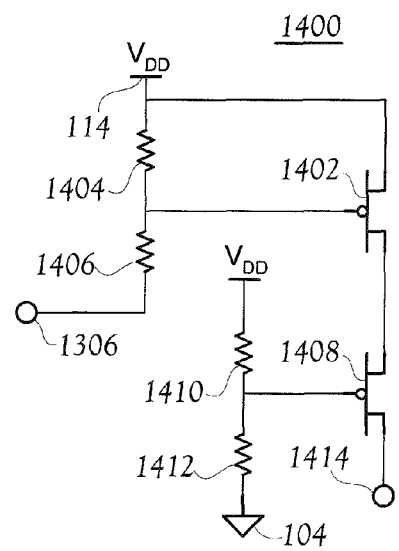
FIG. 14 is a schematic diagram of an exemplary series output regulator for the transceiver of FIG. 12.
Figure 15:
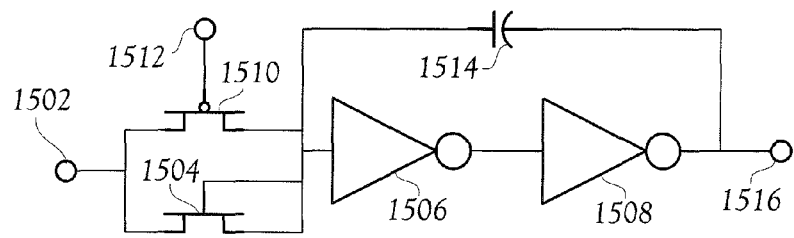
FIG. 15 is a schematic diagram of an exemplary pulse width controller for the transceiver of FIG. 12.

FIG. 14 illustrates an exemplary series regulator circuit 1400 for limiting the effective voltage provided to the PA, and thus limiting the PA output amplitude. The voltage provided to input 1306, as compared to $V_{DD}$, is divided via resistors 1406 and 1404 to control a P-channel FET 1402 and also protect FET 1402 from excessive voltage between any two nodes. A P-channel FET 1408 is biased by resistors 1410 and 1412 so as to divide maximum voltages that are generated between $V_{DD}$ and an output 1414, somewhat equally between FETs 1402 and 1408. The output 1414 provides power to the PA via an RF choke. The FETs 1402 and 1408 may, for example, have $V_{GS}$ threshold voltages of between –0.4V and –0.7V. Resistors 1404, 1406, 1410 and 1412 may all be substantially equal, with a magnitude selected for engineering convenience to be for example, 30-50 kΩ. These exemplary values and relative values may be varied for engineering convenience.

FIG. 15 is a schematic representation of an exemplary signal conditioning circuit 1500. An input signal may be provided on an input node 1502, and coupled via a diode-connected FET 1504 to the input of an inverter 1506. When the input signal voltage, plus the $V_{DS}$ threshold of FET 1504, is less than the threshold of the inverter 1506, the output of inverter 1508 will be low. However, when the voltage of the input signal rises above this value, the FET 1504 will cease conducting. Thereafter, even if the voltage of input 1502 is quite high (e.g., $V_{DD}$), current from the input will be limited by P-channel FET 1510 under control of an input voltage 1512. Such current through the FET 1510 must charge a capacitor 1514 (which may be a metal-insulator-metal or "MIM" capacitor of about 0.025 to 0.05 pF) until the input to inverter 1506 rises above its switching threshold. At that point the inverters 1506 and 1508 will change state rapidly due to positive feedback via the capacitor 1514, providing square edges at an output node 1516, rise and fall times being limited primarily by delays through the inverters 1506 and 1508. If the signal at the input 1502 is a roughly rectangular wave of about 50% duty cycle, as in a preferred embodiment, the voltage at the control input 1512 may be adjusted such that the output duty cycle is reduced from 50% to an arbitrarily lower value that may reach zero. The input signal may be configured to have a duty cycle exceeding 50% if a wider range of output duty cycle is desired.

Figure 16:
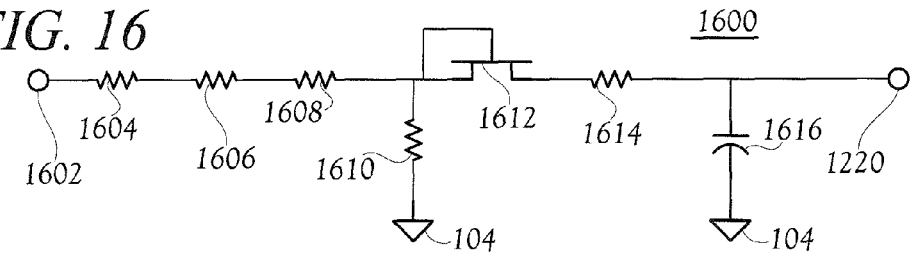
FIG. 16 is a schematic diagram of an exemplary output voltage detector for the transceiver of FIG. 12.

FIG. 16 is a schematic of exemplary circuitry 1600 for sensing peak voltage at a sense node 1602, which may for example be connected directly to antenna node 1214 of FIG. 12. An input divider may be used as shown to sense relatively high voltages. Four roughly equal resistors 1604, 1606, 1608 and 1610 having a relatively low resistance, such as 1 kΩ, may be used. Diode-connected FET 1612 conducts when this voltage is high, providing current through a resistor 1614 of about 24 kΩ to a capacitor 1616 of about 1 pF. Many other values may be used, so long as the time constant established by resistor 1614 and capacitor 1616 is much smaller than the duration of any event that could cause the output voltage to rise (for a given level of PA output signal). For example, an antenna mechanical event that caused the antenna impedance to vary drastically from the design value, thereby causing a high voltage standing wave to appear, will take at least milliseconds to occur. The time constant of approximately 24 nS of the exemplary circuit 1600 is well below such an event duration. However, the corner frequency due to these components should generally be well below both the first and second band operating frequencies $f_{O1}$ and $f_{O2}$, in order to avoid circuit oscillations. If event durations may approach $1/f_O$, then other common circuit design considerations may require a more complicated circuit to avoid oscillation while ensuring that the response is sufficiently fast to prevent excessive voltages.

Figure 17:
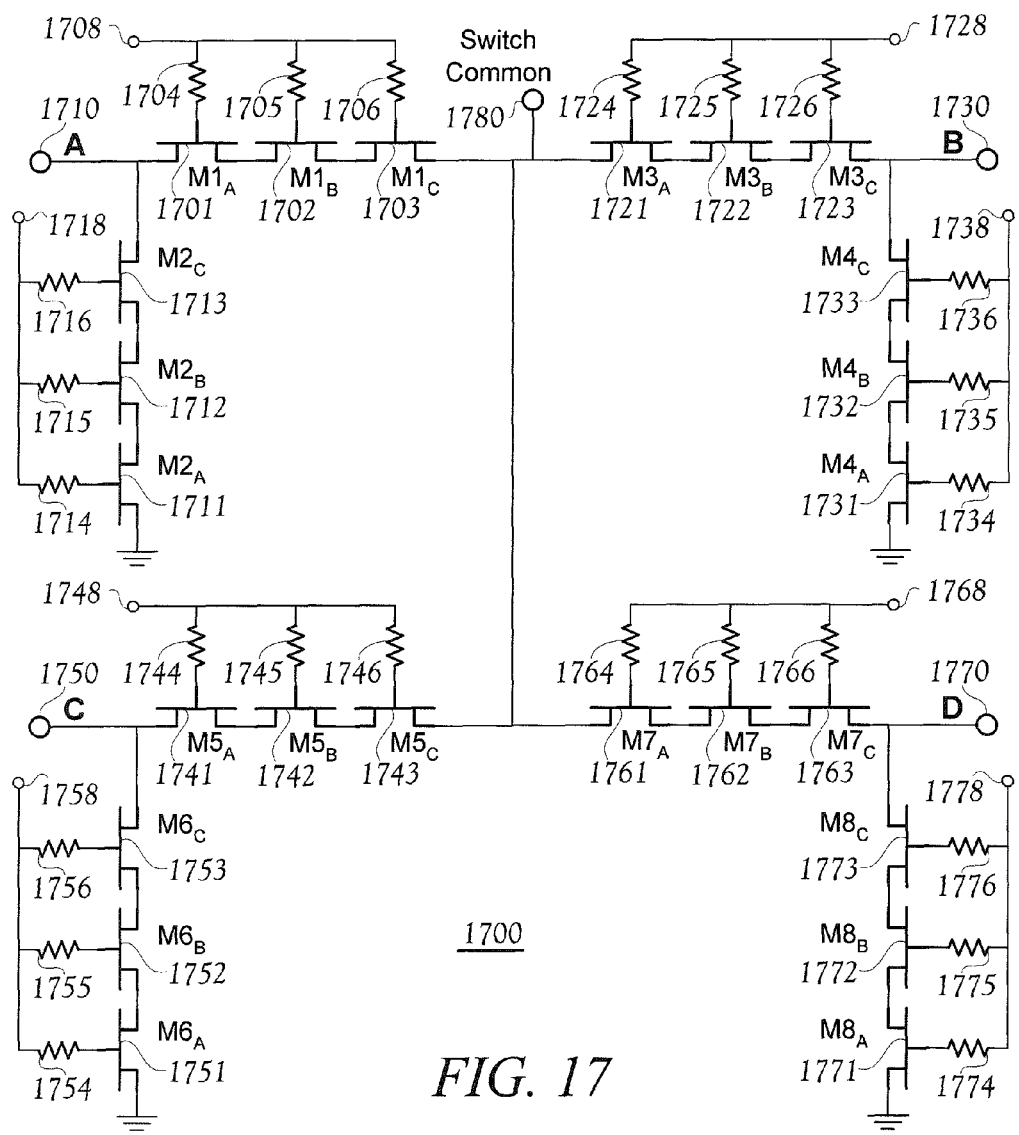
FIG. 17 is a schematic diagram of an exemplary dual-band antenna switch for the transceiver of FIG. 12.

FIG. 17 is a simplified schematic of exemplary circuitry 1700 for an antenna switch. Further details regarding design and fabrication of such an RF switch may be found in U.S. Pat. No. 6,804,502, issued Oct. 12, 2004 and entitled "Switch Circuit and Method of Switching Radio Frequency Signals." Circuitry to provide control signals is not shown. Moreover, the control voltages should preferably be either "high," nearly $V_{DD}$, or "low" at nearly $-V_{DD}$. To generate $-V_{DD}$ control voltages, a negative voltage generator will be helpful, preferably a low-noise circuit such as described in copending, published U.S. patent application Ser. No. 10/658,154, filed Sep. 8, 2003 and entitled "Low Noise Charge Pump Method and Apparatus." Such a low-noise charge pump is important for avoiding unintended emissions from the antenna.

A port node 1780 is the common connection of the switch 1700. In FIG. 12, the common connection of the switch 1700 is coupled to the antenna node 1214. The common connection is generally coupled to only one RF port (port A 1710, port B 1730, port C 1750, or port D 1770) at a time. Each RF port has a corresponding "+" control node and a corresponding "−" control node. For ports A, B, C and D, the "+" control nodes are nodes 1708, 1728, 1748 and 1768, respectively, while the "−" control nodes are nodes 1718, 1738, 1758 and 1778, respectively.

To couple an RF port to the common connection, a "high" voltage (~$V_{DD}$) is applied to the port's corresponding "+" control node, while a "low" voltage (~-$V_{DD}$) is applied to the port's corresponding "−" control node. Meanwhile, a "low" voltage is applied to each "+" control node corresponding to another RF port, and a "high" voltage is applied to each "−" control node corresponding to another RF port. Thereby, a selected RF port will be coupled to the common connection, while every other RF port will be coupled to ground. Thus, to couple RF port A 1710 to common connection 1780, a "high" voltage is applied to control nodes 1708, 1738, 1758, and 1778, while a "low" voltage is applied to all other control nodes (1718, 1728, 1748 and 1768).

Every resistor will typically have the same value. In some embodiments, the value will be roughly 30-50 kΩ. The resistor is selected such that the time constant of the parasitic gate capacitance of a FET (e.g. $M1_A$ 1701), in conjunction with the value of its corresponding gate resistor (e.g. 1704) is much greater than $1/f_O$, where $f_O$ is the lowest significant frequency of the RF signal being controlled. The illustrated configuration serves to divide the voltage appearing across FET stacks (such as the stack consisting of FETs $M1_A$, 1701, $M1_B$ 1702 and $M1_C$ 1703, the stack consisting of FETs $M2_A$, 1704, $M2_B$ 1705 and $M2_C$ 1706, and so on) uniformly, reducing compression effects. The FET stacks (such as FETs 1701, 1702 and 1703) that provide the switching functions may include more or less than the three devices that are shown for illustration; stacks of at least nine devices have been successfully fabricated. Due to the voltage stress distribution uniformity, a wide range of signal voltages and fabrication process parameters may be accommodated.

Integrated Circuit Fabrication and Design

Integrated circuit fabrication details are not provided in the above description. In some preferred embodiments, including some which have output powers in excess of 1 W at around 2.4 GHz, the integrated circuits may be fabricated in accordance with ultrathin silicon on sapphire processing as described in U.S. Pat. No. 5,663,570, issued Sep. 2, 1997 and entitled "High-Frequency Wireless Communication System on a Single Ultrathin Silicon On Sapphire Chip." Other semiconductor-on-insulator (SOI) techniques may be used to fabricate a dual-band transceiver integrated circuit as described above, for at least some frequency bands and power levels.

The preferred integrated circuit fabrication techniques described above readily produce FETs having a rather low maximum $V_{DS}$. Accordingly, various techniques are described for stacking FETs to achieve control of higher voltages while maintaining consistent processing. Using other manufacturing techniques, or lower voltages and impedances, a need for cascode or multiply-stacked FETs may be avoidable.

Conclusion

The foregoing description illustrates exemplary implementations, and novel features, of a method and apparatus that employs stacked transistors to control conduction between a pair of nodes in an integrated circuit. The skilled person will understand that various omissions, substitutions, and changes in the form and details of the methods and apparatus illustrated may be made without departing from the scope of the invention. Numerous alternative implementations have been described, but it is impractical to list all embodiments explicitly. As such, each practical combination of the apparatus or method alternatives that are set forth above, and/or are shown in the attached figures, constitutes a distinct alternative embodiment of the subject apparatus or methods. Each practical combination of equivalents of such apparatus or method alternatives also constitutes a distinct alternative embodiment of the subject apparatus or methods. Therefore, the scope of the presented invention should be determined only by reference to the appended claims, and is not to be limited by features illustrated in the foregoing description except insofar as such limitation is recited, or intentionally implicated, in an appended claim.

It will be understood that similar advantages of integration will accrue to circuits having other functional blocks. For example, mixers may be incorporated on such a device, enabling integration of more portions of transmission signal processing. Phase locked loops may further enhance the ability to generate the transmission signal on the same monolithic IC as the RF front end or transceiver. Additional types of filters may be useful, for either or both of receive and transmission processing.

All variations coming within the meaning and range of equivalency of the various claim elements are embraced within the scope of the corresponding claim. Each claim set forth below is intended to encompass any system or method that differs only insubstantially from the literal language of such claim, if such system or method is not an embodiment of the prior art. To this end, each described element in each claim should be construed as broadly as possible, and moreover should be understood to encompass any equivalent to such element insofar as possible without also encompassing the prior art.

What is claimed is:

1. An RF front-end circuit, comprising:
 a) an RF signal amplifier configured to receive a transmit signal having frequency content and phasing that is substantially suitable for transmitting, and to amplify such signal to establish an amplified transmit signal;
 b) an RF power amplifier (PA) circuit having an input node coupled to an input signal derived from the amplified transmit signal, the RF PA configured to amplify such input signal to generate a power amplified transmit signal having a power amplifier output characteristic impedance, and including a regulator circuit configured to controllably constrain an amplitude of the power amplified transmit signal;
 c) a matching, coupling and filtering network configured to condition the power amplified transmit signal by blocking DC components, changing the characteristic impedance of the signal, and rejecting unwanted frequencies, to establish an antenna-matched transmit signal;
 d) an antenna switch configured to controllably couple the antenna-matched transmit signal to an antenna connection node, or to decouple the antenna connection node from the transmit signal and couple the antenna connection node instead to a receive signal amplification path;
 e) a transmit signal sensing circuit configured to generate a transmit power signal that reflects at least an amplitude of the transmit signal that is coupled via the antenna switch; and
 f) a control circuit configured to cause the regulator circuit to constrain the power amplified transmit signal in response to the transmit power signal so as to substantially prevent the amplitude of the transmit signal coupled by the antenna switch from exceeding a predetermined limit.

2. The RF front-end circuit of claim 1, further comprising a rectangular wave conditioner having an input coupled to the amplified transmit signal, an output coupled to the RF PA input node, and being configured to adjust a waveshape and duty cycle of the amplified transmit signal to generate a rectangular wave having a duty cycle that is particularly suitable for the RF PA input node.

3. The RF front-end circuit of claim 2, wherein the rectangular wave conditioner includes a control section configured to adjust the duty cycle of the rectangular wave coupled to the RF PA input node under control of a duty cycle control signal coupled to the rectangular wave conditioner.

4. The RF front-end circuit claim 1, wherein the RF PA includes a switching circuit disposed between an output drive node and a circuit common, configured to avoid linear operation and substantially operate at only a minimum impedance or a maximum impedance, and a radio frequency choke (RFC) coupled between the output drive node and the regulator circuit.

5. The RF front-end circuit of claim 4, wherein the switching circuit of the RF PA comprises a plurality of series-connected FETs of common polarity that are configured to divide maximum voltage stresses applied to the switching circuit approximately equally between themselves.

6. The RF front-end circuit claim 5, wherein the plurality of series-connected FETs is a multiplicity of series-connected FETs configured to switch on and off substantially concurrently with each other.

7. The RF front-end circuit claim 4, wherein the RF PA comprises only a solitary one of such switching devices, the solitary switching device consisting of one or more FETs that all conduct substantially concurrently, and further comprises a shunt filter disposed between the output drive node and a circuit common, the shunt filter being configured to conduct signal components of the power amplified transmit signal at one or more harmonics of an operating frequency fO through a significantly resistive impedance, while substantially rejecting signal components at fO.

8. The RF front-end circuit claim 7, wherein the shunt filter has an impedance that is a function of frequency, having local minimum values approximately equal to the power amplifier output characteristic impedance at frequencies of 2*fO and 3*fO.

9. The RF front-end circuit of claim 1, wherein the antenna-matched transmit signal has an operating frequency fO of at least about 900 MHz, and the integrated RF front-end circuitry is configured to deliver at least about 1 W of power to the antenna connection node at fO.

10. The RF front-end circuit claim 1, further comprising a second RF PA according with clause (b) but accepting an input signal at a second operating frequency f1 and having a regulator circuit controlled by a signal from the transmit signal sensing circuit; a second matching, coupling and filtering circuit according with clause (c) but configured to produce a second antenna-matched transmit signal; wherein the antenna switch is further configured to controllably couple the antenna connection node exclusively to the second antenna-matched transmit signal, or exclusively to a second receive signal amplification path.

11. A method of fabricating an RF front end circuit, comprising:
 a) providing only one solitary antenna connection node for coupling the RF front end to an antenna, and coupling the antenna connection node to
  i) a transmit signal sensing circuit configured to develop a signal reflective of a transmit signal amplitude, and
  ii) a common connection of an antenna switch;
 b) coupling an input signal node to a transmit signal amplifier configured to amplify a received transmit signal;
 c) laying out a power amplifier (PA) having a switching circuit configured to operate in switching mode, without substantial linear operation, to switch an output drive node to circuit common, or not, under control derived from the amplified received transmit signal, such that the output drive node has a characteristic impedance Zdrive at an operating frequency fO;
 d) coupling the PA output drive node to a first connection of an RF choke (RFC), and coupling a second connection of the RFC to a power source via a regulator circuit;
 e) coupling the PA output drive node to an input of the antenna switch via a coupling, matching and filtering network such that a transmit signal thus switchably coupled to the antenna connection node has a characteristic impedance substantially equal to an expected impedance of a connection to the antenna;
f) coupling, to the antenna connection, an output signal sensing circuit configured to generate a signal reflective of excessive voltage at the antenna connection; and
g) coupling the signal reflective of excessive voltage at the antenna connection to the regulator circuit whereby the output drive signal amplitude is controlled to preclude the existence of significantly excessive voltage at the antenna connection.

* * * * *